United States Patent
Motoyoshi

(10) Patent No.: US 11,462,668 B2
(45) Date of Patent: Oct. 4, 2022

(54) STACKED SEMICONDUCTOR DEVICE, AND SET OF ONBOARD-COMPONENTS, BODY AND JOINTING-ELEMENTS TO BE USED IN THE STACKED SEMICONDUCTOR DEVICE

(71) Applicant: TOHOKU-MICROTEC CO., LTD., Sendai (JP)

(72) Inventor: Makoto Motoyoshi, Sendai (JP)

(73) Assignee: TOHOKU-MICROTEC CO., LTD., Sendai (JP)

(*) Notice: Subject to any disclaimer, the term of this patent is extended or adjusted under 35 U.S.C. 154(b) by 0 days.

(21) Appl. No.: 17/107,844

(22) Filed: Nov. 30, 2020

(65) Prior Publication Data
US 2021/0399184 A1 Dec. 23, 2021

(30) Foreign Application Priority Data

Jun. 17, 2020 (JP) .............................. JP2020-104924

(51) Int. Cl.
*H01L 33/62* (2010.01)
*H01L 23/00* (2006.01)
*H01L 25/075* (2006.01)

(52) U.S. Cl.
CPC .............. *H01L 33/62* (2013.01); *H01L 24/13* (2013.01); *H01L 24/16* (2013.01);
(Continued)

(58) Field of Classification Search
CPC ......... H01L 33/62; H01L 24/13; H01L 24/16; H01L 25/0753; H01L 2224/13083;
(Continued)

(56) References Cited

U.S. PATENT DOCUMENTS

| 6,555,415 B2 | 4/2003 | Hedler |
| 7,785,987 B2 | 8/2010 | Trezza |

(Continued)

FOREIGN PATENT DOCUMENTS

| EP | 3796367 A1 | 3/2021 |
| WO | WO 2014/006812 A1 | 1/2014 |

(Continued)

OTHER PUBLICATIONS

Extended European Search Report dated Sep. 9, 2021, 15 pages, for the corresponding European Patent Application No. 20204653.8.

(Continued)

*Primary Examiner* — Douglas W Owens
(74) *Attorney, Agent, or Firm* — Polsinelli PC

(57) ABSTRACT

A stacked semiconductor device encompasses a motherplate having a mounting-main surface and a bottom-main surface, an onboard-element having a connection face facing to the mounting-main surface, a parent bump provided on the mother-plate, having a mother-site wall made of a layer of conductor, mother-site wall is perpendicular to the mounting-main surface, and a repair bump provided on the onboard-element at a side of the connection face, having a repair-site wall made of a layer of conductor having different hardness from the mother-site wall, the repair-site wall is perpendicular to the connection face, configure to bite each other with the parent bump at an intersection between the mother-site wall and the repair-site wall conductor.

20 Claims, 18 Drawing Sheets

(52) U.S. Cl.
CPC ............... *H01L 25/0753* (2013.01); *H01L 2224/13083* (2013.01); *H01L 2224/13144* (2013.01); *H01L 2224/13155* (2013.01); *H01L 2224/13157* (2013.01); *H01L 2224/13163* (2013.01); *H01L 2224/13166* (2013.01); *H01L 2224/13171* (2013.01); *H01L 2224/13178* (2013.01); *H01L 2224/13184* (2013.01); *H01L 2224/13187* (2013.01); *H01L 2224/16013* (2013.01); *H01L 2224/16238* (2013.01)

(58) Field of Classification Search
CPC . H01L 2224/13144; H01L 2224/13055; H01L 2224/13157; H01L 2224/13163; H01L 2224/13166; H01L 2224/13171; H01L 2224/13178; H01L 2224/13184; H01L 2224/13187; H01L 2224/16013; H01L 2224/16238
See application file for complete search history.

(56) References Cited

U.S. PATENT DOCUMENTS

| | | | |
|---|---|---|---|
| 10,468,365 B2 | 11/2019 | Kishihara et al. | |
| 11,211,366 B2 * | 12/2021 | Park | H01L 25/0753 |
| 11,211,534 B2 * | 12/2021 | Bae | H01L 33/62 |
| 2002/0076537 A1 | 6/2002 | Chuang et al. | |
| 2006/0281309 A1 | 12/2006 | Trezza | |
| 2011/0147440 A1 * | 6/2011 | Hu | B23K 1/203 |
| | | | 228/256 |
| 2015/0235985 A1 | 8/2015 | Marion | |
| 2015/0294948 A1 * | 10/2015 | Ayotte | H01L 24/81 |
| | | | 257/737 |
| 2015/0380395 A1 | 12/2015 | Marion et al. | |
| 2016/0233186 A1 | 8/2016 | Marion | |
| 2017/0287789 A1 | 10/2017 | Bower et al. | |
| 2018/0247907 A1 | 8/2018 | Hsiao et al. | |
| 2018/0337154 A1 | 11/2018 | Lin et al. | |
| 2020/0126937 A1 | 4/2020 | Hsiao et al. | |

FOREIGN PATENT DOCUMENTS

| | | |
|---|---|---|
| WO | WO 2017/081798 A1 | 5/2017 |
| WO | WO 2020/105432 A1 | 5/2020 |

OTHER PUBLICATIONS

Taiwan IPO Search Report (including English Translation) / Office Action dated Nov. 17, 2021, for the corresponding Taiwanese Application No. 109139702 in 3 total pages.

* cited by examiner

STACKED SEMICONDUCTOR DEVICE, AND SET OF ONBOARD-COMPONENTS, BODY AND JOINTING-ELEMENTS TO BE USED IN THE STACKED SEMICONDUCTOR DEVICE

CROSS REFERENCE TO RELATED APPLICATIONS AND INCORPORATION BY REFERENCE

This application claims benefit of priority under 35 USC 119 based on Japanese Patent Application No. 2020-104924 filed on Jun. 17, 2020, the entire contents of which are incorporated by reference herein.

BACKGROUND OF THE INVENTION

1. Field of the Invention

The present invention relates to a stacked semiconductor device and a set of onboard-components, a body and jointing-elements used in the stacked semiconductor device, particularly to a screening techniques of electing the normal and proper onboard-components to be arrayed on the body for assembling the stacked semiconductor devices, each of the stacked semiconductor devices having a stacked structure encompassing a large-size mother-plate and a plurality of the onboard-components mounted on the body.

2. Description of the Related Art

WO2014/006812A discloses a two-dimensional radiation detector having an active matrix substrate including a plurality of pixel electrodes, and facing substrates bonded to the active matrix substrate by conductive bumps connected to each of the pixel electrodes. In such flip-chip bonding scheme, there is a problem that it becomes difficult to perform the connection by uniform bumps when the pitch of the pixel electrode becomes finer and finer. In contrast, WO2017/081798A discloses a solid-state detector capable of reliably performing the connection by cylindrical electrodes connecting between each of the pixel electrodes and the facing substrate of the signal read chips serving onboard-components.

However, in the stacked semiconductor device which mounts a plurality of small-size onboard-components on a large-size mother-plate, when there is a defect in one of the onboard-components on which the fine chip-side circuit is integrated, there is a problem that the stacked semiconductor device does not operate. The large-size mother-plate used in an image sensor or the like, in which a plurality of detector-elements is merged as pixels, can be designed under a rougher and larger design rule. Furthermore, since the topology of the circuit merged in the body is also simple, the body is easy to manufacture, and the probability of the occurrence of the defects in the body is low. In addition, because defects in the mother-circuit or the connection wirings or the like of the body will be generated random, if any defect has been generated in the body, the defects will hardly manifest malfunction on the output of the body.

On the other hand, each of the onboard-components to be mounted on the large-size mother-plate has a high degree of integration, and since each of the onboard-components is manufactured with much finer design rules than the body, the probability of the occurrence of defects is high in each of the onboard-components. However, through the testing after mounting the onboard-components on the body, by connection with bumps or the like, the performance quality of the chip-side circuit integrated in each of the onboard-components can be seen firstly. Therefore, if there is a high defect-occurrence rate or block-failure in one of the onboard-components, it becomes a defect of the entire structure of the stacked semiconductor device. And therefore, the manufacturing efficiency becomes poor, and the normal-operating chips mounted on the body, and the normal-operating body will be wasted.

In view of such circumstances, it is desirable to peel off selectively only the defective onboard-component from the body, and to replace selectively only the defective onboard-component with another normal-operating onboard-component. However, at the present technical level, no bump or the like is known by which only a specific onboard-component, when the stacked semiconductor device is found to be defective, can be easily peeled off from the defective stacked semiconductor device, and another onboard-component can be easily connected to the defective stacked semiconductor device.

SUMMARY OF THE INVENTION

A first aspect of the present invention inheres in a stacked semiconductor device encompassing (a) a mother-plate merging a mother-circuit, having a mounting-main surface and a bottom-main surface facing the mounting-main surface, (b) an onboard-element merging an onboard-circuit, having a connection face facing to the mounting-main surface, (c) a parent bump provided on the mother-plate at a side of the mounting-main surface, having a mother-site wall made of a layer of conductor, mother-site wall is perpendicular to the mounting-main surface, the parent bump is electrically connected to the mother-circuit, and (d) a repair bump provided on the onboard-element at a side of the connection face, having a repair-site wall made of a layer of conductor having different hardness from the mother-site wall, the repair-site wall is perpendicular to the connection face, configure to bite each other with the parent bump at an intersection between the mother-site wall and the repair-site wall conductor, the intersection is defined in a planar pattern viewed from a normal direction of the connection face. In the first aspect of the present invention, conductors with different hardness are non-uniformly included at and in the vicinity of the intersection.

A second aspect of the present invention pertains to a set of onboard-components scheduled to be used in an assembled configuration including a mother-plate and a part of the onboard-components mounted on the mother-plate, the mother-plate merges a mother-circuit and has a mounting-main surface and a bottom-main surface facing the mounting-main surface. Namely, the second aspect of the present invention inheres in each of the onboard-components encompassing (a) an onboard-element merging an onboard-circuit, having a connection face facing to the mounting-main surface, and (b) a repair bump provided on the onboard-element at a side of the connection face, having a repair-site wall made of a layer of conductor, the repair-site wall is perpendicular to the connection face, configure to join with a parent bump provided on a side of the mounting-main surface, the parent bump is electrically connected to the mother-circuit and has a mother-site wall made of a layer of conductor having different hardness from the repair-site wall, the mother-site wall is perpendicular to the mounting-main surface. In the second aspect of the present invention, the repair-site wall and the mother-site wall bite each other at an intersection defined in a planar pattern viewed from a normal direction of the connection face.

A third aspect of the present invention pertains to a jointing-element configured to join a mother-plate and an onboard-element mounted on the mother plate, the mother-plate merging a mother-circuit, having a mounting-main surface and a bottom-main surface facing the mounting-main surface, the onboard-element merging an onboard-circuit, having a connection face facing to the mounting-main surface. Namely, the third aspect of the present invention inheres in the jointing-element encompassing (a) a parent bump provided on the mother-plate at a side of the mounting-main surface, having a mother-site wall made of a layer of conductor, the mother-site wall is perpendicular to the mounting-main surface, electrically connected to the mother-circuit, and (b) a repair bump provided on the onboard-element at a side of the connection face, having a repair-site wall made of a layer of conductor having different hardness from the mother-site wall, the repair-site wall is perpendicular to the connection face, configure to bite each other with the parent bump at an intersection between the mother-site wall and the repair-site wall, the intersection is defined in a planar pattern viewed from a normal direction of the connection face. In the third aspect of the present invention, the repair-site wall and the mother-site wall bite each other at an intersection defined in a planar pattern viewed from a normal direction of the connection face, and conductors having different hardness are uniformly included at and in the vicinity of the intersection.

DETAILED DESCRIPTION OF THE INVENTION

Figure 1:
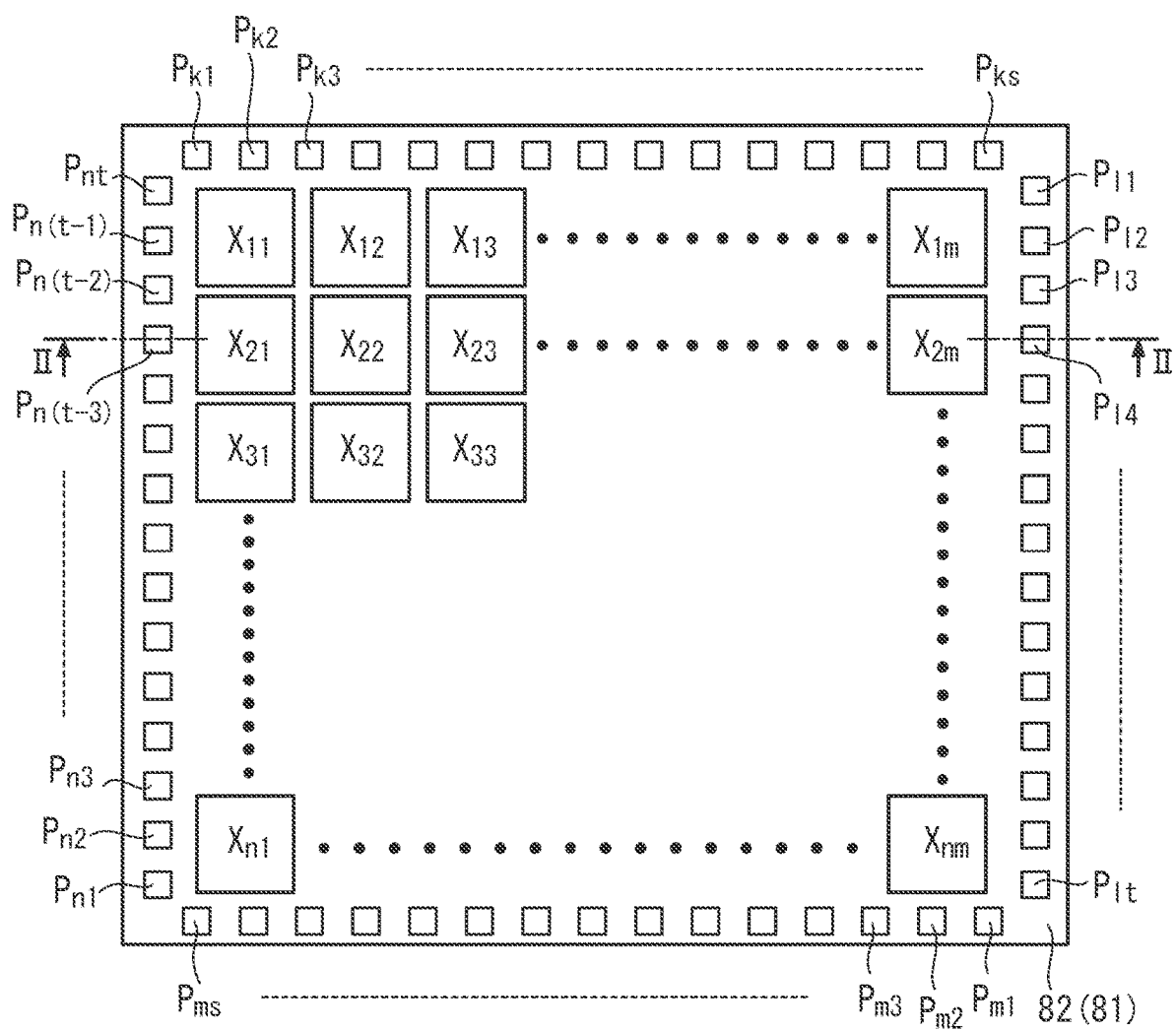
FIG. 1 is a plan view for explaining the stacked semiconductor device according to the first embodiment of the present invention (solid-state imaging device)

Hereinafter, first to fourth embodiments of the present invention will be described with reference to the drawings. In the description of the drawings, the identical or similar parts are denoted by the identical or similar reference numerals, and redundant descriptions thereof will be omitted. However, the drawings are schematic, and the relation between the thickness and the plane dimensions, the ratio of the thickness of each layer, etc., may be different from the actual one. In addition, dimensional relations and ratios may also differ between the drawings. Further, the first to fourth embodiments illustrated below exemplify the apparatus and methods for embodying the technical idea of the present invention, and the technical idea of the present invention does not specify the material, shape, structure, arrangement, or the like of the components as follows.

Further, the definition of the "upper", "lower", and the like, in the following description is merely a definition for convenience of explanation, and is not intended to limit the technical scope of the present invention. For example, the upper and lower are converted to right and left if observed by rotating the object by 90°, and the upper and lower are inverted if observed by rotating 180°, of course.

First Embodiment

Figure 2:
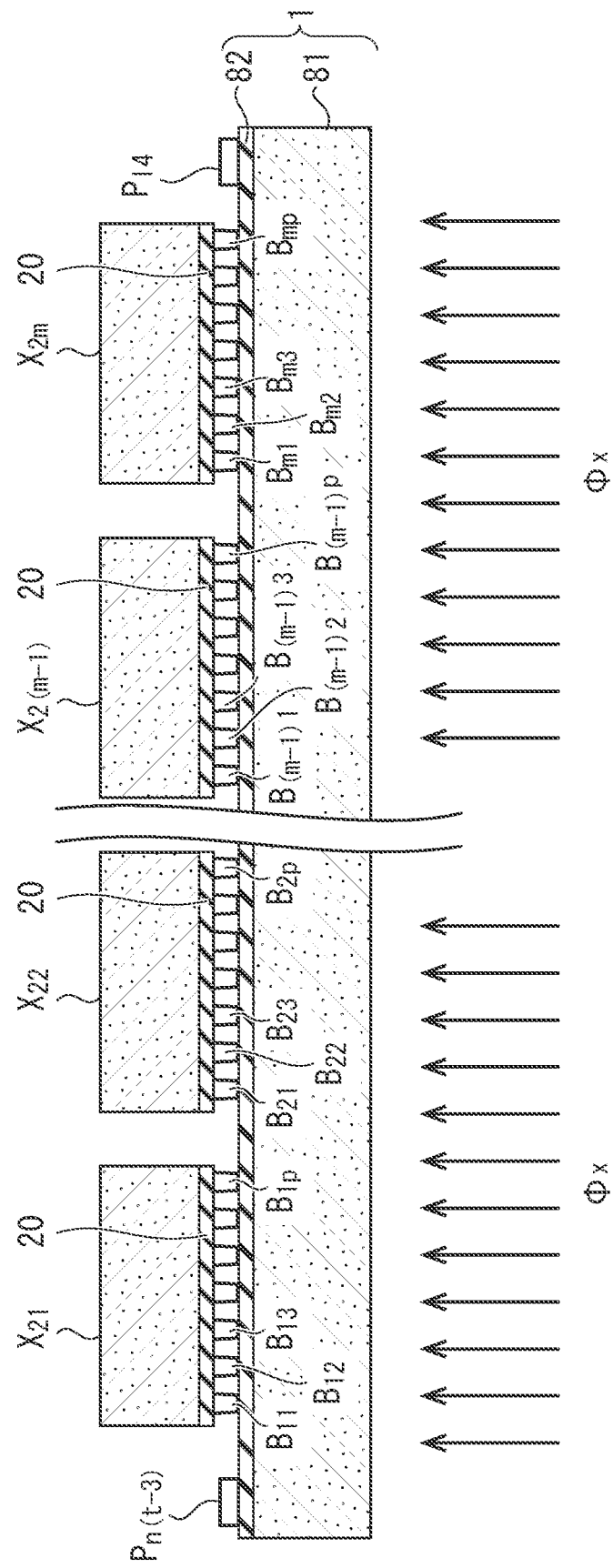
FIG. 2 is a cross-sectional view taken from II-II direction in FIG. 1.

A stacked semiconductor device according to a first embodiment of the present invention implements a stacked structure, as illustrated in FIGS. 1 and 2, in which a mother-plate 81 with a large diameter, or a large dimensional size, a plurality of rectangular onboard-elements $X_{ij}$ (i=1 to n:j=1 to m:n, m is one or more positive integers) are mounted on a mounting-main surface, which is one of the main surfaces of the mother-plate 81. And, the stacked semiconductor device according to the first embodiment can be reduced to a stacked structure of one chip of n=m=1 (onboard-element), for example. The mother-plate 81 may be implemented by a parallel plate structure with a mounting-main surface and a back surface (second main surface), which are parallel and facing each other. If the stacked semiconductor device is a solid-state imaging device, the bottom-main surface facing the mounting-main surface of the mother-plate 81 (second main surface) implements an input surface on which electromagnetic wave Φx is incident as illustrated in FIG. 2.

On the other hand, if the stacked semiconductor device is elected as a solid-state display device such as a micro light-emitting diode (LED) display, on the drive panel serving as the mother-plate 81, several 0.1 million to millions of LED chips shall be mounted in a matrix as the onboard-elements $K_{ij}$, so as to implement the laminated structure. On the mounting-main surface (first main surface) of the mother-plate 81, a plurality of pixel regions divided along the macro lattice (first lattice) is defined, and the detector-elements in the detector-array implementing the mother-circuit are arranged in each of the pixel regions.

The mounting-main surface of the mother-plate 81 is divided into mounting regions defined by the mounting lattice of the mesh number smaller than the macro lattice (second lattice). The onboard-element $X_{ij}$ reads out the signals from the respective mounting regions which are divided. Conversely, corresponding to the arrangement positions of the onboard-elements $X_{ij}$, the mounting-main surface of the mother-plate 81 is divided into a plurality of mounting regions, each of the mounting regions implements a mounting lattice of p×q (p<n, q<m) with the mesh number less than the macro lattice. The mother-plate 81 delineates an integrated structure of mother-circuits, which arranges p-n diodes, n-i-n diodes, p-i-p diodes and the like in the pixel regions divided along the macro lattice, with a dimension of, for example, 10 cm×10 cm. The onboard-element $X_{ij}$ has an area smaller than the mother-plate 81, a plurality of onboard-elements $X_{ij}$ are arranged in a region defined by the mounting lattice such as 2×2 to 8×8 corresponding to the size of the mother-plate 81, so as to cover substantially the entire surface of the mother-plate 81.

As illustrated in FIG. 1, along the arrangement of the onboard-elements $X_{11}, X_{12}, X_{13}, \ldots, X_{1m}$ deployed in a top row, the bonding pads $P_{k1}, P_{k2}, P_{k3}, \ldots, P_{ks}$ are arranged around the mother-plate 81. When the side of the mother-plate 81 on which the bonding pads $P_{k1}, P_{k2}, P_{k3}, \ldots, P_{ks}$ are arranged is assigned as the "first side" of the mother-plate 81, bonding pads $P_{j1}, P_{j2}, P_{j3}, \ldots, P_{jt}$ are construed as being arranged around the mother-plate 81 along the "second side" of the mother-plate 81, the second side is defined as a side consecutive to the first side and is perpendicular to the first side. Then, bonding pads $P_{m1}, P_{m2}, P_{m3}, \ldots, P_{ms}$ shall be construed as being arranged along the "third side" of the mother-plate 81, the "third side is defined as a side consecutive to the second side and perpendicular to the second side, around the mother-plate 81. Furthermore, bonding pads $P_{n1}, P_{n2}, P_{n3}, \ldots, P_{nt}$ shall be construed as being arranged along the "fourth side" of the mother-plate 81, the fourth side is defined as a side consecutive to the third side and perpendicular to the third side around the mother-plate 81.

As illustrated in the cross-sectional view of FIG. 2, the field-insulating film 82 is laminated on the mother-plate 81. In the cross-sectional view of FIG. 2, an onboard-element $X_{21}$ is arranged at the left end of the mother-plate 81 through the field-insulating film 82, and an array of bump-connection elements $B_{11}, B_{12}, B_{13}, \ldots, B_{1p}$ arranged in the region of the connecting grid (third grid) of the same number of meshes with the macro lattice between the onboard-element $X_{21}$ and the mother-plate 81. The multi-level interconnection insulation-layer 20 is provided on the onboard-element $X_{21}$ (at the connection face of the onboard-element $X_{21}$ illustrated in FIG. 2). Inside the multi-level interconnection insulation-layer 20, which is provided on the onboard-element $X_{21}$ illustrated in FIG. 2, a multi-level interconnection including an upper, an intermediate and a lower-level interconnections, which are spaced apart from each other and buried corresponding to the circuit topology of the onboard-circuit delineated in the onboard-element $X_{21}$. For example, the multi-level interconnection insulation-layer 20 may have a plurality of first-level interconnections arranged on the surface of the onboard-element $X_{21}$,—the surface assigned at the connection face of the onboard-element $X_{21}$ illustrated in FIG. 2—the onboard-element $X_{21}$ serves as a supporting substrate of the first-level interconnections, and a plurality of through-vias penetrating through multi-level interconnection insulation-layers 20 from the top surface to the bottom-main surface, and a plurality of second-level interconnections arranged at the lower portion of the multi-level interconnection insulation-layer 20, and the like.

A "circuit" is a "passage of current" (Japanese dictionary "KOHJIEN", 4th edition, published by Iwanami). In general, and in many cases, active elements, such as transistors and diodes, and passive elements, such as resistors, capacitors, and coils, may be included in the circuit. However, a mere current passage is an electric circuit, because, in the electromagnetics of the distributed constant circuit at high frequency, the mere current passage includes a resistor, a capacitor, and a coil. Therefore, even if the onboard-element $X_{21}$—more generally, the onboard-element $X_{ij}$—is a simple diode such as an LED chip for a micro LED display, the passage of current implementing the simple diode shall be defined as the "onboard-circuit". The same applies to the mother-circuit, and a circuit of a simple diode, a simple wiring circuit or any passage of current that does not include an active element, or the like shall be referred as the mother-circuit. Further, since the onboard-circuit merged in the onboard-element $X_{ij}$ may be a simple resistance circuit such as a temperature sensor or a heating element, various circuit elements can be adopted as the onboard-element $X_{ij}$.

The multi-level interconnection insulation layer 20 can be made by triple, quadruple, quintuple or more multi-level insulation layers. Namely, the multi-level interconnection insulation layer 20 may have, for example, the third-level interconnection, the fourth-level interconnection, the fifth-level interconnection, or the like. In any cases, the first-level interconnection is electrically connected to the array of the onboard-element $X_{21}$, respectively. The through-vias in the multi-level interconnection insulation-layer 20 electrically connect between the first-level interconnection and the second-level interconnection, respectively. When the multi-level interconnection insulation layer 20 is implemented by the first-level interconnection and the second-level interconnection, the bottom-main surface of the second-level interconnection may be provided with solder bumps for bonding with the external circuit.

Alternatively, as in the Silicon-on-insulator (SOI) structure, a thin-film integrated circuit provided inside the multi-level interconnection insulation-layer 20 may implement each of the onboard-circuit (signal-readout circuit). In the SOI structure, through the interlayer insulating film, by a multi-level interconnection such as the upper-level interconnection, the intermediate-level interconnection, the lower-level interconnection, a switching element, or a read-out capacitor made of a thin film transistor may be constructed in the inside of the multi-level interconnection insulation-layer 20. Alternatively, the structure of FIG. 2 may be considered such that the onboard-circuit in the lower-level interconnection of the multi-level interconnection insulation-layer 20 of the onboard-element $X_{ij}$ may be assigned as the integrated circuit merged at the surface of the silicon (Si) substrate, and the intermediate-level interconnection in the multi-level interconnection insulation-layer 20 may assigned as the surface interconnection deployed in the interlayer insulating film. Alternatively, a unit of onboard-circuits implemented by a set of a read-out capacitor and a switching element, corresponding to an array of unit-elements of the mother-circuit of the mother-plate 81, may be integrated and merged in an upper portion of an onboard-element $X_{21}$ made by a Si substrate. The pitch of the mesh of the connecting grid for arranging jointing-elements $B_{11}$, $B_{12}, B_{13}, \ldots, B_{1p}$ may be the same as the macro lattice, but the pitch of the mesh of the connecting grid may be obtained by converting the pitch of the mesh of the macro lattice.

In FIG. 2, an onboard-element $X_{22}$ is disposed on the field-insulating film 82 at the right side of the onboard-element $X_{21}$, and an array of bump-connection elements $B_{21}, B_{22}, B_{23}, \ldots, B_{2p}$ are arranged between the onboard-element $X_{22}$ and the mother-plate 81. The array of the bump-connection elements $B_{21}, B_{22}, B_{23}, \ldots, B_{2p}$ are arranged in the region of the connecting grid with the same number of mesh as the macro lattice. Like the onboard-element $X_{21}$, a multi-level interconnection insulation-layer 20 is provided on the connection face of the onboard-element $X_{21}$. Inside the multi-level interconnection insulation-layer 20, a multi-level structure such as an upper-level interconnection, an intermediate-level interconnection, and a lower-level interconnection are spaced apart from each other and buried so as to correspond to the layout of the onboard-circuit merged in the onboard-element $X_{22}$. Similarly, between an onboard-element $X_{2(m-1)}$ and the mother-plate 81, an array of bump-connection elements $B_{(m-1)1}$, $B_{(m-1)2}, B_{(m-1)3}, \ldots, B_{(m-1)p}$ arranged in the region of the connecting grid is illustrated in FIG. 2. A multi-level interconnection insulation-layer 20 is provided similarly to the onboard-element $X_{21}$ on the connection face of the onboard-element $X_{2(m-1)}$. Inside the multi-level interconnection insulation-layer 20, the multi-level structure such as the upper-level interconnection, the intermediate-level interconnection, and the lower-level interconnection are separated from each other and buried so as to correspond to the layout of the onboard-circuit merged in the onboard-element $X_{2(m-1)}$.

Furthermore, an onboard-element $X_{2m}$ is arranged on the right end side of the mother-plate 81 through the field-insulating film 82, and an array of bump-connection elements $B_{m1}, B_{m2}, B_{m3}, \ldots, B_{mp}$ arranged in the region of the connecting grid is illustrated between the onboard-element $X_{2m}$ and the mother-plate 81. A multi-level interconnection insulation-layer 20 is provided on the connection face of the onboard-element $X_{2m}$ in the same manner as the onboard-element $X_{21}$. Inside the multi-level interconnection insulation-layer 20, a multi-level structure such as an upper-level interconnection, an intermediate-level interconnection, and a lower-level interconnection are spaced apart from each other and buried so as to correspond to the layout of the onboard-circuit merged in the onboard-element $X_{2m}$.

Therefore, in the cross-sectional structure exemplifying an array for a single row in FIG. 2, between the onboard-element and the mother-plate 81, corresponding to the arrangement defined by the macro lattice of the detector-array implementing the mother-circuit, a plurality of bump-connection elements $B_{uv}$ (u=1 to m, v=1 to p:m, p is a positive integer of 2 or more) arranged in the region of the connecting grid, is illustrated. However, of course the same structures are existing in other portions of the rows other than the portion of the row of which the cross-sectional view is illustrated in FIG. 2. The bonding pad $P_{n(t-3)}$ is illustrated on the left side of the array of the onboard-elements $X_{21}$, $X_{22}, X_{23}, \ldots, X_{2m}$ of FIG. 2, and the bonding pad $P_{l4}$ is illustrated on the right side of the array of the onboard-elements $X_{21}, X_{22}, X_{23}, \ldots, X_{2m}$. In the following description, all of the bump-connection elements including other invisible bump-connection elements, which are present but hidden elsewhere other than the visible cross-sectional view of FIG. 2, are collectively referred to as "bump-connection elements $B_{uv}$". Each of the jointing-element $B_{uv}$ electrically connects a plurality of detector-elements implementing the mother-circuit and each of the corresponding onboard-elements $X_{ij}$, respectively and independently of each other. Namely, the detector-elements are arranged in the detector-array, which implements the mother-circuit. Then, each of the detector-elements is assigned to the pixel region, and the pixel region is deployed with the divided area along the macro lattice on the mounting-main surface (the first main surface) of the mother-plate 81.

The mother-plate 81 is manufactured according to a rough and large design rule and has a simple layout, so that the mother-plate 81 is easy to manufacture and has a low occurrence probability of defects. Further, even if there is a defect in the mother-circuit (detector-array) and the connection wiring, etc., of the mother-plate 81, the occurrence of defects is random and the malfunction of the defect is hardly observed in the output performance of the mother-plate 81. On the other hand, the onboard-element $X_{ij}$ has a high degree of integration, and the performance quality of the onboard-circuit integrated in the onboard-element $X_{ij}$ can be only estimated, after connecting the onboard-element $X_{ij}$ by the jointing-element $B_{uv}$ to the mother-plate 81 for testing. If there is a high defect-occurrence rate or block-failure in any of the onboard-element $X_{ij}$, a plurality of which are mounted on the mother-plate 81, a failure of the stacked semiconductor device pertaining to the first embodiment can be observed. On the other hand, in micro LED displays, anywhere from hundreds of the thousands to millions of LED chips are stacked on the drive panel, and there is a probability that a large amount of defective LED chips will be mixed. Therefore, each of the onboard-elements $X_{ij}$ is provisionally assembled to the mother-plate 81, and if the onboard-circuit integrated in the specific onboard-element $X_{st}$ has a defect, repair work is required to peel off the specific onboard-element $X_{st}$, replacing the provisional-connection to another provisional-connection with another onboard-element $X_{xy}$, and checking if there are any problems in the another provisional-connection. Since the repair work is planned, a larger number of onboard-elements is prepared, more than the number of meshes of the mounting lattice defined in the mother-plate 81.

The details of the jointing-element $B_{uv}$ will be described later with reference to FIGS. 3A to 7B. Each of the jointing-element $B_{uv}$ is arranged so as to independently transmit the signals from the mother-circuit integrated in the mother-plate 81 to each of the onboard-circuits, which are integrated respectively to each of the onboard-elements $X_{ij}$. If the stacked semiconductor device pertaining to the first embodiment is a solid-state imaging device, the arrangement of the detector-arrays implementing the mother-circuit, which is merged at the mounting-main surface (first main surface) of the mother-plate 81, corresponds to the arrangement of pixels of the image sensor in the stacked semiconductor device. Whereas, if the stacked semiconductor device pertaining to the first embodiment is a micro LED display, the mother-circuit merged at the mounting-main surface (first main surface) of the mother-plate 81 corresponds to the arrays of the LED chips in the stacked semiconductor device. Also, in the case of a temperature sensor array, the mother-circuit merged at the mounting-main surface of the mother-plate 81 corresponds to a temperature sensor array in the stacked semiconductor device. In the case of the solid-state imaging device, each of the onboard-circuits (signal read-out circuits) of the onboard-elements $X_{ij}$ includes active elements such as switching elements $Q_{ij}$ and buffer amplifiers. Each of the onboard-elements $X_{ij}$ respectively reads out signals from the macro lattices of the pixels arranged at the corresponding divided-positions on the mounting-main surface of the mother-plate 81.

In the description of the following first embodiment, any specific material and any specific application field of the mother-plate 81 will be no less important. That is, if the stacked semiconductor device pertaining to the first embodiment is a solid-state imaging device, by making the mother-plate 81 with Si, the stacked semiconductor device pertaining to the first embodiment is suitable as an image sensor of the wavelength region of visible light. In the case where the stacked semiconductor device pertaining to the first embodiment is a solid-state imaging device, the unit-elements (detector-elements) implementing the mother-circuit arranged on the mother-plate 81 are suitable as a radiation image sensor if the unit-elements are made of a compound semiconductor such as cadmium telluride (CdTe), zinc telluride (ZnTe), cadmium zinc telluride ($Cd_{1-x}Zn_xTe$), or gallium arsenide (GaAs). Further, a plurality of infrared detector-elements made of germanium (Ge), or a semi-metal such as mercury cadmium tellurium ($Hg_{1-x}Cd_xTe$), indium antimony (InSb), or the like, can be arranged on the mother-plate 81 so as to implement an infrared image sensor. Therefore, the stacked semiconductor device pertaining to the first embodiment of the present invention can be applicable to, for example, a solid-state imaging device (image sensor) of an electromagnetic wave having various wavelengths. However, the stacked semiconductor device pertaining to the first embodiment is not limited to the image sensor.

Figure 3A:
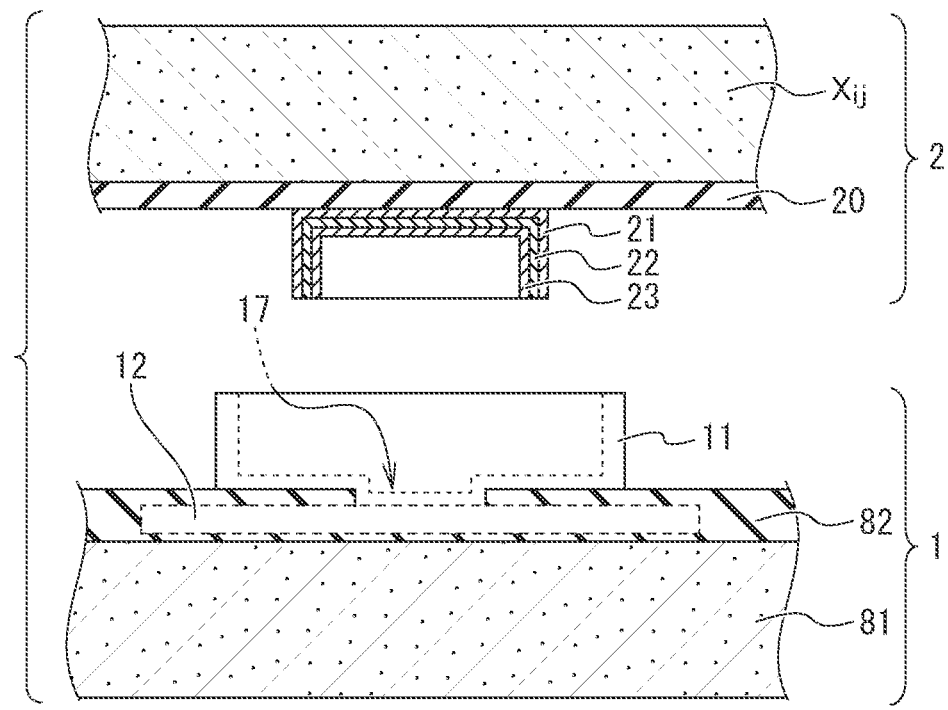
FIG. 3A is a schematic partial cross-sectional view taken in the specific direction for explaining the state before the provisional-connection of the jointing-element of the stacked semiconductor device according to the first embodiment.
Figure 3B:
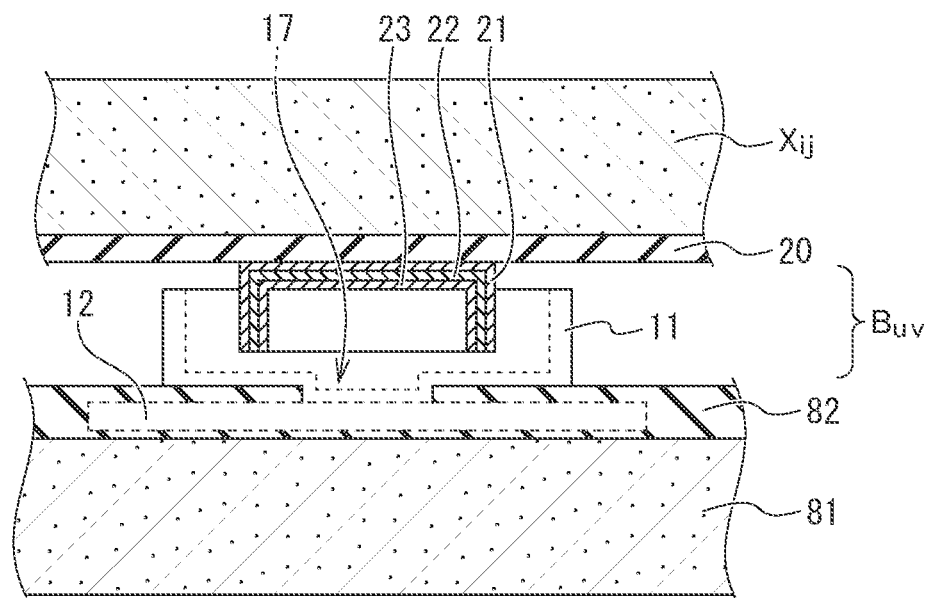
FIG. 3B is a schematic partial cross-sectional view for explaining the state of the provisional-connection of the jointing-element of the stacked semiconductor device according to the first embodiment corresponding to FIG. 3A.

If the stacked semiconductor device pertaining to the first embodiment is the solid-state imaging device, the signals, which are carriers generated as electron-hole pairs in the carrier generating layer of each of the unit-elements of the mother-circuit, each of the unit-element is disposed in the pixel region divided along the macro lattice within the mother-plate 81. The signals from each of the unit-elements of the mother-circuit is read out from the openings (contact holes) cut in the field-insulating film 82, respectively. As illustrated in FIGS. 3A and 3B, regions of the mother-plate 81 just under the field-insulating film 82 implement respectively, the regions for detector-elements, or the regions for pixels, each of the pixels delivers signals corresponding to the amount of electromagnetic wave irradiated on the pixels. If the stacked semiconductor device pertaining to the first embodiment is a solid-state imaging device, the openings (contact holes) provided in the field-insulating film 82 are two-dimensionally arranged on the connection face of the onboard-element $X_{ij}$ so as to be spaced apart from each other, and the signals indicating the carriers generated on the mother-plate 81 are read out from the output electrodes buried inside the field-insulating film 82. Thus, the mother-plate 81 functions as a detector-substrate for detecting electromagnetic wave. And, a plurality of parent-side lands (surface electrodes) provided respectively in the openings in the field-insulating film 82 function as output electrodes of the corresponding mother-circuit, respectively. Then, each of the parent-side lands transmits carrier-signals from the corresponding mother-circuits (pixels), respectively.

The mother-plate 81 arranges a plurality of parent bumps (first bumps) 11, each of the parent bumps implements each of the bump-connection elements $B_{uv}$. The array of the bump-connection elements $B_{uv}$ corresponds to the topology of pixel arrays of the mother-circuit. On the mounting-main surface (first main surface) of the mother-plate 81, one of the electrodes of each of unit-elements (detector-elements) that implements the mother-circuit is arranged and may be exposed in the area defined by the connection grid. Each of the parent bumps 11, as illustrated in FIGS. 3A to 7B, is provided through a field-insulating film 82 on the mounting-main surface (first main surface) of the mother-plate 81. The parent bump 11 is a rectangular box-shaped having a contour of a mother-site wall perpendicular to the mounting-main surface of the mother-plate 81.

Since the parent bump 11 has the rectangular box-shaped contour, the mother-site wall is a flat plate, but since the straight line is mathematically a curve with the radius of curvature being infinite, a flat wall can be categorized as "curved-wall" in the present specification. The bottom of the parent bump 11 is in contact with a surface electrode (parent-side land) 12, which is buried in the field-insulating film 82 through a contact via 17 as illustrated in FIGS. 3A and 3B. The contact via 17 is a concave portion cut at the bottom of the parent bump 11, made of the same material as the bottom of the parent bump 11, and contact via 17 protrudes into the field-insulating film 82 from the bottom of the parent bump 11. The contact via 17 may be formed by a wall portion of metallic material laminated on an inner wall of a via-hole cut just under the bottom of the parent bump 11 in the field-insulating film 82, the wall portion of metallic material may be continual from the bottom of the parent bump 11. The contact via 17 includes a hollow space surrounded by the wall portion of metallic material in a center of the via-hole so as to implement the concave topology illustrated in FIGS. 3A and 3B.

The parent-side land 12 may be one of interconnections buried in the structure of multilevel interconnection implementing the field-insulating film 82. For example, the parent-side land 12 may be one of the top-level interconnections buried in the structure of multilevel interconnection. Through the contact via 17 and the parent-side land 12 buried in the field-insulating film 82 disposed on the mother-plate 81, as exemplified in FIGS. 3A and 3B or the like, the parent bump 11 is electrically connected to the mother-circuit, which is integrated in the mother-plate 81. As illustrated in FIG. 3A, the combined structure of the mother-plate 81, the field-insulating film 82, the parent-side land 12, the contact via 17 and the parent bump 11 implement the "body 1" which is an element of the stacked semiconductor device pertaining to the first embodiment.

On the other hand, as to the onboard-element $X_{ij}$ illustrated in FIG. 3A, the bottom surface of the onboard-element $K_{ij}$, or the connection face of the onboard-element $X_{ij}$ is used as the chip surface merging a read-out circuit. And FIG. 3A exemplifies a topology such that the connection face implements the parallel plate structure with an opposite face facing the connection face. However, the present invention is not limited to the parallel plate structure illustrated in FIG. 3A. For example, if the onboard-element $X_{ij}$ is a round LED element in a shape of a cannonball, the onboard-element $X_{ij}$ is not a parallel plate structure. The opposite face facing the connection face may be hog-backed, semi-cylindrical, or dome-shaped, or the opposite face may delineate a complex curved-surface. As one of the examples, the onboard-element $X_{ij}$ may be implemented by a semiconductor chip merged with an integrated semiconductor circuit as the onboard-circuit. However, the onboard-element $X_{ij}$ may have a simple electrical circuit such as an LED chip as the onboard-circuit. Here, for convenience of explanation, focusing to a single onboard-element $X_{ij}$ used in the stacked semiconductor device pertaining to the first embodiment, an example of a composite structure, in which a semiconductor substrate is used as the supporting substrate, and a multi-level interconnection insulation-layer 20 is disposed on top of the semiconductor substrate as illustrated in FIG. 3A, will be explained in the stacked semiconductor device pertaining to the first embodiment.

On the multi-level interconnection insulation-layer 20, which is laminated on the connection face of the onboard-element $K_{ij}$, as illustrated in FIGS. 3A to 7B, repair bumps (21, 22, 23) each having a contour of a repair-site wall perpendicular to the connection face and electrically connected to the onboard-circuit is provided. As illustrated in FIG. 3A, the onboard-element the multi-level interconnection insulation-layer 20, and the repair bump (21, 22, 23) implement the "onboard-components 2", which is one of the components of the stacked semiconductor device pertaining to the first embodiment. The repair bump (21, 22, 23) is electrically connected to the onboard-circuit merged in the onboard-element $X_{ij}$ through a hidden repair-side surface-interconnection (repair-side land) buried in the multi-level interconnection insulation-layer 20, although the hidden repair-side surface-interconnection (repair-side land) is not illustrated in FIGS. 3A and 3B. In a plane pattern viewed from a normal direction of the connection face illustrated in FIG. 4, the rectangular box-shaped mother-site wall and the repair-site wall intersect at quadruple points. Mathematically point has no area, but both of the mother-site wall and the repair-site wall have thickness, the quadruple points are quadruple areas determined by the thicknesses of the mother-site wall and the repair-site wall, respectively.

Although both the mother-site wall and the repair-site wall are rectangular shape, as already mentioned, since the straight line is a curve having an infinite radius of curvature mathematically, a flat plate-shaped wall can be categorized as a type of "curved-surface". Incidentally, at final stage of manufacturing of the stacked semiconductor device pertaining to the first embodiment, the jointing-element $B_{uv}$ of the commercial product has a variety of curved-surfaces having a plurality of radii of curvature, since the structure of the jointing-element $B_{uv}$ collapses into pieces of disordered and irregular shape. That is, the parent bump 11 and the repair bump (21, 22, 23) are mutually folded in with irregular fragments, and the original plane topology of the jointing-element $B_{uv}$ before bonding is lost to generate disordered and irregular curves.

As can be seen from FIGS. 3A to 7B and the like, the repair bumps 21, 22, and 23 have a triple-layered composite-structure implemented by a rectangular box-shaped outermost layer (first hardness layer) 21, a rectangular box-shaped intermediate layer (second hardness layer) 22, and a rectangular box-shaped innermost layer (third hardness layer) 23. The hardness of the intermediate layer 22 has a value higher than the hardness of the outermost layer 21 and the innermost layer 23. And, the hardness of the outermost layer 21 and the innermost layer 23 is similar to that of the parent bump 11. Therefore, the hardness of the intermediate layer 22 is higher than that of the parent bump 11.

For example, when gold (Au) is used as the conductor of the outermost layer 21 and the innermost layer 23 of the parent bump 11, and furthermore, Au is used as the conductor of the repair bump (21, 22, 23), metals and compounds more than twice as hard as Au, such as cobalt (Co), nickel (Ni), iridium (Ir), chromium (Cr), tungsten (W), titanium (Ti), titanium tungsten (TiW), alumina ($Al_2O_3$), and Si can be used as the conductor of the intermediate layer 22. For example, if Ti is selected for the intermediate layer 22, the side wall of the repair bump (21, 22, 23) becomes a triple-layered composite-structure of Au/Ti/Au. Alternatively, if alloys or mixtures such as Au—Co, Au—Ni, Au—Ir, Au—Cr, Au—W, Au—Ti, Au—Si are used as the conductor of the intermediate layer 22, more than twice higher than the hardness of Au can be realized by these alloys or mixtures. It is also possible to use ternary alloy of Au, quaternary alloy of Au, or the like from two or more materials selected from Co, Ni, Ir, Cr, W, Ti, Si, or the like, in which Au of less than 75% is included. An alloy containing Au of 70% or more is favorable in order to take advantage of the high conductivity behavior of Au. On the other hand, in order to take advantage of high hardness of Co, Ni, Ir, Cr, W, Ti, Si, and the like, an alloy containing less than 30% Au is preferable.

As the hardness of the alloy depends on the composition, in general, the hardness of the metal is increased by alloying with other metals. An elemental Au has a Vickers hardness of about 25 Hv, whereas, an Au-20Sn alloy containing 20% tin (Sn) has a Vickers hardness of about 118 Hv, and an Au-12Ge alloy containing 12% of germanium (Ge) has a Vickers hardness of about 108 Hv, which is 4.7 times or 4.3 times that of the elemental Au. Therefore, Au—Sn alloy or Au—Ge alloy can also be used as the conductor of the intermediate layer 22. Since the Vickers hardness of Au-3.15Si alloy containing 3.15% of Si is about 86 Hv, the Vickers hardness of Au-3.15Si alloy is 3.4 times higher than the hardness of elemental Au, and can be used as the conductor of the intermediate layer 22. On the other hand, as the low hardness characteristics of Sn will become remarkable, the Vickers hardness of Au-90Sn alloy containing 90% Sn is about 16 Hv, which is lower than the Vickers hardness of elemental Au, and Au-90Sn is not suitable as the conductor of the intermediate layer 22. Au-90Sn alloys can be used as conductors for the parent bump 11 and the outermost layer 21 and innermost layer 23 of the repair bump (21, 22, 23). As the conductor of the outermost layer 21 and the innermost layer 23 of the parent bump 11 and the repair bump (21, 22, 23), in addition to Au-90Sn alloy, an alloy containing less than 30% of Au, such as Au—Sn, Au-lead (Pb), Au-zinc (Zn) may be used.

Figure 4:
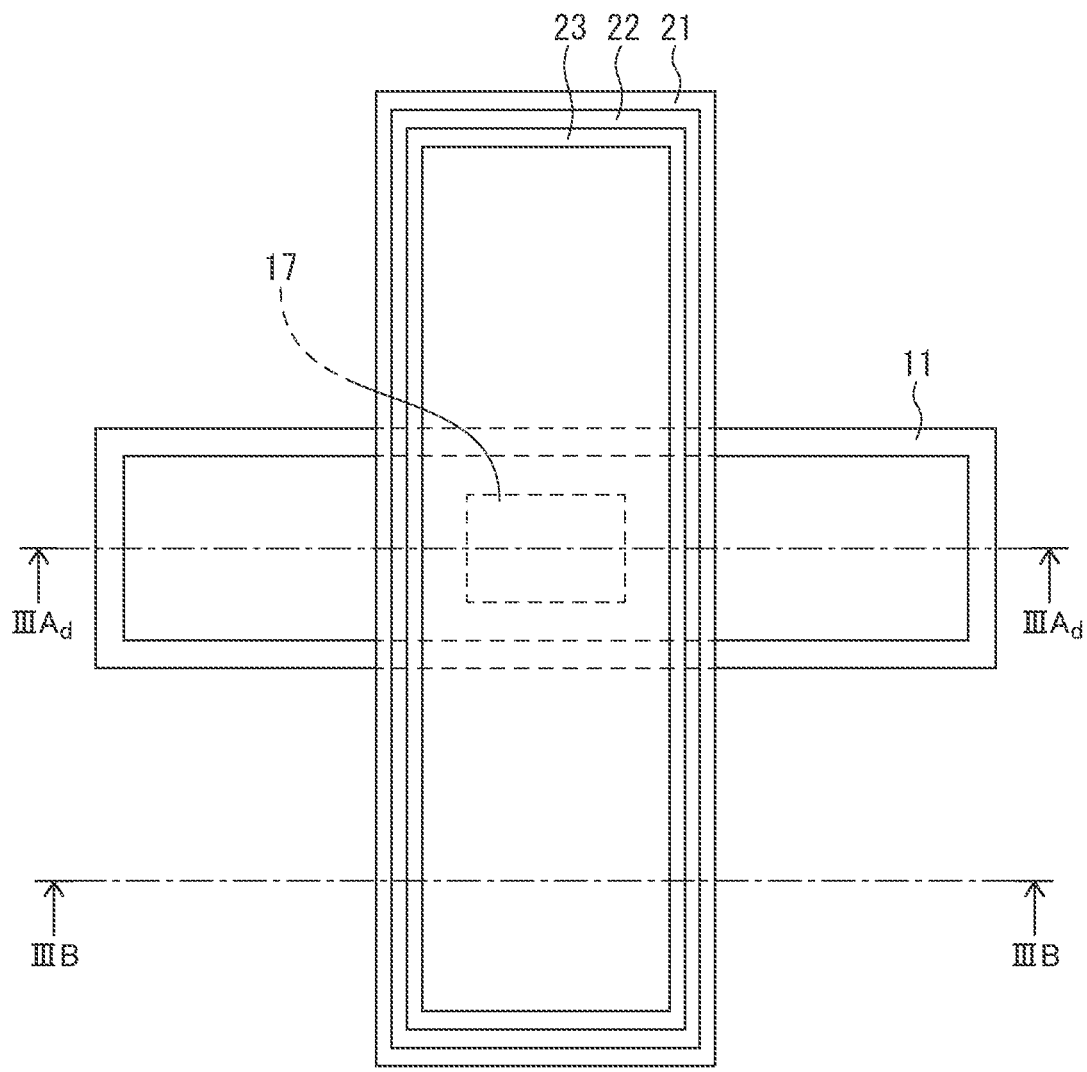
FIG. 4 is a plan view for explaining the position and direction of the cut surface of the cross-sectional view illustrated in FIGS. 3A and 3B.

As a result of choosing a combination of various conductors having different hardness, at the quadruple intersections of the mother-site wall and the repair-site wall illustrated in FIG. 4, where the parent bump 11 and the repair bump (21, 22, 23) intersect, since the hardness of the intermediate layer 22 of the repair bump (21, 22, 23) is higher than the hardness of the parent bump 11, as illustrated in FIG. 3B, the repair bump (21, 22, 23) implement a selective solid-phase diffusion bonding processes, by cutting and penetrating into the interior of the parent bump 11. As can be understood from FIG. 4, both of the mother-site wall and the repair-site wall have thickness, the quadruple intersections are quadruple areas determined by the thicknesses of the mother-site wall and the repair-site wall, respectively. That is, because at the intersections of the mother-site wall and the repair-site wall, a conductor having a higher hardness than the residual portion in either one of the parent bump 11 or the repair bump (21, 22, 23) is included, as illustrated in FIG. 3B, the parent bump 11 and the repair bump (21, 22, 23) establish a jointing-element $B_{uv}$ which has localized solid-phase diffusion bonded portions allocated around the quadruple intersections, and the jointing-element $B_{uv}$ serves as one of the elements of the stacked semiconductor device pertaining to the first embodiment.

Figure 5A:
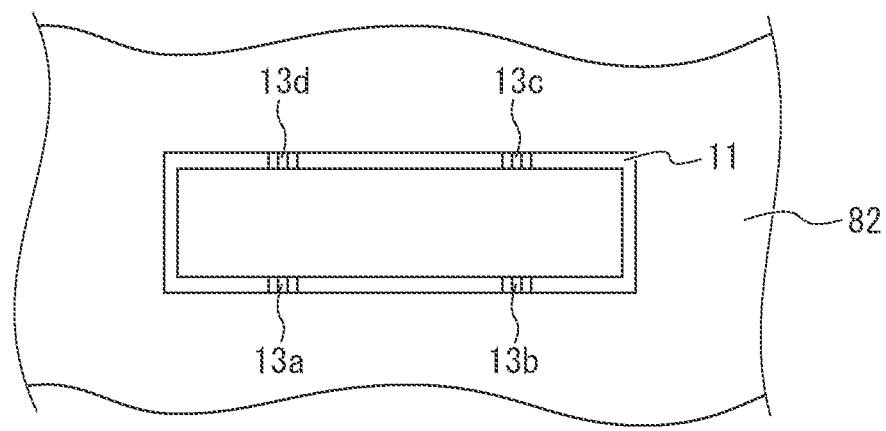
FIG. 5A is a schematic plan view illustrating a knife-edge-shaped notch formed in the parent bump of the stacked semiconductor device according to the first embodiment.
Figure 5B:
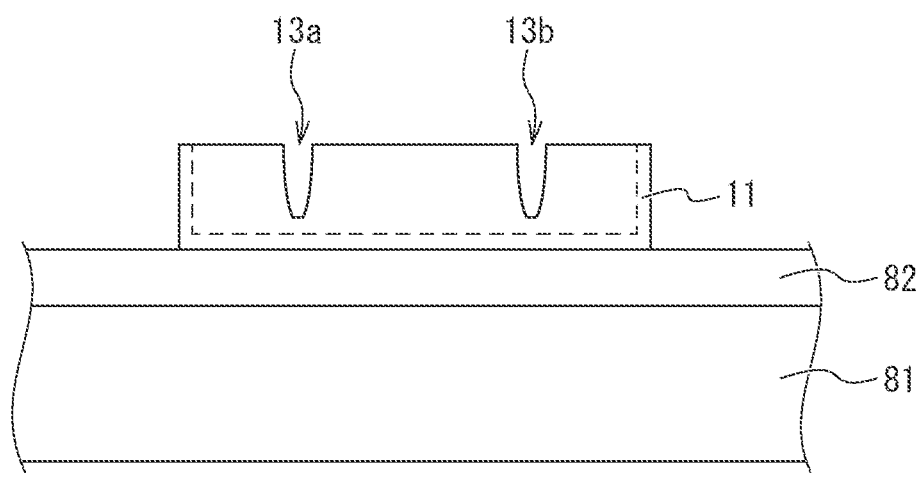
FIG. 5B is a corresponding schematic side view of FIG. 5A.
Figure 6:
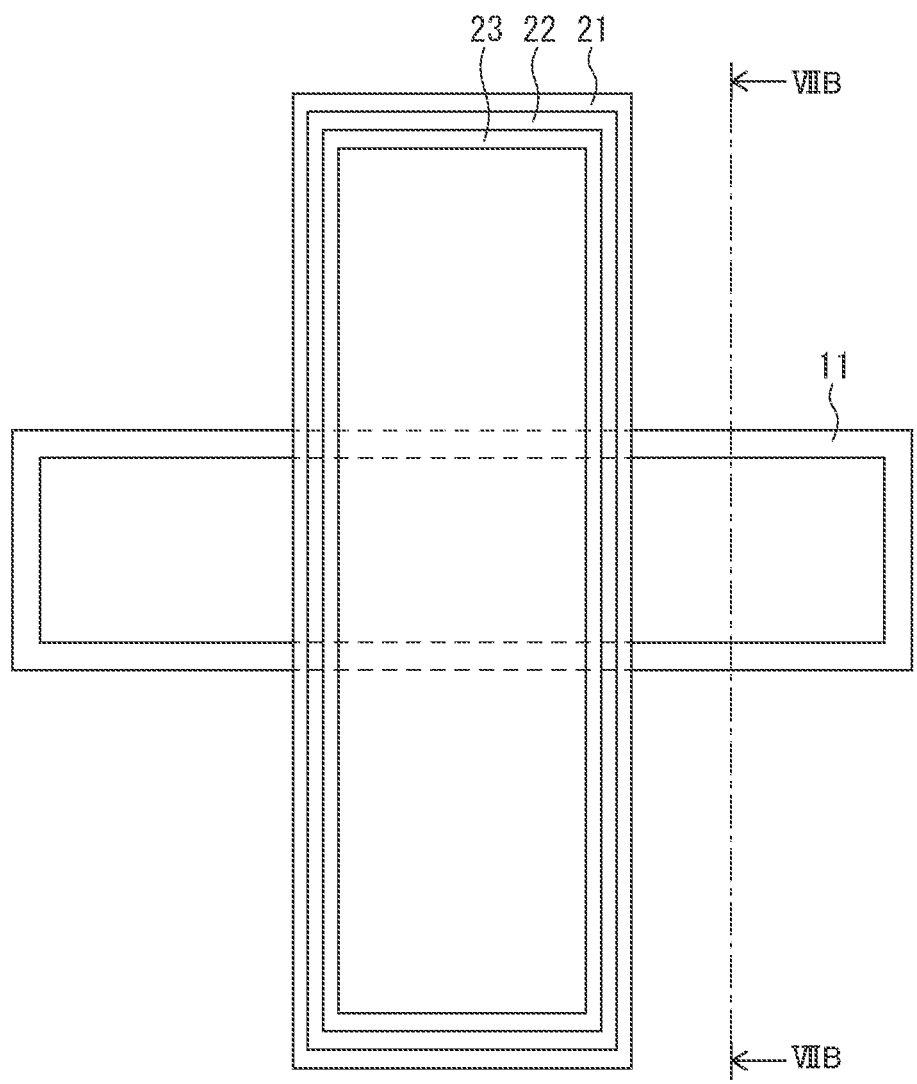
FIG. 6 is a plan view for explaining quadruple intersections between the parent bump and the repair bumps of the stacked semiconductor device according to the first embodiment of the present invention.
Figure 7A:
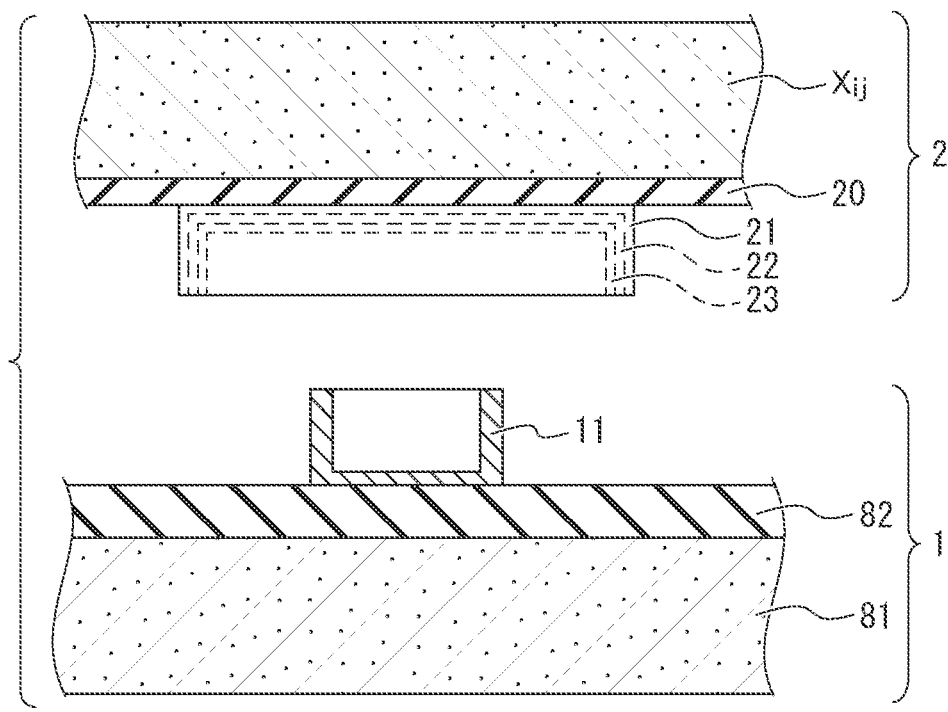
FIG. 7A is a schematic cross-sectional view illustrating a previous state, in which the repair bumps and the parent bump are separated, leading to the structure of the jointing-element illustrated in FIG. 7B.
Figure 7B:
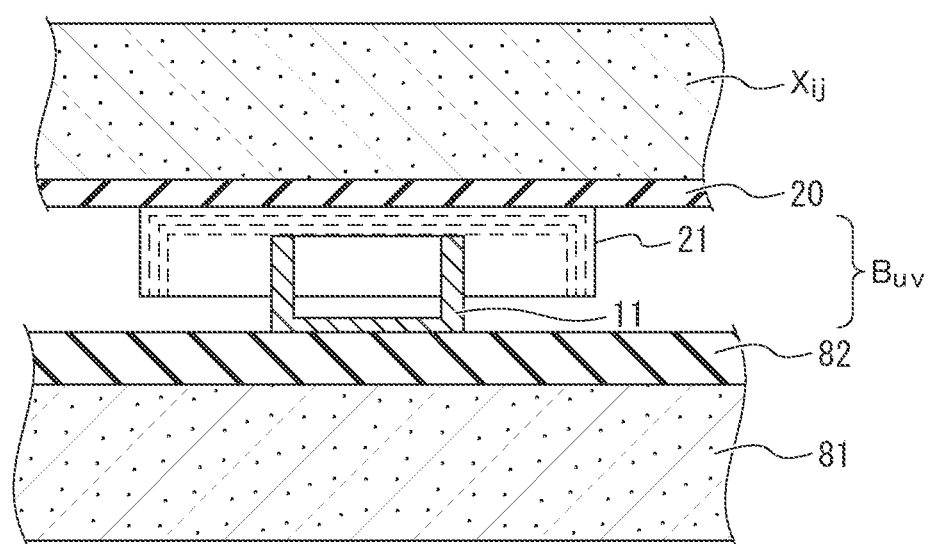
FIG. 7B is a cross-sectional view of a jointing-element of the stacked semiconductor device according to the first embodiment as viewed from VIIB-VIIB of FIG. 6.

In the jointing-element $B_{uv}$ of the stacked semiconductor device pertaining to the first embodiment, the box-shaped repair bump (21, 22, 23) of the triple-layered composite-structure, as illustrated in FIGS. 5A and 5B, bite each other with the counterpart parent bump 11. Since material having a hardness higher than the metallic material used for the parent bump 11 is put into the intermediate layer 22, which implements the structure of the box-shaped repair bump (21, 22, 23) of the triple-layered composite-structure, the repair bump (21, 22, 23) and the parent bump 11 bite each other, such that trenches 13a, 13b, 13c, and 13d formed at the upper portion of the parent bump 11 penetrate deeply into the parent bump 11 by the pressure applied during crimping for bonding, and thereby implementing solid-phase diffusion-bonded interfaces. Therefore, since the higher-hardness intermediate layer 22 cuts deep trenches 13a, and 13b like knife edges illustrated in FIG. 5B, and implements solid-phase diffusion-bonded interfaces, although deformed region is small, the contact areas between the clean surfaces are increased with aid of the interface areas generated by the knife-edge shaped trenches. That is, although the deformed amount of the entire bump for adopting the structure of the solid-phase diffusion bonding with deep trenches as illustrated in FIG. 3B is smaller than the conventional bumps with uniform-hardness scheme, the areas of the solid-phase diffusion bonding portions between the clean metals are increased by the deep penetration of the knife-edge shaped trenches. By generating the deep knife-edge shaped trenches, solid-phase diffusion bonding between the repair bump (21, 22, 23) and the parent bump 11 is possible even at low temperatures, because larger areas of new clean surfaces can be used.

As already mentioned, depending on the application fields, the onboard-element $X_{ij}$ may include highly integrated circuitry. In the case of a structure having a high degree of integration, the performance quality of the onboard-circuit merged in the onboard-element $X_{ij}$ can be estimated only after the onboard-element $X_{ij}$ is assembled on the mother-plate 81 by the jointing-element $B_{uv}$ and tested. On the other hand, in the case of a micro LED display, from hundreds of thousands to millions of LED chips are stacked on the mother-plate 81 as the drive panel. Since each of the LED chips requires strict performance specifications for characteristics such as brightness, there is a case where a small number of defective products are mixed in a large amount of LED chips. If there is any defective product in the array of the onboard-circuits provided in the specific onboard-element $X_{st}$, the entire structure of the stacked semiconductor device pertaining to the first embodiment illustrated in FIGS. 1 and 2 becomes defective. Therefore, it is necessary to provisionally connect each of the onboard-elements $X_{ij}$ to the mother-plate 81 and confirm whether or not the onboard-circuit provided in the specific onboard-element $X_{st}$ has a defect, respectively. Therefore, in each of the jointing-elements $B_{uv}$ of the stacked semiconductor device pertaining to the first embodiment, a provisional-connection is made by provisionally connecting the parent bump 11, of which the bottom is bonded to the parent-side land (parent-side surface electrode) 12 buried in the field-insulating film 82 as illustrated in FIGS. 3A and 3B, and an array of the repair bumps (21, 22, 23), each of which the bottom is bonded to the hidden repair-side surface-interconnection (repair-side land) buried in the multi-level interconnection insulation-layer 20. Furthermore, the parent-side land and the repair-side land, as described later with reference to FIGS. 19A and 19B or the like, may have structures such that the parent-side land is exposed from the field-insulating film 82, and that the repair-side land is exposed from the multi-level interconnection insulation-layer 20.

By the jointing-element $B_{uv}$ of the stacked semiconductor device pertaining to the first embodiment, because the crimping process of the repair bump (21, 22, 23) and the parent bump 11 can be achieved with a relatively small pressure, the crimping can suppress the deformation of most portions of bumps other than the portions at solid-phase diffusion bonding. And therefore, since the crimping of the repair bump (21, 22, 23) and the parent bump 11 suppresses the deformation of most portions of bumps other than the localize portions at which the solid-phase diffusion bondings are generated with deep tranches, after the crimping process with weak force so as to establish the provisional-connection, and after the electrical evaluation, if there is a defect, the defective onboard-component 2 can be replaced to a normal onboard-components 2o as to execute another provisional-connection again with the less deformed portions of bumps. It is possible to proceed to the nonprovisional-jointing process as the nonprovisional-assembling procedure, if the electrical evaluation passes a predetermined acceptable level, by the next, or a further next provisional-connection test with the temporal and weak re-connection condition.

Furthermore, in the stacked semiconductor device according to the first embodiment, a specific alloying material may be added to the material of the intermediate layer 22, which is a part of the repair bump (21, 22, 23), so that the hardness of the compound changes to a higher value than the bump metal by chemical reaction of alloying, the alloyed compound will be generated by the combining process of the specific alloying material and the metal of the parent bump 11. When the hardness of the generated alloyed compound becomes higher than the bump metal, the alloyed compound may locally deform the metal of the parent bump 11 by a large amount, or the alloyed compound may generate cracks in the metal of the parent bump 11. When joining the side walls of the same or uniform hardness, both repair bump and parent bump are deformed by considerable amount, and both are collapsed in a single provisional-connection. Because the exposed area of clean gold is not large by the collapse of uniform hardness structure, or by the deformation of uniform hardness structure, and the uniform repair bump easily peels off immediately from the uniform parent bump.

On the other hand, according to the scheme of the stacked semiconductor device pertaining to the first embodiment, by making selectively the hardness of the intermediate layer 22 of the repair bump (21, 22, 23) higher than the other portions and reducing the thickness of the outermost layer 21 and the innermost layer 23 of the repair bump (21, 22, 23), the higher-hardness material cuts localized portions and trenches penetrate into the counterpart sidewalls like a knife. Since the higher-hardness material generate trenches cutting the lower-hardness material and the generated trenches penetrate into the counterpart sidewalls like the knife, the exposed new areas are increased by the trenches, and the repair bump becomes difficult to peel off from the parent bump, after the provisional-connection. Since the counterpart sidewalls will not deform largely, maintaining the original configuration, and making the repair bump become difficult to peel off from the parent bump after the provisional-connection with the exposed new areas, it is possible to increase the number of repair-processes, which achieves a significant effectiveness in the manufacturing process of the stacked semiconductor device of the stacked semiconductor device pertaining to the first embodiment.

Figure 23:
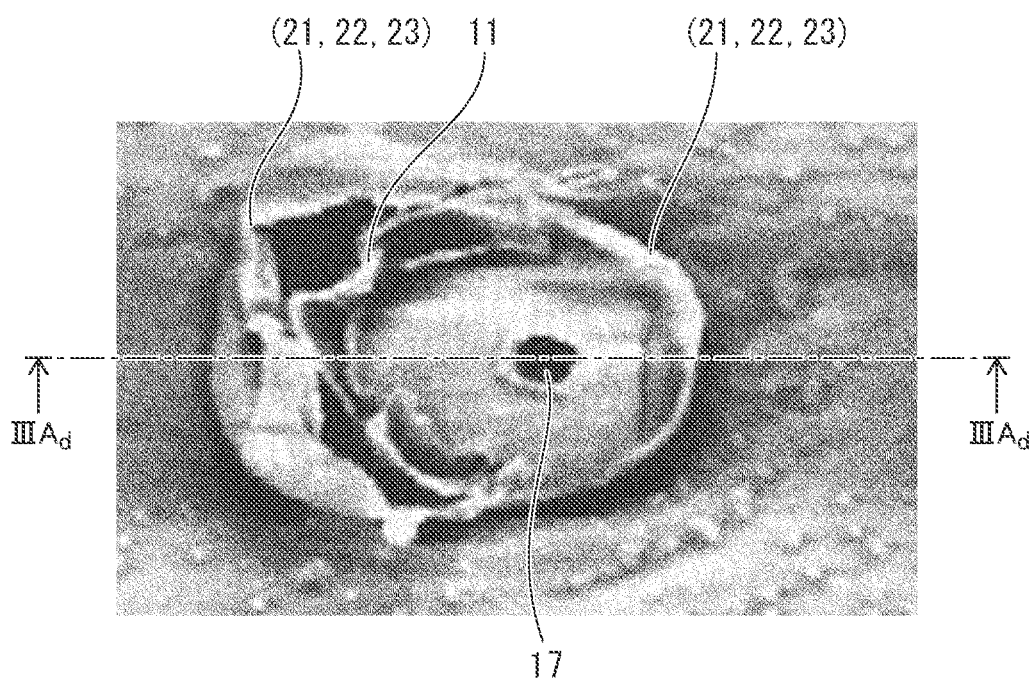
FIG. 23 is a scanning electron microscope (SEM) photograph of a plan view of one of the deformed parent bumps lying at cross-sectional plane illustrated in FIG. 4, when the corresponding repair bump is peeled off forcibly from the parent bump, after the nonprovisional-assembling procedure, or the final-jointing process has been completed.

On the other hand, after the confirmation of the normal and proper operation of the onboard-element $X_{ij}$ in a state where the parent bump 11 and the array of repair bumps (21, 22, 23) is provisionally assembled or temporarily re-connected, by further increasing the force for pressing the onboard-elements $X_{ij}$ against the mother-plate 81, the distance between the array of the onboard-elements $X_{ij}$ and the mother-plate 81 can be shortened. As the force for pressing the array of the onboard-elements $X_{ij}$ against the mother-plate 81 is further increased, the array of the onboard-plate $X_{ij}$ and the mother-plate 81 are completely connected. When completely joining the parent bumps 11 and the repair bumps (21, 22, 23), each of the vertical side wall portions of the parent bumps 11 is further deformed by the pressing force, and each of the tops of the lower end sides of the repair bumps (21, 22, 23) is metallurgically bonded to each of the bottoms of the parent bumps 11. Since the distance between the mother-plates 81 and the body $X_{ij}$ is compressed by the non-provisional final pressing process, the height of the jointing-elements $B_{uv}$ at the stage of the full connection becomes lower than the height of the jointing-elements $B_{uv}$ at the time of provisional-connection illustrated in FIGS. 3A and 3B, and each of the parent bump 11 and each of the repair bumps (21, 22, 23) becomes a structure in which they collapse in disorder and in fragments, respectively, as illustrated in FIG. 23, which represents a SEM photograph of a plan view of one of the deformed parent bumps 11 lying at the cross-sectional plane illustrated in FIG. 4, when the corresponding repair bump (21, 22, 23) is peeled off forcibly from the parent bump 11, after the nonprovisional-assembling procedure, or the nonprovisional final-jointing process has been completed.

Fragmental residues of the repair bump (21, 22, 23) are remained in the broken and collapsed parent bump 11. As can be understood from the disorderly collapsed configuration illustrated in FIG. 23, which has lost the previous box-like configuration before the final-jointing process, the fragmental residues of the patterns of the higher-hardness conductor implementing the intermediate layer 22, are unevenly distributed inside the jointing-element $B_{uv}$ in a disorderly collapsed state, with indeterminate shape along the distorted box-shaped trace. As a result, various fragments of conductors having different hardness are non-uniformly distributed in the intersections of the mother-site wall and the repair-site wall, which bite each other. And furthermore, the various fragments of conductors having different hardness are non-uniformly distributed in the space in the vicinity of the intersections.

By the non-provisional final-jointing process, in the onboard-circuit (signal read-out circuit) implementing the onboard-element $X_{ij}$, the repair bump (21, 22, 23) is connected metallurgically to the parent bump 11 through the repair-side surface-interconnection (repair-side land) buried in the multi-level interconnection insulation-layer 20, further electrically connected to the mother-circuit of the mother-plate 81 through the parent-side surface-interconnection (parent-side land) 12 buried in the field-insulating film 82. Therefore, a part of the stacked semiconductor device pertaining to the first embodiment as illustrated in FIG. 3B is organized by electrical connections of the mother-plate 81, which is provided with the mother-circuit, to array of the onboard-elements each of which is provided with the onboard-circuit, by the array of jointing-elements. Then, the stacked semiconductor device encompasses the mother-plate 81, the array of the onboard-components 2 mounted on the mother-plate 81, and disorderly collapsed jointing-elements $B_{uv}$. Here, the body 1 includes the field-insulating film 82 and the disorderly collapsed parent bump 11 losing the original box-shaped configuration, while each of the onboard-components 2 includes the onboard-element $X_{ij}$, the multi-level interconnection insulation-layer 20 and the disorderly collapsed repair bump (21, 22, 23) losing the original box-shaped configuration, the fragments of the repair bump (21, 22, 23) are folded in the fragments of disorderly collapsed parent bump 11.

In the onboard-component 2 of the stacked semiconductor device pertaining to the first embodiment, the integrated circuit merged at the surface of the Si substrate which implements the onboard-element $X_{ij}$ may establish the onboard-circuit (signal-readout circuit). However, the multi-level structure by itself, such as the upper-level interconnection, the intermediate-level interconnection, the lower-level interconnection may establish the onboard-circuit. Or alternatively, a simple structure including discrete elements such as miscellaneous LED elements may establish the onboard-circuit. The disorderly collapsed repair bump (21, 22, 23) implementing the onboard-component 2 is connected to the onboard-circuit through the repair-side surface-interconnection (repair-side land) buried in the multi-level interconnection insulation-layer 20, and the onboard-circuit is metallurgically connected to the parent bump 11 of the body 1, through the repair bump (21, 22, 23). The disorderly collapsed parent bump 11 is electrically connected to the mother-circuit, which is integrated in the mother-plate 81, through the parent-side surface-interconnection (parent-side land) 12 buried in the field-insulating film 82. The disorderly deformed jointing-element $B_{uv}$ encompasses the disorderly deformed repair bump (21, 22, 23) and the disorderly deformed parent bump 11, a part of which is folded in a part of the repair bump (21, 22, 23). And, as a result, the onboard-circuit of the onboard-component 2 is electrically connected to the mother-circuit of the body 1 through the disorderly deformed jointing-element $B_{uv}$.

For example, by transmitting the signals from the mother-plate 81 through the parent-side surface-interconnection (parent-side land) 12 buried in the field-insulating film 82 to the one of the onboard-circuits (signal-readout circuits), each of the onboard-elements $X_{ij}$ merges the corresponding onboard-circuits (signal-readout circuit) for reading out the signals from the pixels deployed in the mother-plate 81. Then, array of the onboard-elements $X_{ij}$ can function as a read-out chip having a plurality of input electrodes arranged along the connection grid in accordance with the array of pixels. When each of the onboard-elements $X_{ij}$ function as the read-out chip, the repair-side surface-interconnections (repair-side lands) buried in the multi-level interconnection insulation-layer 20 read out the signals from each of mother-circuits through the parent-side surface-interconnections (parent-side lands) buried in the field-insulating film 82. And each of the repair-side surface-interconnections (repair-side lands) functions as the input electrode for entering signals to the corresponding integrated circuit merged respectively in each of the onboard-elements.

As illustrated in FIGS. 3A and 3B, the parent bump 11 implementing each of the jointing-element $B_{uv}$ of the stacked semiconductor device pertaining to the first embodiment has a rectangular box-shaped topology, before the assembling process. Namely, the parent bump 11 encompasses a bottom in contact with the parent-side land 12 via the contact via 17, the parent-side land 12 is buried in the field-insulating film 82, and a vertical side wall portion connected to the outer periphery of the bottom so as to surround the bottom to which the contact via 17 is connected at the center. The repair bump (21, 22, 23) implementing each of the jointing-element $B_{uv}$ are made by a laminated structure. Before the assembling process, the repair bump (21, 22, 23) has a rectangular box-shaped topology with the bottom-main surface in contact with the repair-side surface-interconnection (repair-side land) buried in the multi-level interconnection insulation-layer 20. The planar pattern of the parent-side surface-interconnection (parent-side land) buried in the field-insulating film 82 and the repair-side surface-interconnection (repair-side land) buried in the multi-level interconnection insulation-layer 20 may be, for example, rectangular, but are not limited to being rectangular. The height of the parent bump 11 implementing the jointing-element $B_{uv}$ before provisional-connection process can be determined to be, for example, one micrometer or more and less than five micrometers. The height of the wall of the repair bump (21, 22, 23) may be set higher than the depth of the box-shaped vertical side wall portion building up the parent bump 11.

Each of the parent-side surface-interconnection (parent-side land) 12 buried in the field-insulating film 82 and the repair-side surface-interconnection (repair-side land) buried in the multi-level interconnection insulation-layer 20 can be made of, for example, Au or an alloy containing 80% or more Au such as Au—Si, Au—Ge, Au—Sb, Au—Sn, Au—Pb, Au—Zn, Au—Cu. Or alternatively, the first and repair-side surface-interconnections may have a laminated structure based upon an underlying metallic-layer such as Ni. For example, the composite structure embracing the onboard-element $X_{ij}$ and the multi-level interconnection insulation-layer 20 on the onboard-element $X_{ij}$ can adopt an architecture including first and second lower-level interconnections, a first insulation layer, first and second intermediate-level interconnections and a second insulation layer. The first and second lower-level interconnections are spaced from each other on the top surface of the supporting substrate. The first insulation layer is disposed on the first and second lower-level interconnections, and the first insulation layer buries the first and second lower-level interconnections. The first and second intermediate-level interconnections are spaced from each other on the top surface of the first insulation layer. The second insulation layer is disposed on the first and the second intermediate-level interconnections, and the second insulation layer buries the first and the second intermediate-level interconnections. The first and second lower-level interconnections, the first and second intermediate-level interconnections and the like, for example, can adopt a metallic layer of such as aluminum (Al), aluminum-copper alloy (Al—Cu alloy), or copper (Cu) damascene. Further, the first and second insulation layers may correspond to a part of the multi-level interconnection insulation-layer 20, respectively, illustrated in FIG. 2.

The multi-level interconnection insulation-layer 20, for example, can use inorganic dielectric materials such as silicon oxide film ($SiO_2$ film), silicon nitride film ($Si_3N_4$ film), phosphorus silicate glass film (PSG film), fluorine-containing oxide film (SiOF film), carbon-containing oxide film (SiOC film), or organic dielectric materials such as methyl-containing polysiloxane (SiCOH), hydrogen-containing polysiloxane (HSQ), porous methylsilsesquioxane film, or polyarylene film. And furthermore, by combining these various dielectric materials so as to implement a composite layer, it is possible to build up the multi-level interconnection insulation-layer 20 of a variety of laminated structures. The second intermediate-level interconnection may be arranged such that the position of the array of one row faces the second lower-level interconnection through the first insulation layer. The second intermediate-level interconnection is electrically connected to the repair-side surface-interconnection (repair-side land) buried in the multi-level interconnection insulation-layer 20 through the conductor, and the second lower-level interconnection is connected to the ground potential. Thus, if the stacked semiconductor device pertaining to the first embodiment is a solid-state imaging device, the second intermediate-level interconnection and the second lower-level interconnection implement a set of read-out capacitors of a parallel plate configuration, each of which is a thin film capacitor for storing signals generated in the mother-circuit as electric charges.

Further, although not illustrated, inside the surface side of the onboard-element $X_{ij}$ in contact with the multi-level interconnection insulation-layer 20, by a voltage applied to the first lower-level interconnection, a channel region for providing a channel in a semiconductor region between the first intermediate-level interconnection and the second intermediate-level interconnection can be allocated. Thus, if the stacked semiconductor device pertaining to the first embodiment is a solid-state imaging device, the first lower-level interconnection, the first intermediate-level interconnection and the second intermediate-level interconnection implement a switching element, which is a thin film transistor for reading out charges accumulated in the read-out capacitor as signals. The first lower-level interconnection can serve as a gate electrode of the thin film transistor. And then, the first intermediate-level interconnection serves as a drain electrode of the thin film transistor, respectively, and the second intermediate-level interconnection serves a source electrode of the thin film transistor, or vice versa.

The gate electrode of the switching element, that is, the first lower-level interconnection, is connected to the gate signal line extending in the row direction (X-axis direction) of the pixel. The gate signal lines are arranged for each row of pixels and are connected to each of the gate electrodes of the switching elements aligned in the same row. Each of the gate signal lines are connected to the gate-drive circuit (not illustrated), and is sequentially applied with gate drive signals from the gate-drive circuit. The gate drive signals are sequentially applied in the column direction at a predetermined scan period. In addition, the drain electrode of the switching element, that is, the first intermediate-level interconnection, is connected to the signal-readout lines extending in the column direction of the pixel. The signal-readout lines are arranged for each column of pixels, and the signal-readout lines are connected to each of the drain electrodes of the same column. Each of the signal-readout lines are connected to a readout-drive circuit (not illustrated), and the signal-readout lines are sequentially scanned in the row direction (X-axis direction) by the readout-drive circuit. Thus, in each scanning period of the gate-drive circuit, the readout-drive circuit sequentially reads out the signals along the column direction from the read-out capacitors in mother-circuit, the read-out capacitors are aligned in the row to which the gate drive signals are applied.

As described above, if the stacked semiconductor device pertaining to the first embodiment is the solid-state imaging device, the signals of each of the pixels in mother-circuit are read out, and the signals are converted into pixel values in the image-processing circuit, which is not illustrated. Since the positions of the pixels are mapped corresponding to the mother-circuit, and an image, which represents a two-dimensional distribution of signal charges generated by the amount of incident electromagnetic wave, is generated. As described above, according to the stacked semiconductor device pertaining to the first embodiment, the stacked semiconductor device and the onboard-elements $X_{ij}$ or the like used in the stacked semiconductor device, which facilitate the repair processing, can be provided, by the successive repair processing, only the defective onboard-element is selectively repaired from among the plurality of onboard-elements $X_{ij}$ mounted on the mother-plate 81 of larger dimensional size. As a result, the stacked semiconductor device pertaining to the first embodiment can minimize the manufacturing period of various stacked semiconductor devices, which includes the stacked semiconductor devices in which a large number of onboard-elements $X_{ij}$ are arranged in a matrix on a large-size mother-plate 81. Furthermore, wasteful loss of normally operating mother-bodies 81 and normally operating onboard-elements $X_{ij}$ are eliminated. And furthermore, because the number of allowable repair processes can be increased, the stacked semiconductor device pertaining to the first embodiment achieves an effectiveness that prevents waste of resources.

First Modification of the First Embodiment

Figure 8:
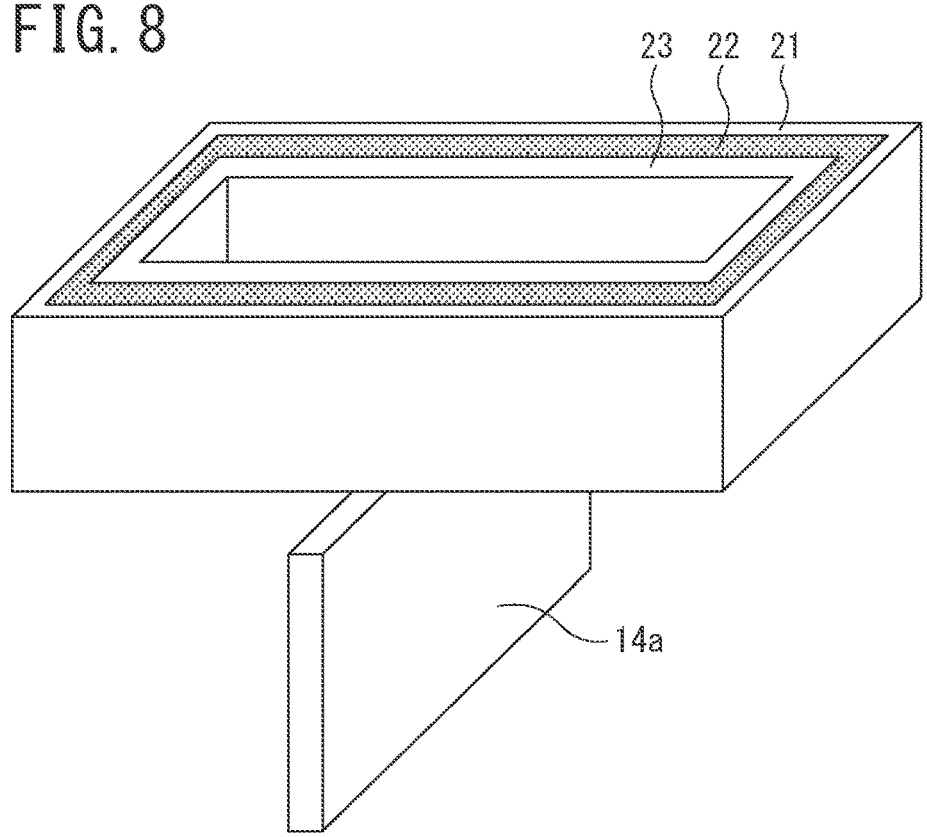
FIG. 8 is a schematic bird's-eye view for explaining the relation between the repair bumps and the parent bump of the stacked semiconductor device according to the first modification of the first embodiment of the present invention.

As illustrated in FIG. 8, a stacked semiconductor device according to the first modification of the first embodiment has a stacked structure assembled by a body and essentially same onboard-component as the structure illustrated in FIGS. 3A and 3B. As can be estimated from FIGS. 3A and 3B, the body of the stacked semiconductor device according to the first modification shall also include a mother-plate (not illustrated), a field-insulating film (not illustrated) provided on the mother-plate, and a plate-shaped parent bump 14a disposed on the field-insulating film, as illustrated in FIG. 8. On the other hand, each of the onboard-components can assume the structure including an onboard-element (not illustrated) and a multi-level interconnection insulation-layer (not illustrated) provided on the connection face of the onboard-element. And each of the onboard-component has repair bump (21, 22, 23) encompassing a rectangular box-shaped laminated structure on the bottom surface of the multi-level interconnection insulation-layer as illustrated in FIG. 8. However, the onboard-element of the first modification of the first embodiment may have a structure of discrete element such as an LED chip.

The parent bump 14a is a rectangular-shaped parallel plate having a single slab of a mother-site wall perpendicular to the mounting-main surface of the mother plate. As already mentioned, since the straight line is a curve having an infinite radius of curvature, the specification of the present invention generalizes the nomenclature of the geometry, by calling the flat slab as a "curved-surface". The bottom of the parent bump 14a is in contact with the surface interconnection buried in the field-insulating film, and is electrically connected to the mother-circuit integrated in the mother-plate. The repair bump (21, 22, 23) is electrically connected to the onboard-circuit having a contour of a repair-site wall perpendicular to the connection face of the onboard-element. The repair bump (21, 22, 23) is electrically connected to the onboard-circuit merged in the onboard-element through the surface interconnection buried in the multi-level interconnection insulation-layer. As can be seen from FIG. 8, the mother-site wall and the repair-site wall intersect at two intersections.

The repair bump (21, 22, 23) is a triple-layered composite-structure embracing a rectangular box-shaped outermost layer 21, a rectangular box-shaped intermediate layer 22, and a rectangular box-shaped innermost layer 23. The hardness of the intermediate layer 22 has a value higher than the hardness of the outermost layer 21 and the innermost layer 23. The hardness of the outermost layer 21 and the innermost layer 23 is similar to that of the parent bump 14a. Therefore, the hardness of the intermediate layer 22 is higher than that of the parent bump 14a. For example, when Au is used as the conductor of the outermost layer 21 and the innermost layer 23 of the parent bump 14a and the repair bump (21, 22, 23), a high-hardness metallic material such as Co, Ni, Ir, Cr, W, Ti, or TiW can be employed as the conductor of the intermediate layer 22. Alternatively, alloys of Au or mixtures of Au, such as Au—Co, Au—Ni, Au—Ir, Au—Cr, Au—W, Au—Ti, Au—$Al_2O_3$, Au—Si, or Au—Ge containing 70% or more of Au can be used as the conductor of the intermediate layer 22. A ternary alloy of Au, or quaternary alloy of Au, or the like of two or more materials selected from among Co, Ni, Ir, Cr, W, Ti, Si, Ge, or the like may be also used.

The Vickers hardness of Au-20Sn alloy containing 20% Sn is about 118 Hv, but the Vickers hardness of Au-90Sn alloy containing 90% Sn is about 16 Hv, so that attention should be paid to the mole-fraction of Au—Sn alloy. At two intersections of the mother-site wall and the repair-site wall where the parent bump 14a and the repair bump (21, 22, 23) intersect, since the hardness of the intermediate layer 22 of the repair bump (21, 22, 23) is higher than the hardness of the parent bump 14a, the repair bump (21, 22, 23) bites the parent bum bump 14a to establish solid-phase diffusion-bonded interfaces, such that a hard edge of the box-shaped repair bump (21, 22, 23) cuts and penetrates into the interior of the parent bump 11. That is, in the stacked semiconductor device according to the first modification of the first embodiment, at the intersections of the mother-site wall and the repair-site wall, because a structure in which a higher-hardness conductor than the residual portion is included in either one of the parent bump 14a or the repair bump (21, 22, 23), the parent bump 14a and the repair bump (21, 22, 23) bite each other. The parent bump 14a and the repair bump (21, 22, 23) implement the jointing-element as one of the elements of the stacked semiconductor device according to the first modification of the first embodiment.

In the jointing-element of the stacked semiconductor device according to the first modification of the first embodiment, material with a hardness higher than the metal used in the parent bump 14a is put in the intermediate layer 22, which implements the structure of the box-shaped repair bump (21, 22, 23) of the triple-layered composite-structure, due to the pressure applied during crimping for bonding, the intermediate layer cuts and penetrates into the counterpart parent bump 14a and achieves solid-phase diffusion bonding. Therefore, since the higher-hardness intermediate layer 22 establishes solid-phase diffusion-bonded interfaces by generating a deep trench with knife edge configuration, the portion to be deformed is small but the required contact areas with exposed clean surfaces are increased by the deep trenches generated between the parent bump 14a and the repair bump (21, 22, 23). Though the deformed amount of the whole bump becomes smaller than the conventional uniform-hardness jointing scheme, by providing knife-edge trenches, the area of clean metals required for solid-phase diffusion junction increases. With aide of the deep trenches generated, solid-phase diffusion bonding between the repair bump (21, 22, 23) and the parent bump 14a becomes possible even at low temperatures, because larger areas of new clean surfaces can be used.

In the jointing-element of the stacked semiconductor device according to the first modification of the first embodiment, since the weak crimping process of the repair bump (21, 22, 23) and the parent bump 14a at a relatively small pressure can suppress the deformation of most portions of bumps other than the solid-phase diffusion bonding, after crimping with weak force so as to execute the provisional connection and the electrical evaluation, if there is a defect, the defective onboard-components can be replaced to a new onboard-component so as to execute the next provisional connection again with less deformed configuration of the parent bump 14a. It is possible to proceed to the non-provisional final-jointing process as the nonprovisional-assembling procedure, if the electrical evaluation passes a predetermined acceptable level, by the next, or a further next provisional-connection test with the temporal and weak re-connection condition. In the stacked semiconductor device according to the first modification of the first embodiment, additional material such that the hardness of the compound becomes higher than the bump metal may be added, after crimping the metal of the parent bump 14a to be bump-bonded to the intermediate layer 22 which is a part of the repair bump (21, 22, 23). Namely, the hardness-increased compound generated by chemical reaction with the additional material may locally deform the metal of the counterpart parent bump 14a by a large amount, or generate cracks selectively in limited areas in the metal of the counterpart parent bump 14a.

On the other hand, after the confirmation process of the onboard-element in a state where the parent bump 14a and the repair bump (21, 22, 23) is provisionally assembled or provisionally re-assembled, after the normal and proper operation of the onboard-element is confirmed, the force for pressing the onboard-component against the body is further increased, and the distance between the onboard-element and the mother-plate is further shortened. When the force for pressing the onboard-component against the body is further increased, the onboard-component and the body are finally and completely jointed. During the nonprovisional-assembling procedure of the parent bump 14a and the repair bump (21, 22, 23), the vertical side wall portion of the parent bump 14a is further deformed by the pressing force, and the edge at lower side of the repair bump (21, 22, 23) is metallurgically bonded to the bottom portion of the parent bump 14a. Since the distance between the mother-plate and the onboard-element is compressed by the final pressing, the height of the jointing-element after the stage of the nonprovisional-assembling procedure becomes lower than the height of the original jointing-element at the previous stage of the provisional-connection, and the parent bump 14a and the repair bump (21, 22, 23) collapse in disorder and in fragments. Fragmental residues of the fragments of higher-hardness conductors implementing the intermediate layer 22 in a disorderly collapsed state are unevenly distributed in the jointing-element, along an indeterminate trace of a distorted box-like configuration. As a result, various fragments of conductors having different hardness are non-uniformly distributed in the intersections of the mother-site wall and the repair-site wall, which bite each other. And furthermore, the various fragments of conductors having different hardness are non-uniformly distributed in the space in the vicinity of the intersections.

After the nonprovisional-assembling procedure, the repair bump (21, 22, 23) is metallurgically connected to the parent bump 14a, the mother-circuit merged in the mother-plate, and the onboard-circuit merged in the onboard-element are electrically connected by jointing-elements, the stacked semiconductor device according to the first modification of the first embodiment can be build up. As described above, the stacked semiconductor device according to the first modification of the first embodiment can provide a stacked semiconductor device for which the repair processing is easy, and onboard-elements to be used in the stacked semiconductor device, in a case of assembling, in which only the defective onboard-element is repaired from among the plurality of onboard-elements mounted on a large-size mother-plate. As a result, the stacked semiconductor device according to the first modification of the first embodiment can minimize the manufacturing period of the various stacked semiconductor devices including the devices in which a large number of onboard-elements are arranged in the large-size mother-plate, eliminate the wasteful loss of the body and the onboard-components which are normally operating, and increase the allowable number of the repair-process to prevent waste of resources.

Second Modification of the First Embodiment

Figure 9:
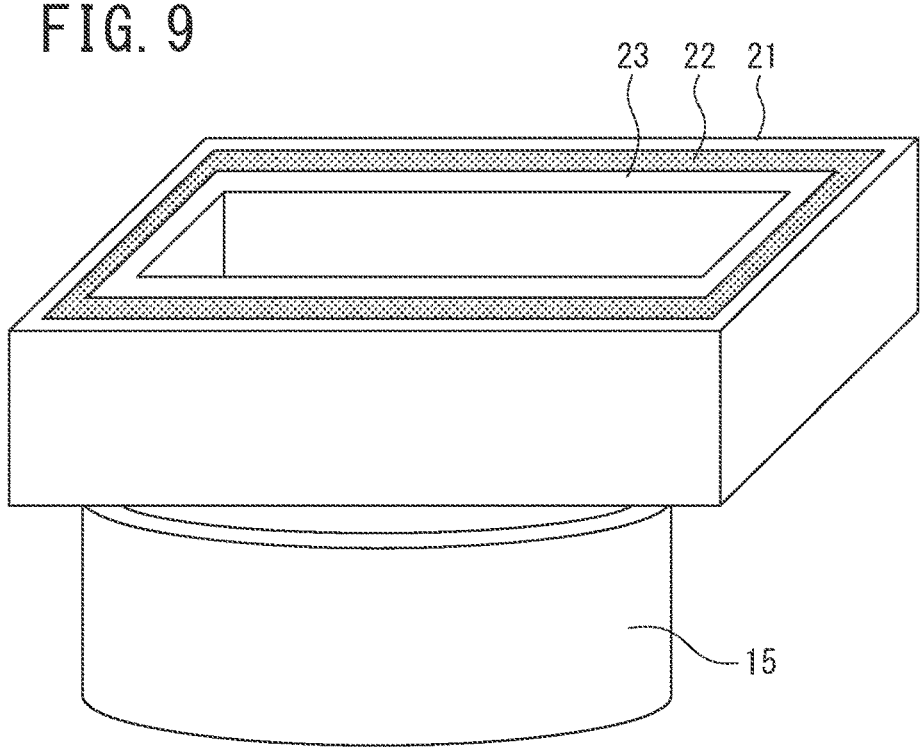
FIG. 9 is a schematic bird's-eye view for explaining the relation between the repair bumps and the parent bump of the stacked semiconductor device according to the second modification of the first embodiment of the present invention.

As illustrated in FIG. 9, a stacked semiconductor device according to a second modification of the first embodiment has a stacked structure assembled by the substantially same body and the substantially same onboard-components as the structure of the stacked semiconductor device pertaining to the first embodiment, which has been illustrated in FIGS. 3A and 3B. As can be understood from FIGS. 3A and 3B, the body of the stacked semiconductor device according to the second modification shall also include a mother-plate (not illustrated), a field-insulating film (not illustrated) provided on the mother-plate, the cylindrical parent bump 15 illustrated in FIG. 9 on the field-insulating film. On the other hand, the onboard-components can assume the structure including an onboard-element (not illustrated) and a multi-level interconnection insulation-layer (not illustrated) provided on the connection face of the onboard-element, and having repair bump (21, 22, 23) embracing a rectangular box-shaped laminated structure on the bottom surface of the multi-level interconnection insulation-layer, as illustrated in FIG. 9. However, the onboard-components may have a structure of discrete element such as LED chip different from FIGS. 3A and 3B.

The parent bump 15 is a cylindrical dish having a contour of a mother-site wall, the plane of the wall is perpendicular to the mounting-main surface of the mother plate. The bottom of the cylindrical dish of the parent bump 15 contacts with the surface interconnection buried in the field-insulating film and is electrically connected to the mother-circuit integrated in the mother-plate. The repair bump (21, 22, 23) is electrically connected to the onboard-circuit, having a contour of a repair-site wall perpendicular to the connection face of the onboard-element. The repair bump (21, 22, 23) is electrically connected to the onboard-circuit merged in the onboard-element through the surface interconnection buried in the multi-level interconnection insulation-layer. As can be seen from FIG. 9, the mother-site wall and the repair-site wall intersect at quadruple intersections.

The repair bump (21, 22, 23) is a triple-layered composite-structure embracing a rectangular box-shaped outermost layer 21, a rectangular box-shaped intermediate layer 22, and a rectangular box-shaped innermost layer 23. The hardness of the intermediate layer 22 has a value higher than the hardness of the outermost layer 21 and the innermost layer 23. The hardness of the outermost layer 21 and the innermost layer 23 is similar to that of the parent bump 15. Therefore, the hardness of the intermediate layer 22 is higher than that of the parent bump 15. For example, when Au is used as the conductor of the outermost layer 21 and the innermost layer 23 of the parent bump 15 and the repair bump (21, 22, 23), a high-hardness metallic material such as Co, Ni, Ir, Cr, W, Ti, or TiW can be employed as the conductor of the intermediate layer 22. Alternatively, alloys of Au or mixtures of Au, such as Au—Co, Au—Ni, Au—Ir, Au—Cr, Au—W, Au—Ti, Au—Al$_2$O$_3$, Au—Si, or Au—Ge containing 70% of Au or more can be used as the conductor of the intermediate layer 22. A ternary alloy of Au, quaternary alloy of Au, or the like of two or more materials selected from among Co, Ni, Ir, Cr, W, Ti, Si, Ge, or the like may be also used.

The Vickers hardness of Au-20Sn alloy containing 20% Sn is about 118 Hv, but the Vickers hardness of Au-90Sn alloy containing 90% Sn is about 16 Hv, so that attention should be paid to the mole-fraction of Au—Sn alloy. At the quadruple intersections of the mother-site wall and the repair-site wall where the parent bump 15 and the repair bump (21, 22, 23) intersect, since the hardness of the intermediate layer 22 of the repair bump (21, 22, 23) is higher than the hardness of the parent bump 15, the repair bump (21, 22, 23) bites the parent bump 15 to establish solid-phase diffusion-bonded interfaces, such that the a hard edge of the repair bump (21, 22, 23) cuts and penetrates into the interior of the parent bump 15. That is, the stacked semiconductor device according to the second modification of the first embodiment has a structure in which at the intersections of the mother-site wall and the repair-site wall, either one of the parent bump 15 or the repair bump (21, 22, 23) includes a conductor which is harder than the residual portion. The parent bump 15 and the repair bump (21, 22, 23) implement the jointing-element as one of the elements of the stacked semiconductor device according to the second modification of the first embodiment.

In the jointing-element of the stacked semiconductor device according to the second modification of the first embodiment, material having a hardness higher than the metallic material used for the parent bump 15 is put into the intermediate layer 22. And, since the intermediate layer 22 implements the structure of the box-shaped repair bump (21, 22, 23) of the triple-layered composite-structure, as illustrated in FIGS. 5A and 5B, and the intermediate layer cuts and penetrates into the counterpart parent bump 11 by the pressure applied during crimping for bonding to establish solid-phase diffusion-bonded interfaces. Therefore, since the higher-hardness intermediate layer 22 establishes solid-phase diffusion-bonded interfaces by generating a deep trench with knife edge configuration, the portion to be deformed is small but the required contact areas with exposed clean surfaces are increased by the deep trenches generated between the parent bump 15 and the repair bump (21, 22, 23). Though the deformed amount of the whole bump becomes smaller than the conventional uniform-hardness jointing scheme, by making the structure of solid-phase diffusion junctions with knife-edge trenches, the area of clean metals required for solid-phase diffusion junction increases. With aide of the deep trenches generated, solid-phase diffusion bonding between the repair bump (21, 22, 23) and the parent bump 15 becomes possible even at low temperatures, because larger areas of new clean surfaces can be used.

In the jointing-element of the stacked semiconductor device according to the second modification of the first embodiment, since the weak crimping of the repair bump (21, 22, 23) and the parent bump 15 at a relatively small pressure can suppress the deformation of most portions of bumps other than the solid-phase diffusion bonding, after crimping with the weak force so as to execute the provisional connection and the electrical evaluation, if there is a defect, the defective onboard-components can be replaced to a new onboard-component so as to execute the next provisional connection again with less deformed configuration of the parent bump 15. It is possible to proceed to the non-provisional final-jointing process as the nonprovisional-assembling procedure, if the electrical evaluation passes a predetermined acceptable level, by the next, or a further next provisional-connection test with the temporal and weak re-connection condition. Furthermore, in the stacked semiconductor device according to the second modification, additional specific material may be added to the intermediate layer 22 which is a part of the repair bumps (24, 25, 26), so that the hardness of the processed-compound with the additional specific material changes to higher value than the bump metal at other portions, by the chemical reaction due to the crimping process. After crimping the metal of the repair bumps (24, 25, 26) to the parent bump 15, the generated higher-hardness compound will deform selectively the metal of the counterpart parent bump 15 by a large amount in a localized portion, or generate cracks selectively in limited areas in the metal of the counterpart parent bump 15.

On the other hand, after the confirmation process of the onboard-element, in a state where the parent bump 15 and the repair bump (21, 22, 23) is provisionally assembled or provisionally re-assembled, after the normal and proper operation of the onboard-element is confirmed, the force for pressing the onboard-component against the body is further increased, and the distance between the onboard-element and the mother-plate is further shortened. When the force for pressing the onboard-component against the body is further increased, the onboard-component and the body are finally and completely jointed. When completely joining the parent bump 15 and the repair bump (21, 22, 23), the vertical side wall portion of the parent bump 15 is further deformed by the pressing force, and the edge at lower side of the repair bump (21, 22, 23) is metallurgically bonded to the bottom of the parent bump 15. Since the distance between the motherplate and the onboard-element is compressed by the final pressing, the height of the jointing-element after the stage of the nonprovisional-assembling procedure becomes lower than the height of the original jointing-element at the stage of the provisional-connection, and the parent bump 15 and the repair bump (21, 22, 23) collapse in disorder and in fragments. Fragmental residues of the fragments of higherhardness conductors implementing the intermediate layer 22 in a disorderly collapsed state are unevenly distributed in the jointing-element along an indeterminate trace of a distorted box-like configuration. As a result, various fragments of conductors having different hardness are non-uniformly distributed in the intersections of the mother-site wall and the repair-site wall, which bite each other. And furthermore, the various fragments of conductors having different hardness are non-uniformly distributed in the space in the vicinity of the intersections.

After the nonprovisional-assembling procedure, because the repair bump (21, 22, 23) is metallurgically connected to the parent bump 15 through the surface interconnection buried in the multi-level interconnection insulation-layer, the onboard-circuit merged in the onboard-element is electrically connected to the mother-circuit of the body, through the surface interconnection buried in the field-insulating film. Therefore, electrically connecting the mother-circuit merged in the mother-plate and the onboard-circuits provided in the onboard-elements, by jointing-elements can build up the stacked semiconductor device according to the second modification of the first embodiment.

As described above, the stacked semiconductor device according to the second modification of the first embodiment can provide an assembling method for a stacked semiconductor devices which facilitate a highly-effective repair processing with the onboard-elements to be used in the stacked semiconductor device, in a case of screening the defective components, in which only the defective onboardelement is repaired from among the plurality of onboardelements mounted on the large-size mother-plate. As a result, the stacked semiconductor device according to the second modification of the first embodiment can minimize the manufacturing period of the various stacked semiconductor devices including the devices, in which a large number of onboard-elements are arranged in the large-size mother-plate, and can eliminate the wasteful loss of the body and the onboard-components which are normally operating, and increase the allowable number of the repair-process to prevent waste of resources.

Second Embodiment

Figure 10:
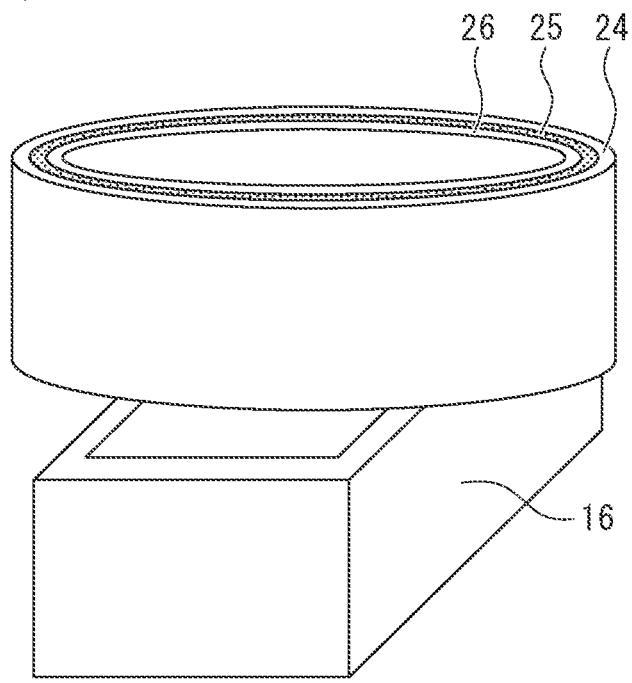
FIG. 10 is a schematic bird's-eye view for explaining the relation between the repair bumps and the parent bump of the stacked semiconductor device according to the second embodiment of the present invention.

As illustrated in FIG. 10, a stacked semiconductor device according to a second embodiment of the present invention has a stacked structure assembled by the substantially same body and the substantially same onboard-components as the structure of the stacked semiconductor device pertaining to the first embodiment, which has been illustrated in FIGS. 3A and 3B. As can be understood from FIGS. 3A and 3B, the structure of the body of the stacked semiconductor device according to the second embodiment is the same as FIGS. 3A and 3B, in that the body includes a mother-plate (not illustrated), a field-insulating film (not illustrated) provided on the mother-plate. And, as illustrated in FIG. 10, the body has a rectangular box-shaped parent bump 16 on the fieldinsulating film. On the other hand, each of the onboardcomponents encompasses an onboard-element (not illustrated), a multi-level interconnection insulation-layer (not illustrated) on the connection face of the onboard-element, and a repair bumps (24, 25, 26) having a cylindrical structure, the bottom of the repair bumps (24, 25, 26) can be assumed to be contacted to the bottom surface of the multi-level interconnection insulation-layer. However, the onboard-element may have a structure of discrete elements such as LED chips.

The parent bump 16 is a rectangular box having a contour of a mother-site wall perpendicular to the mounting-main surface of the mother plate. The bottom of the rectangular box of the parent bump 16 contacts with the surface interconnection buried in the field-insulating film, and the parent bump 16 is electrically connected to the mother-circuit integrated in the mother-plate. The repair bump (24, 25, 26) is electrically connected to the onboard-circuit, having a contour of a repair-site wall perpendicular to the connection face of the onboard-element. The repair bump (24, 25, 26) is electrically connected to the onboard-circuit merged in the onboard-element through the surface interconnection buried in the multi-level interconnection insulation-layer. As can be seen from FIG. 10, the mother-site wall and the repair-site wall intersect at quadruple intersections.

The repair bump (24, 25, 26) has a triple-layered composite-structure embracing a bottomed cylindrical outermost layer 24, a bottomed cylindrical intermediate layer 25, and a bottomed cylindrical innermost layer 26. The hardness of the intermediate layer 25 has a value higher than the hardness of the outermost layer 24 and the innermost layer 26. The hardness of the outermost layer 24 and the innermost layer 26 is similar to that of the parent bump 16. Therefore, the hardness of the intermediate layer 25 is higher than that of the parent bump 16. For example, when Au is used as the conductor of the outermost layer 24 and the innermost layer 26 of the parent bump 16 and the repair bumps (24, 25, 26), a high-hardness metallic material such as Co, Ni, Ir, Cr, W, Ti, or TiW can be employed as the conductor of the intermediate layer 25. Alternatively, alloys or mixtures such as Au—Co, Au—Ni, Au—Ir, Au—Cr, Au—W, Au—Ti, Au—Al$_2$O$_3$, Au—Si, or Au—Ge containing 70% or more of Au can be used as the conductor of the intermediate layer 25. A ternary alloy of Au, quaternary alloy of Au, or the like of two or more materials, selected from among Co, Ni, Ir, Cr, W, Ti, Si, Ge, or the like may be also used.

The Vickers hardness of Au-20Sn alloy containing 20% Sn is about 118 Hv, but the Vickers hardness of Au-90Sn alloy containing 90% Sn is about 16 Hv, so that attention should be paid to the mole-fraction of Au—Sn alloy. At the quadruple intersections of the mother-site wall and the repair-site wall where the parent bump 16 and the repair bumps (24, 25, 26) intersect, since the hardness of the intermediate layer 25 of the repair bumps (24, 25, 26) is higher than the hardness of the parent bump 16, the repair bumps (24, 25, 26) bites the parent bum bump 16 to establish solid-phase diffusion-bonded interfaces, such that a hard edge of the repair bump (24, 25, 26) cuts and penetrates into the interior of the parent bump 16. That is, the stacked semiconductor device according to the second embodiment has a structure in which either one of the parent bump 16 or the repair bumps (24, 25, 26) includes a conductor harder than the residual portion at the intersections of the mother-site wall and the repair-site wall. The parent bump 16 and the repair bumps (24, 25, 26) implement the jointing-element as one of the elements of the stacked semiconductor device according to the second embodiment.

In the jointing-element of the stacked semiconductor device according to the second embodiment, material having a hardness higher than the metallic material used in the parent bump 16 is put in the intermediate layer 25 of the structure of the bottomed cylindrical shaped repair bumps (24, 25, 26) of the triple-layered composite-structure, and due to the pressure applied during crimping for bonding, the parent bump 16 and the repair bump (21, 22, 23) bite each other, such that an edge of the intermediate layer 22 cuts and penetrates into the counterpart parent bump 16, and achieves solid-phase diffusion bonding. Therefore, since the higher-hardness intermediate layer 25 implements solid-phase diffusion-bonded interfaces by generating a deep trench with knife edge configuration, the portion to be deformed is small, but the required contact areas with exposed clean surfaces are increased by the deep trenches generated between the parent bump 16 and the repair bump (21, 22, 23). Though the deformed amount of the whole bump becomes smaller than the conventional uniform-hardness jointing scheme, by providing knife-edge trenches, the area of clean metals required for solid-phase diffusion junction increases. With aide of the deep trenches generated, solid-phase diffusion bonding between the repair bumps (24, 25, 26) and the parent bump 16 becomes possible even at low temperatures, because larger areas of new clean surfaces can be used.

In the jointing-element of the stacked semiconductor device according to the second embodiment, since the weak crimping process of the repair bump (21, 22, 23) and the parent bump 16 at a relatively small pressure can suppress the deformation of most portions of bumps other than the solid-phase diffusion bonding, after crimping with the weak force so as to execute the provisional connection and the electrical evaluation, if there is a defect, the defective onboard-components can be replaced to a new onboard-component so as to execute the next provisional connection again with less deformed configuration of the parent bump 16. It is possible to proceed to the non-provisional final-jointing process as the nonprovisional-assembling procedure, if the electrical evaluation passes a predetermined acceptable level, by the next, or a further next provisional-connection test with the temporal and weak re-connection condition. Furthermore, in the stacked semiconductor device according to the second embodiment, additional specific material may be added to the intermediate layer 25 which is a part of the repair bumps (24, 25, 26), so that the hardness of the processed-compound with the additional specific material changes to higher value than the bump metal at other portions, by the chemical reaction due to the crimping process. After crimping the metal of the repair bumps (24, 25, 26) to the parent bump 16, the generated higher-hardness compound will deform selectively the metal of the counter-part parent bump 16 by a large amount in a localized portion, or generate cracks selectively in limited areas in the metal of the counterpart parent bump 16. In the earlier technology of jointing the metals of the same or uniform hardness, both repair bumps and parent bumps are deformed by considerable amount, and are collapsed in a single provisional-connection. And therefore, because the exposed area of clean gold is not large by the conventional uniform-hardness scheme, and the repair bump will peel off immediately from the parent bump in the earlier technology schemes.

On the other hand, by making the hardness of the intermediate layer 25 of the repair bumps (24, 25, 26) higher than the other portions and reducing the thickness of the outer-most layer 24 and the innermost layer 26 of the repair bumps (24, 25, 26), the higher-hardness material cuts and penetrates into the counterpart sidewall like a knife, the exposed area is increased, and repair bump becomes difficult to peel off from the parent bump after provisional-connection with a smaller pressure crimping. Since repair bump becomes difficult to peel off from the parent bump after provisional-connection, it is possible to increase the number of repair-processes because the deformation of the parent bump is small and localized, and the increased number of the repair-processes achieves a significant effectiveness in the manu-facturing process of the stacked semiconductor device.

Then, after the normal and proper operation of the onboard-element in a state where the parent bump 16 and the repair bump (24, 25, 26) is provisionally assembled or provisionally re-assembled is confirmed, the force for pressing the onboard-component against the body is further increased, to further shorten the distance between the onboard-element and the mother-plate. When the force for pressing the onboard-component against the body is further increased, the onboard-component and the body are finally and completely jointed. When completely joining the parent bump 16 and the repair bumps (24, 25, 26), the vertical side wall portion of the parent bump 16 is further deformed by the pressing force, and the edge at lower side of the repair bumps (24, 25, 26) is metallurgically bonded to the bottom of the parent bump 16. Since the distance between the mother-plate and the onboard-element is compressed by the final pressing, the height of the jointing-element after the stage of the nonprovisional-assembling procedure becomes lower than the height of the original jointing-element at the stage of the provisional-connection, and the parent bump 16 and the repair bumps (24, 25, 26) collapse in disorder and in fragments. Fragmental residues of the fragments of higher-hardness conductors implementing the intermediate layer 25 in a disorderly collapsed state are unevenly distributed in the jointing-element along an indeterminate shape in a distorted bottomed cylindrical trace. As a result, various fragments of conductors having different hardness are non-uniformly distributed in the intersections of the mother-site wall and the repair-site wall, which engage each other. And furthermore, the various fragments of conductors having different hardness are non-uniformly distributed in the space in the vicinity of the intersections.

After the nonprovisional-assembling procedure, the repair bump (24, 25, 26) is metallurgically connected to the parent bump 16, and the mother-circuit merged in the mother-plate is electrically connected to the onboard-circuit merged in the onboard-element by jointing-elements, constructing the stacked semiconductor device according to the second embodiment. As described above, the stacked semiconductor device according to the second embodiment of the present invention enables manufacturing of the stacked semiconductor devices and onboard-elements to be used in the stacked semiconductor device with highly-efficient repair processing, in screening only defective onboard-element from among the plurality of onboard-elements mounted on a large-size mother-plate. As a result, the stacked semiconductor device according to the second embodiment can minimize the manufacturing period of the various stacked semiconductor devices including the devices, in which a large number of onboard-elements are arranged in the large-size mother-plate, and can eliminate the wasteful loss of the body and the onboard-components which are normally operating, and increase the allowable number of the repair-process to prevent waste of resources.

First Modification of the Second Embodiment

Figure 11:
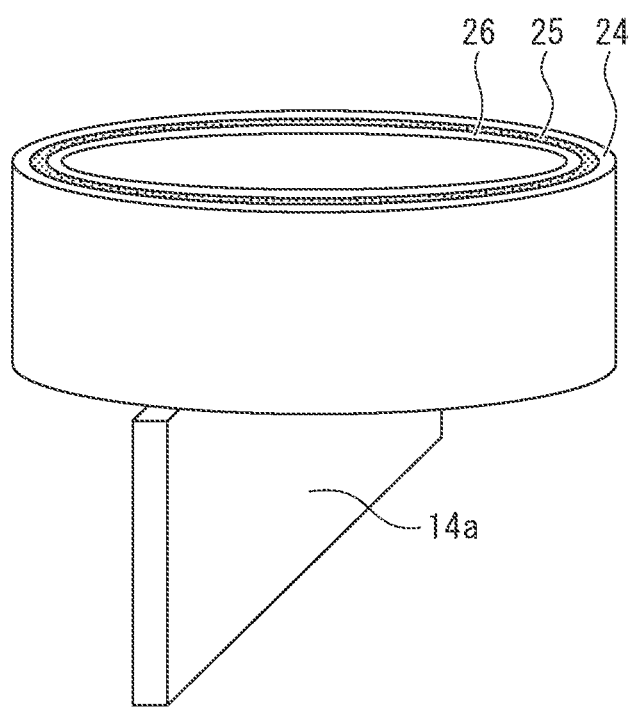
FIG. 11 is a schematic bird's-eye view for explaining the relation between the repair bumps and parent bump of the stacked semiconductor device according to the first modification of the second embodiment of the present invention.

As illustrated in FIG. 11, a stacked semiconductor device according to a first modification of the second embodiment of the present invention has a stacked structure assembled by the substantially same body and the substantially same onboard-components as the structure of the stacked semiconductor device pertaining to the first embodiment, which has been illustrated in FIGS. 3A and 3B. As can be understood from FIGS. 3A and 3B, the structure of the body of the stacked semiconductor device according to the first modification of the second embodiment is similar as the stacked semiconductor device according to the first modification of the first embodiment illustrated in FIG. 8 in that the body has a mother-plate (not illustrated), a field-insulating film (not illustrated) provided on the mother-plate, and the parallel plate-shaped parent bump 14a on the field-insulating film as illustrated in FIG. 11. On the other hand, each of the onboard-components include an onboard-element (not illustrated), a multi-level interconnection insulation-layer (not illustrated) on the connection face of the onboard-element, and a repair bumps (24, 25, 26) with the cylindrical structure disposed on the bottom surface of the multi-level interconnection insulation-layer. However, the configuration illustrated in FIG. 11 is a mere example, and the onboard-element may have a structure of discrete elements such as LED chips. Otherwise the configuration is similar to the stacked semiconductor device according to the second embodiment illustrated in FIG. 10.

As illustrated in FIG. 11, the parent bump 14a is a rectangular parallel plate defining the shape of a mother-site wall perpendicular to the mounting-main surface of the mother plate. The lower end surface of the rectangular parallel plate of the parent bump 14a is in contact with the surface interconnection buried in the field-insulating film and the parent bump 14a is electrically connected to the mother-circuit integrated in the mother-plate. The repair bump (24, 25, 26) is electrically connected to the onboard-circuit, having a contour of a repair-site wall perpendicular to the connection face of the onboard-element. The repair bump (24, 25, 26) is electrically connected to the onboard-circuit merged in the onboard-element through the surface interconnection buried in the multi-level interconnection insulation-layer. As can be seen from FIG. 11, the mother-site wall and the repair-site wall intersect at two intersections.

The repair bump (24, 25, 26) has a triple-layered composite-structure embracing a bottomed cylindrical outermost layer 24, a bottomed cylindrical intermediate layer 25, and a bottomed cylindrical innermost layer 26. The hardness of the intermediate layer 25 has a value higher than the hardness of the outermost layer 24 and the innermost layer 26. The hardness of the outermost layer 24 and the innermost layer 26 is similar to that of the parent bump 14a. Therefore, the hardness of the intermediate layer 25 is higher than that of the parent bump 14a. For example, as materials for the conductors of the parent bumps 14a and the repair bump (24, 25, 26), any combination of metals and alloys as described in the first embodiment can be used. The parent bump 14a and the repair bumps (24, 25, 26) implement the jointing-element as one of the elements of the stacked semiconductor device according to the first modification of the second embodiment.

In the jointing-element of the stacked semiconductor device according to the first modification of the second embodiment, because material having a hardness higher than the metallic material used in the parent bump 14a is put in the intermediate layer 25 of the structure of the bottomed cylindrical shaped repair bumps (24, 25, 26) of the triple-layered composite-structure, by applying pressure for crimping bonding, the intermediate layer cuts and penetrates into the counterpart parent bump 14a so as to achieve solid-phase diffusion bonding. Therefore, since the higher-hardness intermediate layer 25 implements solid-phase diffusion-bonded interfaces by generating a deep trench with knife edge configuration, the portion to be deformed is small, but the required contact areas with exposed clean surfaces are increased by the deep trenches generated between the parent bump 15 and the repair bump (21, 22, 23). Though the deformed amount of the whole bump becomes smaller than the conventional uniform-hardness jointing scheme, by providing knife-edge trenches, the area of clean metals required for solid-phase diffusion junction increases. With aide of the deep trenches generated, solid-phase diffusion bonding between the repair bumps (24, 25, 26) and the parent bump 14a becomes possible even at low temperatures, because larger areas of new clean surfaces can be used.

In the jointing-element of the stacked semiconductor device according to the first modification of the second embodiment, since the weak crimping process of the repair bumps (24, 25, 26) and the parent bump 14a at a relatively small pressure can suppress the deformation of most portions of bumps other than the solid-phase diffusion bonding, if a defect is found by the provisional connection and the electrical evaluation, the defective onboard-components can be replaced to a new onboard-component so as to execute the next provisional connection again with less deformed configuration of bumps. It is possible to proceed to the non-provisional final-jointing process, if the electrical evaluation achieves success by the next, or a further next provisional-connection test with the temporal and weak re-connection condition. Furthermore, in the stacked semiconductor device according to the first modification of the second embodiment, additional material may be added to the intermediate layer 25 which is a part of the repair bumps (24, 25, 26), so that the hardness of the compound becomes higher than the bump metal after the crimping process. After crimping the metal of the repair bumps (24, 25, 26) to the parent bump 14a, the generated higher-hardness compound will deform selectively the metal of the counterpart parent bump 14a by a large amount in a localized portion, or generate cracks selectively in limited areas in the metal of the counterpart parent bump 14a.

Then, after the normal and proper operation of the onboard-element in a state where the parent bump 14a and the repair bumps (24, 25, 26) is provisionally assembled or provisionally re-assembled is confirmed, the force for pressing the onboard-component against the body is further increased, and the distance between the onboard-element and the mother-plate is further shortened. When the force for pressing the onboard-component against the body is further increased, the onboard-component and the body are finally and completely jointed. During the non-provisional final-jointing process of the parent bump 14a and the repair bumps (24, 25, 26), the vertical side wall portion of the parent bump 14a is further deformed by the pressing force, and the edge at lower side of the repair bumps (24, 25, 26) is metallurgically bonded to the bottom of the parent bump 14a. Since the distance between the mother-plate and the onboard-element is compressed by the final pressing, the height of the jointing-element after the stage of the non-provisional final-jointing process becomes lower than the height of the original jointing-element at the previous stage of the provisional-connection, and the parent bump 14a and the repair bumps (24, 25, 26) collapse in disorder and in fragments. Fragmental residues of the fragments of higher-hardness conductors implementing the intermediate layer 25 in a disorderly collapsed state are unevenly distributed in the jointing-element along an indeterminate shape in a distorted bottomed cylindrical trace. As a result, various fragments of conductors having different hardness are non-uniformly distributed in the intersections of the mother-site wall and the repair-site wall, which engage each other. And furthermore, the various fragments of conductors having different hardness are non-uniformly distributed in the space in the vicinity of the intersections. Therefore, the mother-circuit merged in the mother-plate is electrically connected to the onboard-circuit merged in the onboard-element by jointing-elements, constructing the stacked semiconductor device according to the first modification of the second embodiment.

As described above, the stacked semiconductor device according to the first modification of the second embodiment of the present invention enables manufacturing of the stacked semiconductor devices with highly-efficient repair processing for screening the defective onboard-elements. As a result, the stacked semiconductor device according to the first modification of the second embodiment can minimize the manufacturing period of the various stacked semiconductor devices including the devices, in which a large number of onboard-elements are arranged in the large-size mother-plate, and can eliminate the wasteful loss of the body and the onboard-components which are normally operating, and increase the allowable number of the repair-process.

Second Modification of the Second Embodiment

Figure 12:
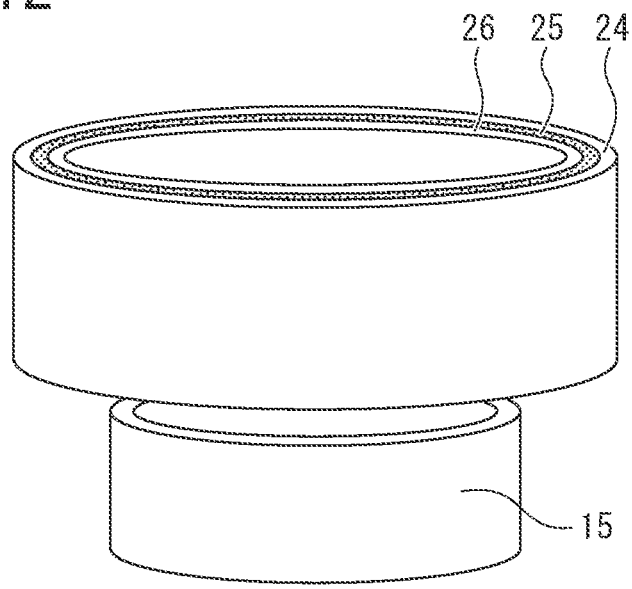
FIG. 12 is a schematic bird's-eye view for explaining the relation between the repair bumps and the parent bump of the stacked semiconductor device according to the second modification of the second embodiment of the present invention.

As illustrated in FIG. 12, a stacked semiconductor device according to a second modification of the second embodiment of the present invention has a stacked structure assembled by the substantially same body and the substantially same onboard-components as the structure of the stacked semiconductor device pertaining to the first embodiment, which has been illustrated in FIGS. 3A and 3B. As can be understood from FIGS. 3A and 3B, the structure of the body of the stacked semiconductor device according to the second modification of the second embodiment encompasses a mother-plate (not illustrated), and a field-insulating film (not illustrated) provided on the mother-plate, and a bottomed elliptic-cylindrical parent bump 15 provided on the field-insulating film. On the other hand, the onboard-component can assume a structure which includes an onboard-element (not illustrated), a multi-level interconnection insulation-layer (not illustrated) provided on the connection face of the onboard-element, and repair bumps (24, 25, 26) with a bottomed elliptic-cylindrical structure on the bottom surface of the multi-level interconnection insulation-layer. However, the onboard-element may have a structure of discrete elements, such as LED chips. The other features are the same as the stacked semiconductor device according to the second embodiment illustrated in FIG. 10. The plane pattern of the repair bumps (24, 25, 26) is preferably an ellipse having a major axis in a direction perpendicular to the major axis of the parent bump 15.

The parent bump 15 is a bottomed elliptic-cylindrical-shaped dish having a contour of a mother-site wall perpendicular to the mounting-main surface of the mother plate. The bottom-surface of the bottomed elliptic-cylindrical-shaped dish of the parent bump 15 is in contact with the surface interconnection buried in the field-insulating film, and the parent bump 15 is electrically connected to the mother-circuit integrated in the mother-plate. The repair bump (24, 25, 26) is electrically connected to the onboard-circuit having a contour of a repair-site wall perpendicular to the connection face of the onboard-element. The repair bump (24, 25, 26) is electrically connected to the onboard-circuit merged in the onboard-element through the surface interconnection buried in the multi-level interconnection insulation-layer. If the major axes of the repair bumps (24, 25, 26) and parent bump 15 are in a direction perpendicular to each other, the mother-site wall and the repair-site wall intersect at quadruple intersections. As can be seen from FIG. 12, even if the planar pattern of the repair bumps (24, 25, 26) is a shape close to a true circle, if the major axis of the parent bump 15 is longer than the diameter of the repair bumps (24, 25, 26), the mother-site wall and the repair-site wall can intersect at the quadruple intersections. Conversely, even if the planar pattern of the parent bump 15 is a shape close to a true circle, if the major axis of the repair bumps (24, 25, 26) is longer than the diameter of the parent bump 15, the mother-site wall and the repair-site wall can intersect at the quadruple intersections.

When a plurality of the onboard-components is deployed on the large-sized body, each of the repair bumps (24, 25, 26) have a triple-layered composite-structure embracing a bottomed elliptic-cylindrical outermost layer 24, a bottomed elliptic-cylindrical intermediate layer 25, and a bottomed elliptic-cylindrical innermost layer 26. The hardness of the intermediate layer 25 is higher than that of the outermost layer 24, the innermost layer 26, and the parent bump 15. For example, any combination of metals and alloys as described in the first embodiment may be used for the conductors of the outermost layer 24 and innermost layer 26 of the parent bump 15 and the repair bumps (24, 25, 26). The parent bump 15 and the repair bumps (24, 25, 26) implement the jointing-element as one of the elements of the stacked semiconductor device according to the second modification of the second embodiment.

In the jointing-element of the stacked semiconductor device according to the second modification of the second embodiment, metallic material having a higher hardness than the metallic material used for the parent bump 15 is put into the intermediate layer 25 of the structure of the bottomed elliptic-cylindrical repair bumps (24, 25, 26) of the triple-layered composite-structure, and an edge of the intermediate layer cuts and penetrates into the counterpart parent bump 15 by the pressure applied during crimping for bonding to establish solid-phase diffusion-bonded interfaces. Therefore, since the higher-hardness intermediate layer 25 implements solid-phase diffusion-bonded interfaces by generating a deep trench with knife edge configuration, the portion to be deformed is small, but the required contact areas with exposed clean surfaces are increased by the deep trenches generated between the parent bump 15 and the repair bump (21, 22, 23). Though the deformed amount of the whole bump becomes smaller than the conventional uniform-hardness jointing scheme, by providing knife-edge trenches, the area of clean metals required for solid-phase diffusion junction increases. With aide of the deep trenches generated, solid-phase diffusion bonding between the repair bumps (24, 25, 26) and the parent bump 15 becomes possible even at low temperatures, because larger areas of new clean surfaces can be used.

In the jointing-element of the stacked semiconductor device according to the second modification of the second embodiment, since the weak crimping process of the repair bumps (24, 25, 26) and the parent bump 15 at a relatively small pressure can suppress the deformation of most portions of bumps other than the solid-phase diffusion bonding, if a defect is found by the provisional connection and the electrical evaluation, the defective onboard-components can be replaced to a new onboard-component so as to execute the next provisional connection again with less deformed configuration of the parent bump 15. It is possible to proceed to the non-provisional final-jointing process, if the electrical evaluation achieves success by the next, or a further next provisional-connection test. Furthermore, in the stacked semiconductor device according to the second modification of the second embodiment, additional specific material may be mixed to the intermediate layer 25 which is a part of the repair bumps (24, 25, 26), so that the hardness of the processed-compound with the additional specific material changes to higher value than the bump metal at other portions, by the chemical reaction due to the crimping process. After crimping the metal of the repair bumps (24, 25, 26) to the parent bump 15, the generated higher-hardness compound will deform selectively the metal of the counterpart parent bump 15 by a large amount in a localized portion, or generate cracks selectively in limited areas in the metal of the counterpart parent bump 15.

Then, after the normal and proper operation of the onboard-element, in a state where the parent bump 15 and the repair bump (24, 25, 26) is provisionally assembled or provisionally re-assembled, is confirmed, the force for pressing the onboard-component against the body is further increased, and the distance between the onboard-element and the mother-plate is further shortened. When the force for pressing the onboard-component against the body is further increased, the onboard-component and the body are finally and completely jointed. When completely joining the parent bump 15 and the repair bumps (24, 25, 26), the vertical side wall portion of the parent bump 15 is further deformed by the pressing force, and the edge at lower side of the repair bumps (24, 25, 26) is metallurgically bonded to the bottom of the parent bump 15. Since the distance between the mother-plate and the onboard-element is compressed by the final pressing, the height of the jointing-element after the stage of the nonprovisional-jointing process becomes lower than the height of the original jointing-element at the stage of the provisional-connection, and the parent bump 15 and the repair bumps (24, 25, 26) collapse in disorder and in fragments. Fragmental residues of the fragments of higher-hardness conductors implementing the intermediate layer 25 in a disorderly collapsed state are unevenly distributed in the jointing-element along an indeterminate shape in a distorted bottomed elliptic-cylindrical trace. As a result, various fragments of conductors having different hardness are non-uniformly distributed in the vicinity of the intersections of the mother-site wall and the repair-site wall, which engage each other. Therefore, the mother-circuit merged in the mother-plate is electrically connected to the onboard-circuit merged in the onboard-element by jointing-elements, constructing the stacked semiconductor device according to the second modification of the second embodiment.

As described above, the stacked semiconductor device according to the second modification of the second embodiment of the present invention enables manufacturing of the stacked semiconductor devices with highly-efficient repair processing for selective screening of the defective onboard-element. As a result, the stacked semiconductor device according to the second modification of the second embodiment can minimize the manufacturing period of the various stacked semiconductor devices including the devices, in which a large number of onboard-elements are arranged in the large-size mother-plate. And, the stacked semiconductor device according to the second modification can eliminate the wasteful loss of the normal body and the normal onboard-elements, and thereby the stacked semiconductor device according to the second modification can increase the allowable number of the repair-process.

Third Embodiment

Figure 13:
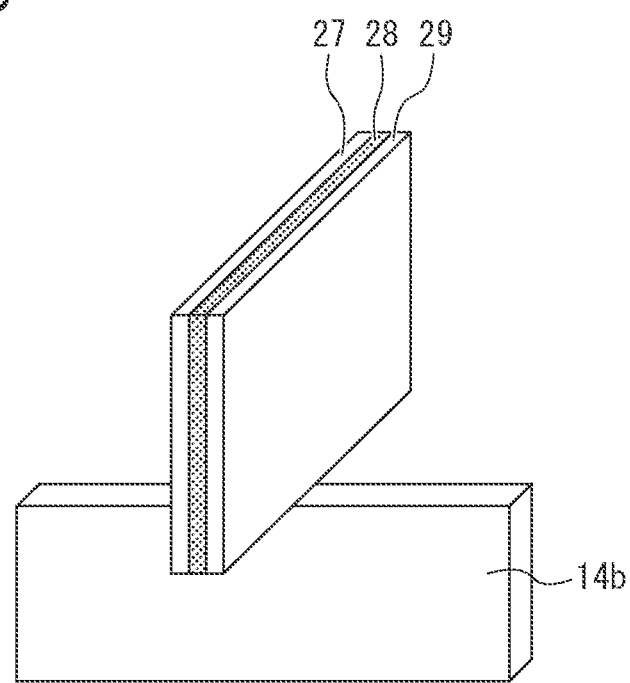
FIG. 13 is a schematic bird's-eye view for explaining the relation between the repair bumps and the parent bump of the stacked semiconductor device according to the third embodiment of the present invention.

As illustrated in FIG. 13, a stacked semiconductor device according to a third embodiment of the present invention has a stacked structure assembled by the substantially same body and the substantially same onboard-components as the structure of the stacked semiconductor device pertaining to the first embodiment, which has been illustrated in FIGS. 3A and 3B. As can be understood from FIGS. 3A and 3B, the structure of the body of the stacked semiconductor device according to the third embodiment encompasses a mother-plate (not illustrated), a field-insulating film (not illustrated) provided on the mother-plate, and a parallel plate-shaped parent bump 14b on the field-insulating film. On the other hand, each of the onboard-components encompasses an onboard-element (not illustrated), and a multi-level interconnection insulation-layer (not illustrated) provided on the bottom surface of the onboard-element, and a repair bump (27, 28, 29) with the parallel plate structure disposed on the bottom surface of the multi-level interconnection insulation-layer. However, each of the onboard-elements may have a structure of discrete elements such as LED chips. The main surface of the parallel plate-shaped repair bump (27, 28, 29) and the main surface of the parallel plate-shaped parent bump 14b are preferably in a relation perpendicular to each other.

The parent bump 14b has a mother-site wall perpendicular to the mounting-main surface of the mother plate. The lower end surface of the rectangular parallel plate of the parent bump 14b is in contact with the surface interconnection buried in the field-insulating film and the parent bump 14b is electrically connected to the mother-circuit integrated in the mother-plate. The repair bump (27, 28, 29) are electrically connected to the onboard-circuit, and has a repair-site wall perpendicular to the connection face of the onboardelement. The repair bump (27, 28, 29) are electrically connected to the onboard-circuit merged in the onboard-element through the surface interconnection buried in the multi-level interconnection insulation-layer. The repair bump (27, 28, 29) and the parent bump 14b, if they are in the relation in which their main surfaces intersect each other, the mother-site wall and the repair-site wall intersect at one intersection.

The repair bump (27, 28, 29) have a parallel plate-shaped triple-layered composite-structure, which embraces a first layer 27, a second layer 28, and a third layer 29. The second layer (intermediate layer) 28 has a hardness higher than the first layer 27 and the third layer 29, and the parent bump 14b. Any combination of metals and alloys as described in the first embodiment can be used for the conductor of the parent bump 14b and the repair bump (27, 28, 29). The parent bump 14b and the repair bump (27, 28, 29) implement the jointing-element as one of the elements of the stacked semiconductor device according to the third embodiment.

In the jointing-element of the stacked semiconductor device according to the third embodiment, metallic material having a higher hardness than the metallic material used for the parent bump 14b is put into the intermediate layer 28 of the structure of the repair bump (27, 28, 29) of the triple-layered composite-structure, and an edged of the intermediate layer 28 cuts and penetrates into the counterpart parent bump 14b by the pressure applied during crimping for bonding to establish solid-phase diffusion-bonded interfaces. Therefore, since the higher-hardness intermediate layer 28 implements solid-phase diffusion-bonded interfaces by generating a deep trench with knife edge configuration, the portion to be deformed is small, but the required contact areas with exposed clean surfaces are increased by the deep trenches generated between the parent bump 14b and the repair bump (27, 28, 29). Though the deformed amount of the whole bump becomes smaller than the conventional uniform-hardness jointing scheme, by providing knife-edge trenches, the area of clean metals required for solid-phase diffusion junction increases. With aide of the deep trenches generated, solid-phase diffusion bonding between the repair bump (27, 28, 29) and the parent bump 14b becomes possible even at low temperatures, because larger areas of new clean surfaces can be used.

In the jointing-element of the stacked semiconductor device according to the third embodiment, since the weak crimping process of the repair bump (27, 28, 29) and the parent bump 14b at a relatively small pressure can suppress the deformation of most portions of bumps other than the solid-phase diffusion bonding, if a defect is found by the provisional connection and the electrical evaluation, the defective onboard-components can be replaced to a new onboard-component so as to execute the next provisional connection again with less deformed configuration of the parent bump 14b. It is possible to proceed to the nonprovisional-jointing process, if the electrical evaluation attains success by the next, or a further next provisional-connection test. Furthermore, in the stacked semiconductor device according to the third embodiment, additional specific material may be mixed to the intermediate layer 28 which is a part of the repair bump (27, 28, 29), so that the hardness of the processed-compound with the additional specific material changes to higher value than the bump metal at other portions, by the chemical reaction due to the crimping process. After crimping the metal of the repair bumps (27, 28, 29) to the parent bump 14b, the generated higher-hardness compound will deform selectively the metal of the counterpart parent bump 14b by a large amount in a localized portion, or generate cracks selectively in limited areas in the metal of the counterpart parent bump 14b. In the earlier technology of jointing the metals of the same or uniform hardness, both repair bumps and parent bumps are deformed by considerable amount, and are collapsed in a single provisional-connection. Because the exposed area of clean metal is not large by the earlier uniform-hardness scheme, and the repair bump peels off immediately in the earlier technology schemes. On the other hand, by making the hardness of the intermediate layer (second layer) 28 of the repair bump (27, 28, 29) higher than the other portions and reducing the thickness of the first layer 27 and the third layer 29 of the repair bump (27, 28, 29), an edge of the higher-hardness material cuts and penetrates into the counterpart side wall like a knife, the exposed area is increased, and it becomes difficult to peel off the repair bump (27, 28, 29) from the parent bump 14b, after provisional-connection. Since the repair bump (27, 28, 29) becomes difficult to peel off from the parent bump 14b after provisional-connection with a smaller pressure crimping, it is possible to increase the number of repair-processes because the deformation of the parent bump is small and localized, and the increased number of the repair-processes achieves a significant effectiveness in the manufacturing process of the stacked semiconductor device.

Then, after the normal and proper operation of the onboard-element in a state where the parent bump 14b and the repair bump (27, 28, 29) are provisionally assembled is confirmed, the force for pressing the onboard-component against the body is further increased, and the distance between the onboard-element and the mother-plate is further shortened. When the force for pressing the onboard-component against the body is further increased, the onboard-component and the body are finally and completely jointed. At the time of the nonprovisional-jointing process of the parent bump 14b and the repair bump (27, 28, 29), the vertical side wall portion of the parent bump 14b is further deformed by the pressing force, and the edge at lower side of the repair bump (27, 28, 29) is metallurgically jointed to the bottom side of the parent bump 14b.

Since the distance between the mother-plate and the onboard-element is compressed by the final pressing, the height of the jointing-element after the stage of the nonprovisional-jointing process becomes lower than the height of the original jointing-element at the stage of the provisional-connection, and the parent bump 14b and the repair bump (27, 28, 29) collapse in disorder and in fragments. Fragmental residues of the fragments of higher-hardness conductors implementing the intermediate layer 28 in a disorderly collapsed state are unevenly distributed in the jointing-element along an indeterminate shape in a distorted plate-like trace. As a result, various fragments of conductors having different hardness are non-uniformly distributed in the vicinity of the intersections of the mother-site wall and the repair-site wall, which engage each other. Therefore, electrically connecting the mother-circuit merged in the mother-plate and the onboard-circuit merged in the onboard-element by the jointing-elements can build up the stacked semiconductor device according to the third embodiment.

The stacked semiconductor device according to the third embodiment of the present invention as described above can provide a stacked semiconductor device and onboard-element or the like with highly-efficient repair processing for screening selectively the defective onboard-elements. As a result, the stacked semiconductor device according to the third embodiment can minimize the manufacturing period of the various stacked semiconductor devices including the devices, in which a large number of onboard-elements are arranged in the large-size mother-plate, and can eliminate the wasteful loss of the normal body and the normal onboard-elements, and increase the allowable number of the repair-process.

First Modification of the Third Embodiment

Figure 14:
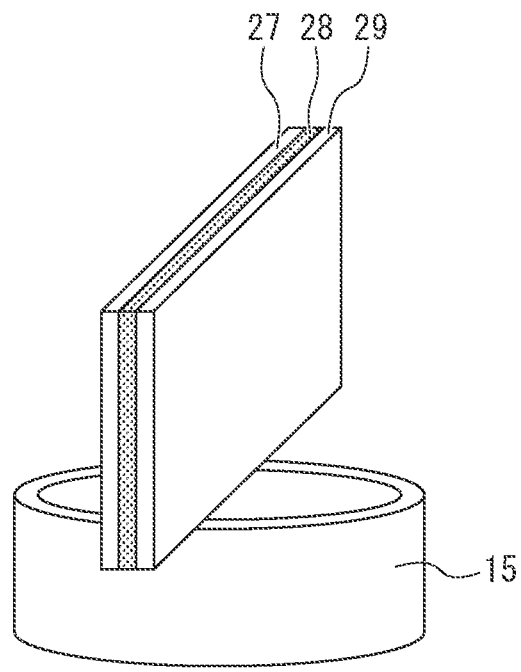
FIG. 14 is a schematic bird's-eye view for explaining the relation between the repair bumps and the parent bump of the stacked semiconductor device according to the first modification of the third embodiment of the present invention.

As illustrated in FIG. 14, a stacked semiconductor device according to a first modification of the third embodiment of the present invention has a stacked structure assembled by the substantially same body and the substantially same onboard-components as the structure of the stacked semiconductor device pertaining to the first embodiment, which has been illustrated in FIGS. 3A and 3B. As can be understood from FIGS. 3A and 3B, the structure of the body of the stacked semiconductor device according to the first modification of the third embodiment encompasses a mother-plate (not illustrated), a field-insulating film (not illustrated) provided on the mother-plate, and a bottomed cylindrical parent bump 15 on the field-insulating film. On the other hand, for example, a structure of each of the onboard-components encompasses an onboard-element (not illustrated), a multi-level interconnection insulation-layer (not illustrated) provided on the bottom surface of the onboard-element, and a repair bump (27, 28, 29) with the parallel plate structure disposed on the bottom surface of the multi-level interconnection insulation-layer. However, the onboard-element may have a structure of discrete elements such as LED chips.

The parent bump 15 is a bottomed cylindrical dish having a contour of a mother-site wall perpendicular to the mounting-main surface of the mother plate. The parent bump 15 contacts the bottom-surface of the bottomed cylindrical dish to the surface interconnection buried in the field-insulating film, and is electrically connected to the mother-circuit integrated in the mother-plate. The repair bump (27, 28, 29) are electrically connected to the onboard-circuit, having a contour of a repair-site wall perpendicular to the connection face of the onboard-element. The repair bump (27, 28, 29) are electrically connected to the onboard-circuit merged in the onboard-element through the surface interconnection buried in the multi-level interconnection insulation-layer. The bottom edge of the repair bump (27, 28, 29) and the top edge of the parent bump 15 intersect at two intersections as illustrated in FIG. 14.

The repair bump (27, 28, 29) have a triple-layered composite-structure embracing a first layer 27, a second layer 28, and a third layer 29, which implement a parallel plate structure in the same manner as the topology illustrated in FIG. 13. The second layer (intermediate layer) 28 has a hardness higher than the first layer 27 and the third layer 29, and the parent bump 15. For the conductor of the parent bump 15 and the repair bump (27, 28, 29), any combination of metals and alloys as described in the first embodiment can be used. The parent bump 15 and the repair bump (27, 28, 29) implement the jointing-element as one of the elements of the stacked semiconductor device according to the first modification of the third embodiment.

In the jointing-element of the stacked semiconductor device according to the first modification of the third embodiment, because material having a hardness higher than the metallic material used for the parent bump 15 is put into the intermediate layer 28 of the structure of the parallel-plate-shaped repair bump (27, 28, 29) of the triple-layered composite-structure, an edge of the intermediate layer 28 cuts and penetrates into the counterpart parent bump 15 by the pressure applied during crimping for bonding to establish solid-phase diffusion-bonded interfaces. Therefore, since the higher-hardness intermediate layer 28 implements solid-phase diffusion-bonded interfaces by generating a deep trench with knife edge configuration, the portion to be deformed is small, but the required contact areas with exposed clean surfaces are increased by the deep trenches generated between the parent bump 15 and the repair bump (21, 22, 23). Though the deformed amount of the whole bump becomes smaller than the conventional uniform-hardness jointing scheme, by providing knife-edge trenches, the area of clean metals required for solid-phase diffusion junction increases. With aide of the deep trenches generated, solid-phase diffusion bonding between the repair bump (27, 28, 29) and the parent bump 15 becomes possible even at low temperatures, because larger areas of new clean surfaces can be used.

In the jointing-element of the stacked semiconductor device according to the first modification of the third embodiment, since the weak crimping process of the repair bump (27, 28, 29) and the parent bump 15 at a relatively small pressure can suppress the deformation of most portions of bumps other than the solid-phase diffusion bonding, if a defect is found by the provisional connection and the electrical evaluation, the defective onboard-components can be replaced to a new onboard-component so as to execute the next provisional connection again with less deformed configuration of the parent bump 15. It is possible to proceed to the nonprovisional-jointing process, if the electrical evaluation attains success by the next, or a further next provisional-connection test. Furthermore, in the stacked semiconductor device according to the first modification of the third embodiment, additional specific material may be mixed to the intermediate layer 28 which is a part of the repair bump (27, 28, 29), so that the hardness of the processed-compound with the additional specific material changes to higher value than the bump metal at other portions, by the chemical reaction due to the crimping process. After crimping the metal of the repair bumps (27, 28, 29) to the parent bump 15, the generated higher-hardness compound will deform selectively the metal of the counterpart parent bump 15 by a large amount in a localized portion, or generate cracks selectively in limited areas in the metal of the counterpart parent bump 15.

Then, after the normal and proper operation of the onboard-element, in a state where the parent bump 15 and the repair bump (27, 28, 29) are provisionally assembled or provisionally re-assembled, is confirmed, the force for pressing the onboard-component against the body is further increased, and the distance between the onboard-element and the mother-plate is further shortened. When the force for pressing the onboard-component against the body is further increased, the onboard-component and the body are finally and completely jointed. During the connection of the parent bump 15 and the repair bump (27, 28, 29), the vertical side wall portion of the parent bump 15 is further deformed by the pressing force, and the edge at lower side of the repair bump (27, 28, 29) is metallurgically jointed to the lower end portion side of the parent bump 15. Since the distance between the mother-plate and the onboard-element is compressed by the final pressing, the height of the jointing-element after the stage of the nonprovisional-jointing process becomes lower than the height of the original jointing-element at the stage of the provisional-connection, and the parent bump 15 and the repair bump (27, 28, 29) collapse in disorder and in fragments. Fragmental residues of the fragments of higher-hardness conductors implementing the intermediate layer 28 in a disorderly collapsed state are unevenly distributed in the jointing-element along an indeterminate shape in a distorted plate-like trace. As a result, various fragments of conductors having different hardness are non-uniformly distributed in the vicinity of the intersections of the mother-site wall and the repair-site wall, which engage each other with each other. Therefore, electrically connecting the mother-circuit merged in the mother-plate and the onboard-circuit merged in the onboard-element by the jointing-elements can build up the stacked semiconductor device according to the first modification of the third embodiment.

The stacked semiconductor device according to the first modification of the third embodiment of the present invention as described above can provide a stacked semiconductor device and a set of onboard-elements prepared for the stacked semiconductor device or the like, which achieve an effectiveness with highly-efficient repair processing for screening defective onboard-elements. As a result, the stacked semiconductor device according to the first modification of the third embodiment can minimize the manufacturing period of the various stacked semiconductor devices including the devices, in which a large number of onboard-elements are arranged in the large-size mother-plate, and can eliminate the wasteful loss of the normal body and the normal onboard-elements, and increase the allowable number of the repair-process.

Second Modification of the Third Embodiment

Figure 15:
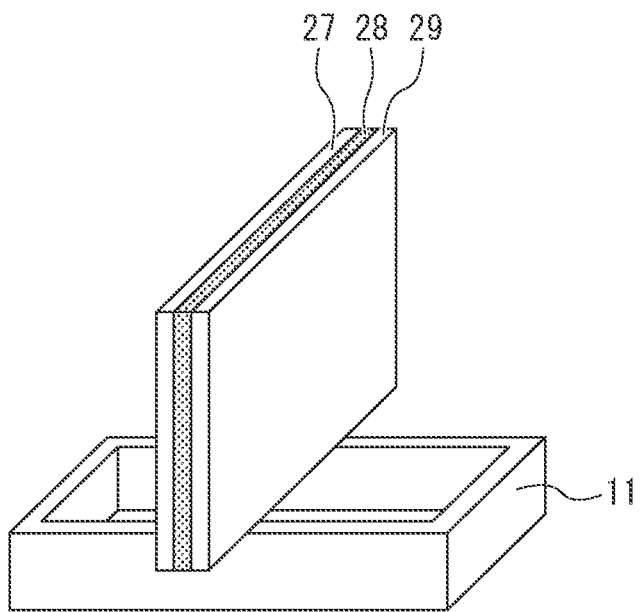
FIG. 15 is a schematic bird's-eye view for explaining the relation between the repair bumps and the parent bump of the stacked semiconductor device according to the second modification of the third embodiment of the present invention.

As illustrated in FIG. 15, a stacked semiconductor device according to a second modification of the third embodiment of the present invention has a stacked structure assembled by the substantially same body and the substantially same onboard-components as the structure of the stacked semiconductor device pertaining to the first embodiment, which has been illustrated in FIGS. 3A and 3B. As can be understood from FIGS. 3A and 3B, the structure of the body of the stacked semiconductor device according to the second modification of the third embodiment encompasses a mother-plate (not illustrated) and a field-insulating film (not illustrated) provided on the mother-plate, and a rectangular box-shaped parent bump 11 on the field-insulating film. On the other hand, each of the onboard-components encompasses an onboard-element (not illustrated), a multi-level interconnection insulation-layer (not illustrated) provided on the bottom surface of the onboard-element, and repair bump (27, 28, 29) with the parallel plate structure on the bottom surface of the multi-level interconnection insulation-layer. However, the onboard-element may have a structure of discrete elements such as LED chips.

The parent bump 11 is a rectangular box-shaped dish having a contour of a mother-site wall perpendicular to the mounting-main surface of the mother plate. The parent bump 11 contacts the bottom of the box-shaped dish to the surface interconnection buried in the field-insulating film, and is electrically connected to the mother-circuit integrated in the mother-plate. The repair bump (27, 28, 29) are electrically connected to the onboard-circuit having a contour of a repair-site wall perpendicular to the connection face of the onboard-element. The repair bump (27, 28, 29) are electrically connected to the onboard-circuit merged in the onboard-element through the surface interconnection buried in the multi-level interconnection insulation-layer. The bottom edge of the repair bump (27, 28, 29) and the top edge of the parent bump 11 intersect at two intersections as illustrated in FIG. 15.

The repair bump (27, 28, 29) have a triple-layered composite-structure embracing a first layer 27, a second layer 28, and a third layer 29, which implements a parallel plate structure in the same manner as the topology illustrated in FIG. 13. The second layer (intermediate layer) 28 has a hardness higher than the first layer 27 and the third layer 29, and the parent bump 11. A combination of metallic material or alloy as described in the first embodiment can be used as a conductor of parent bump 11 and repair bumps 27, 28, and 29. The parent bump 11 and the repair bump (27, 28, 29) implement the jointing-element as one of the elements of the stacked semiconductor device according to the second modification of the third embodiment.

In the jointing-element of the stacked semiconductor device according to the second modification of the third embodiment, because material having a hardness higher than the metallic material used for the parent bump 11 is put into the intermediate layer 28 of the structure of the parallel-plate-shaped repair bump (27, 28, 29) of the triple-layered composite-structure, an edge of the intermediate layer 28 cuts and penetrates into the counterpart parent bump 11 by the pressure applied during crimping for bonding to establish solid-phase diffusion-bonded interfaces. Therefore, since the higher-hardness intermediate layer 28 implements solid-phase diffusion-bonded interfaces by generating a deep trench with knife edge configuration, the portion to be deformed is small, but the required contact areas with exposed clean surfaces are increased by the deep trenches generated between the parent bump 11 and the repair bump (27, 28, 29). Though the deformed amount of the whole bump becomes smaller than the conventional uniform-hardness jointing scheme, by providing knife-edge trenches, the area of clean metals required for solid-phase diffusion junction increases. With aide of the deep trenches generated, solid-phase diffusion bonding between the repair bump (27, 28, 29) and the parent bump 11 becomes possible even at low temperatures, because larger areas of new clean surfaces can be used.

In the jointing-element of the stacked semiconductor device according to the second modification of the third embodiment, since the weak crimping process of the repair bump (27, 28, 29) and the parent bump 11 at a relatively small pressure can suppress the deformation of most portions of bumps other than the solid-phase diffusion bonding, if a defect is found by the provisional connection and the electrical evaluation, the defective onboard-components can be replaced to a new onboard-component so as to execute the next provisional connection again with less deformed configuration of bumps. It is possible to proceed to the nonprovisional-jointing process, if the electrical evaluation wins success by the next, or a further next provisional-connection test. Furthermore, in the stacked semiconductor device according to the second modification of the third embodiment, additional specific material may be mixed to the intermediate layer 28 which is a part of the repair bump (27, 28, 29), so that the hardness of the processed-compound with the additional specific material changes to higher value than the bump metal at other portions, by the chemical reaction due to the crimping process. After crimping the metal of the repair bump (27, 28, 29) to the parent bump 11, the generated higher-hardness compound will deform selectively the metal of the counterpart parent bump 11 by a large amount in a localized portion, or generate cracks selectively in limited areas in the metal of the counterpart parent bump 11.

Then, after the normal and proper operation of the onboard-element, in a state where the parent bump 11 and the repair bump (27, 28, 29) are provisionally assembled or provisionally re-assembled, is confirmed, the force for pressing the onboard-component against the body is further increased, and the distance between the onboard-element and the mother-plate is further shortened. When the force for pressing the onboard-component against the body is further increased, the onboard-component and the body are finally and completely jointed. During the connection of the parent bump 11 and the repair bump (27, 28, 29), the vertical side wall portion of the parent bump 11 is further deformed by the pressing force, and the edge at lower side of the repair bump (27, 28, 29) is metallurgically jointed to the lower end portion side of the parent bump 11. Since the distance between the mother-plate and the onboard-element is compressed by the final pressing, the height of the jointing-element after the stage of the nonprovisional-jointing process becomes lower than the height of the original jointing-element at the stage of the provisional-connection, and the parent bump 11 and the repair bump (27, 28, 29) collapse in disorder and in fragments. Fragmental residues of the fragments of higher-hardness conductors implementing the intermediate layer 28 in a disorderly collapsed state are unevenly distributed in the jointing-element along an indeterminate shape in a distorted plate-like trace. As a result, various fragments of conductors having different hardness are non-uniformly distributed in the intersections of the mother-site wall and the repair-site wall, which engage each other. And furthermore, the various fragments of conductors having different hardness are non-uniformly distributed in the space in the vicinity of the intersections. Therefore, electrically connecting the mother-circuit merged in the mother-plate and the onboard-circuit merged in the onboard-element by the jointing-elements can build up the stacked semiconductor device according to the second modification of the third embodiment.

The stacked semiconductor device according to the first modification of the third embodiment of the present invention as described above can provide a stacked semiconductor device and a set of onboard-elements prepared for the stacked semiconductor device or the like, which achieve an effectiveness with highly-efficient repair processing for screening defective onboard-elements. As a result, the stacked semiconductor device according to the second modification of the third embodiment can minimize the manufacturing period of the various stacked semiconductor devices including the devices, in which a large number of onboard-elements are arranged in the large-size mother-plate, and can eliminate the wasteful loss of the normal body and the normal onboard-elements, and increase the allowable number of the repair-process.

Fourth Embodiment

Figure 16:
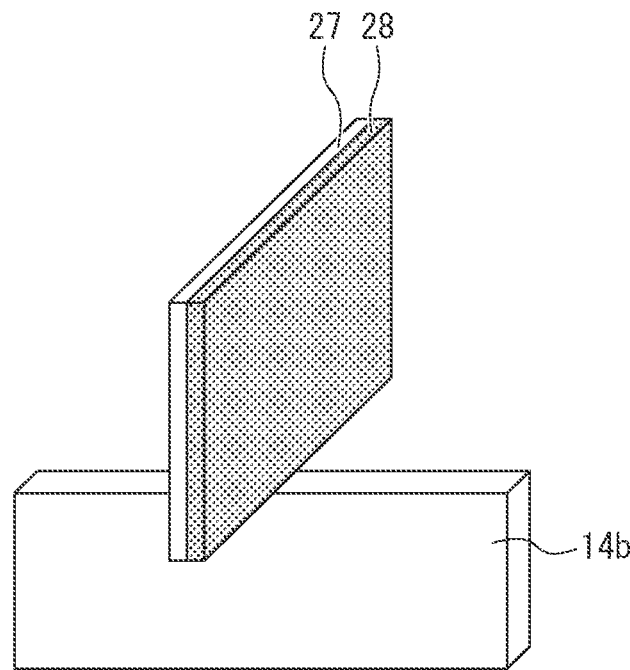
FIG. 16 is a schematic bird's-eye view for explaining the relation between the repair bumps and the parent bump of the stacked semiconductor device according to the fourth embodiment of the present invention.

As illustrated in FIG. 16, a stacked semiconductor device according to a fourth embodiment of the present invention has a stacked structure assembled by the substantially same body and the substantially same onboard-components as the structure of the stacked semiconductor device pertaining to the first embodiment, which has been illustrated in FIGS. 3A and 3B. As can be understood from FIGS. 3A and 3B, the structure of the body of the stacked semiconductor device according to the fourth embodiment encompasses a mother-plate (not illustrated), a field-insulating film (not illustrated) provided on the mother-plate, and a parallel plate-shaped parent bump 14b on the field-insulating film. On the other hand, each of the onboard-components encompasses an onboard-element (not illustrated), a multi-level interconnection insulation-layer (not illustrated) provided on the bottom surface of the onboard-element, and a repair bump (27, 28) having a parallel plate structure on the bottom surface of the multi-level interconnection insulation-layer. However, the onboard-element may have a structure of discrete elements such as LED chips. The main surface of the parallel plate-shaped repair bumps (27, 28) and the main surface of the parallel plate-shaped parent bump 14b are preferably perpendicular to each other.

The parent bump 14b is a parallel plate defining the shape of a mother-site wall, the main plane of the parallel plate is perpendicular to the mounting-main surface of the mother plate. The lower end surface of the rectangular parallel plate of the parent bump 14b is in contact with the surface interconnection buried in the field-insulating film and the parent bump 14b is electrically connected to the mother-circuit integrated in the mother-plate. When a plurality of the onboard-components is deployed on the large-sized body, each of the repair bumps (27, 28) are electrically connected to the onboard-circuit having a repair-site wall defining a parallel plate shape, the main plane of the parallel plate is perpendicular to the connection face of the onboard-element. When a plurality of the onboard-components is deployed on the large-sized body, each of the repair bumps (27, 28) are electrically connected to the onboard-circuit merged in the onboard-element through the surface interconnection buried in the multi-level interconnection insulation-layer. When a plurality of the onboard-components is deployed on the large-sized body, each of the repair bumps (27, 28) and the parent bump 14b, if they are in a relation in which the main surface intersects each other, the mother-site wall and the repair-site wall intersect at a single intersection.

When a plurality of the onboard-components is deployed on the large-sized body, each of the repair bumps (27, 28) has a double-layered composite-structure embracing a slab-shaped lower-hardness layer (first hardness layer) 27 and a slab-shaped higher-hardness layer (second hardness layer) 28. The higher-hardness layer 28 has a hardness higher than the lower-hardness layer 27 and the parent bump 14b. For the conductor of the parent bump 14b and the repair bumps (27, 28), any combination of metals and alloys as described in the first embodiment can be used. The parent bump 14b and the repair bumps (27, 28) implement the jointing-element as one of the elements of the stacked semiconductor device according to the fourth embodiment.

In the jointing-element of the stacked semiconductor device according to the fourth embodiment, because material having a hardness higher than the metallic material used for the parent bump 14b is put into the higher-hardness layer 28 of the structure of the parallel-plate-shaped repair bumps (27, 28) of the double-layered composite-structure, and an edge of the higher-hardness layer cuts and penetrates into the counterpart parent bump 14b by the pressure applied during crimping for bonding to establish solid-phase diffusion-bonded interfaces. Therefore, since the relatively hard higher-hardness layer 28 cuts a deep trench with a configuration of a knife edge, to establish solid-phase diffusion-bonded interfaces, the portion to be deformed is small, but the clean surfaces to be contacted mutually can be increased. Though the deformed amount of the whole bump becomes smaller than the conventional uniform-hardness jointing scheme, by providing knife-edge trenches, the area of clean metals required for solid-phase diffusion junction increases. As the area of clean metals increases by the knife-edge trenches, the solid-phase diffusion bonding between the repair bump (27, 28) and the parent bump 14b become possible even at low temperatures, because larger areas of new clean surfaces can be used.

In the jointing-element of the stacked semiconductor device according to the fourth embodiment, since the weak crimping process of the repair bumps (27, 28) and the parent bump 14b at a relatively small pressure can suppress the deformation of most portions of bumps other than the solid-phase diffusion bonding, if a defect is found by the provisional connection and the electrical evaluation, the defective onboard-components can be replaced to a new onboard-component so as to execute the next provisional connection again with less deformed configuration of the parent bump 14b. It is possible to proceed to the nonprovisional-jointing process, if the electrical evaluation becomes successful by the next, or a further next provisional-connection test. Furthermore, in the stacked semiconductor device according to the fourth embodiment, additional material such that the hardness of the compound becomes higher than the bump metal may be added to the higher-hardness layer 28 which is a part of the repair bump (27, 28). After crimping the metal of the repair bump (27, 28) to the parent bump 14b, the generated higher-hardness compound will deform selectively the metal of the counterpart parent bump 14b by a large amount in a localized portion, or generate cracks selectively in limited areas in the metal of the counterpart parent bump 14b. In the earlier technology of jointing the metals of the same or uniform hardness, both repair bumps and parent bumps are deformed by considerable amount, and are collapsed in a single provisional-connection. Therefore, the exposed area of clean gold is not large by the earlier uniform-hardness scheme, and repair bumps peel off immediately in the earlier technology schemes. On the other hand, by making the hardness of the higher-hardness layer 28 of the repair bump (27, 28) higher than the other portions and reducing the thickness of the lower-hardness layer 27 of the repair bump (27, 28), an edge of the higher-hardness material cuts into the counterpart sidewall like a knife, the exposed area is increased, it becomes difficult to peel off after provisional-connection. Since the repair bump (27, 28) becomes difficult to peel off from the parent bump 14b, after provisional-connection with a smaller pressure crimping, it is possible to increase the number of repair-processes because the deformation of the parent bump 14b is small and localized, and the increased number of the repair-processes achieves a significant effectiveness in the manufacturing process of the stacked semiconductor device.

Then, after the normal and proper operation of the onboard-element is confirmed by the provisional-connection of the parent bump 14b and the repair bump (27, 28), the force for pressing the onboard-component against the body is increased so as to shorten the distance between the onboard-element and the mother-plate. As the force for pressing the onboard-component against the body is further increased, the onboard-component and the body are finally and completely jointed. At the time of the nonprovisional-jointing process of the parent bump 14b and the repair bump (27, 28), the vertical side wall portion of the parent bump 14b is further deformed by the pressing force, and the edge at lower side of the repair bump (27, 28) is metallurgically jointed to the bottom side of the parent bump 14b. Since the distance between the mother-plate and the onboard-element is compressed by the final pressing, the height of the jointing-element after the stage of the nonprovisional-jointing process becomes lower than the height of the original jointing-element at the stage of the provisional-connection, and the parent bump 14b and the repair bump (27, 28) collapse in disorder and in fragments. Fragmental residues of the fragments of higher-hardness conductors implementing the higher-hardness layer 28 in a disorderly collapsed state are unevenly distributed in the jointing-element along an indeterminate shape in a distorted plate-like trace. As a result, various fragments of conductors having different hardness are non-uniformly distributed in the vicinity of the intersections of the mother-site wall and the repair-site wall, which engage each other. Therefore, electrically connecting the mother-circuit merged in the mother-plate and the onboard-circuit merged in the onboard-element by the jointing-elements can build up the stacked semiconductor device according to the fourth embodiment.

The stacked semiconductor device according to the fourth embodiment of the present invention as described above can provide a stacked semiconductor device and a set of onboard-elements prepared for the stacked semiconductor device or the like, which achieve an effectiveness with highly-efficient repair processing for screening defective onboard-elements. As a result, the stacked semiconductor device according to the fourth embodiment can minimize the manufacturing period of the various stacked semiconductor devices, can eliminate the wasteful loss of the normal body and the normal onboard-elements, and can increase the allowable number of the repair-process.

First Modification of the Fourth Embodiment

Figure 17:
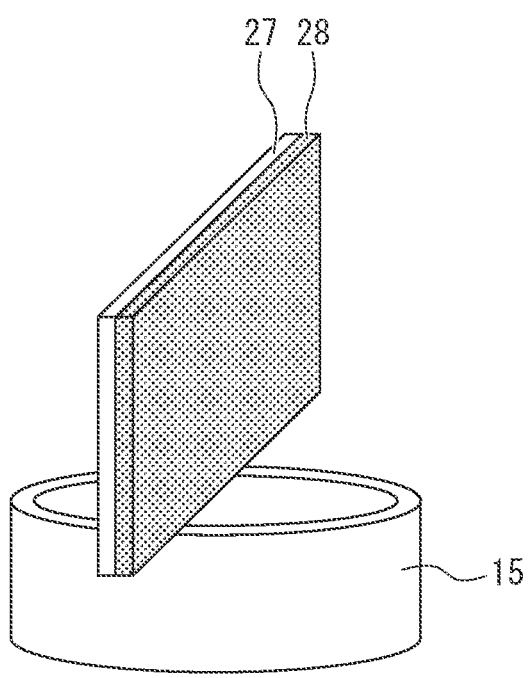
FIG. 17 is a schematic bird's-eye view for explaining the relation between the repair bumps and the parent bump of the stacked semiconductor device according to the first modification of the fourth embodiment of the present invention.

As illustrated in FIG. 17, a stacked semiconductor device according to a first modification of the fourth embodiment of the present invention has a stacked structure assembled by the substantially same body and the substantially same onboard-components as the structure of the stacked semiconductor device pertaining to the first embodiment, which has been illustrated in FIGS. 3A and 3B. As can be understood from FIGS. 3A and 3B, the structure of the body of the stacked semiconductor device according to the first modification of the fourth embodiment encompasses a mother-plate (not illustrated), a field-insulating film (not illustrated) provided on the mother-plate, and a bottomed cylinder-shaped parent bump 15 on the field-insulating film. On the other hand, each of the onboard-components encompasses an onboard-element (not illustrated), a multi-level interconnection insulation-layer (not illustrated) provided on the bottom surface of the onboard-element, and a repair bump (27, 28) with the parallel plate structure, which is disposed on the bottom surface of the multi-level interconnection insulation-layer. However, the onboard-element may have a structure of discrete elements such as LED chips.

The parent bump 15 is a bottomed cylindrical dish having a contour of a mother-site wall perpendicular to the mounting-main surface of the mother plate. The parent bump 15 is electrically connected to the mother-circuit integrated in the mother-plate, by contacting the bottom-surface of the bottomed cylindrical dish to the surface interconnection buried in the field-insulating film. When a plurality of the onboard-components is deployed on the large-sized body, each of the repair bumps (27, 28) has a repair-site wall perpendicular to the connection face of the onboard-element, and is electrically connected to the onboard-circuit merged in the corresponding onboard-element through the surface interconnection buried in the multi-level interconnection insulation-layer, respectively. The bottom edge of the repair bump (27, 28) and the top edge of the parent bump 15 intersect at two points as illustrated in FIG. 17.

In the array of onboard-components, each of the repair bumps (27, 28) has a double-layered composite-structure embracing a parallel plate-shaped lower-hardness layer (first hardness layer) 27 and a higher-hardness layer (second hardness layer) 28 in the same manner as the topology illustrated in FIG. 16. The higher-hardness layer 28 has a hardness higher than the lower-hardness layer 27 and the parent bump 15. For the conductor of the parent bump 15 and the repair bump (27, 28), any combination of metals and alloys described in the first embodiment can be used. The parent bump 15 and the repair bump (27, 28) implement the jointing-element as one of the elements of the stacked semiconductor device according to the fourth embodiment.

In the jointing-element of the stacked semiconductor device according to the first modification of the fourth embodiment, because material having a hardness higher than the metallic material used for the parent bump 15 is put into the higher-hardness layer 28 of the structure of the parallel-plate-shaped repair bump (27, 28) of the double-layered composite-structure, and an edge of the higher-hardness layer 28 cuts and penetrates into the counterpart parent bump 15 by the pressure applied during crimping for bonding to establish solid-phase diffusion-bonded interfaces. Therefore, since the relatively hard higher-hardness layer 28 cuts a deep trench with a configuration of a knife edge, to establish solid-phase diffusion-bonded interfaces, the portion to be deformed is small, but the clean surfaces to be contacted mutually can be increased. Though the deformed amount of the whole bump becomes smaller than the conventional uniform-hardness jointing scheme, by providing knife-edge trenches, the area of clean metals required for solid-phase diffusion junction increases. The solid-phase diffusion bonding between the repair bump (27, 28) and the parent bump 15 becomes possible even at low temperatures, because larger areas of new clean surfaces can be used.

In the jointing-element of the stacked semiconductor device according to the first modification of the fourth embodiment, since the weak crimping process of the repair bump (27, 28) and the parent bump 15 at a relatively small pressure can suppress the deformation of most portions of bumps other than the solid-phase diffusion bonding, if a defect is found by the provisional connection and the electrical evaluation, the defective onboard-components can be replaced to a new onboard-component so as to execute the next provisional connection again with less deformed configuration of the parent bump 15. It is possible to proceed to the nonprovisional-jointing process, if the electrical evaluation becomes successful by the next, or a further next provisional-connection test. Furthermore, in the stacked semiconductor device according to the first modification of the fourth embodiment, additional specific material may be mixed to the higher-hardness layer 28 which is a part of the repair bump (27, 28), so that the hardness of the processed-compound with the additional specific material changes to higher value than the bump metal at other portions, by the chemical reaction due to the crimping process. After crimping the metal of the repair bump (27, 28) to the parent bump 15, the generated higher-hardness compound will deform selectively the metal of the counterpart parent bump 15 by a large amount in a localized portion, or generate cracks selectively in limited areas in the metal of the counterpart parent bump 15.

Then, after the normal and proper operation of the onboard-element is confirmed, in a state where the parent bump 15 and the repair bump (27, 28) is provisionally assembled, by increasing the force for pressing the onboard-element with respect to the body, the distance between the onboard-element and the mother-plate becomes shortened. When the force for pressing the onboard-component against the body is further increased, the onboard-component and the body are finally and completely jointed. During the nonprovisional-jointing process of the parent bump 15 and the repair bump (27, 28), the vertical side wall portion of the parent bump 15 is further deformed by the pressing force, and the edge at lower side of the repair bump (27, 28) is metallurgically jointed to the lower end portion side of the parent bump 15. Since the distance between the mother-plate and the onboard-element is compressed by the final pressing, the height of the jointing-element after the stage of the nonprovisional-jointing process becomes lower than the height of the original jointing-element at the stage of the provisional-connection, and the parent bump 15 and the repair bump (27, 28) collapse in disorder and in fragments. When the structure is collapsed in disorder and in fragments, the fragmental residues of the fragments of higher-hardness conductors implementing the higher-hardness layer 28 in a disorderly collapsed state are unevenly distributed in the jointing-element along an indeterminate shape in a distorted plate-like trace. As a result, various fragments of conductors having different hardness are non-uniformly distributed in the vicinity of the intersections of the mother-site wall and the repair-site wall, which engage each other. Therefore, electrically connecting the mother-circuit merged in the mother-plate and the onboard-circuit merged in the onboard-element by the jointing-elements can build up the stacked semiconductor device according to the first modification of the fourth embodiment.

The stacked semiconductor device according to the first modification of the fourth embodiment of the present invention as described above can provide a stacked semiconductor device and a set of onboard-elements prepared for the stacked semiconductor device or the like, which achieve an effectiveness with highly-efficient repair processing for screening defective onboard-elements. As a result, the stacked semiconductor device according to the first modification of the fourth embodiment can minimize the manufacturing period of the various stacked semiconductor devices, eliminate the wasteful loss of the normal body and the normal onboard-elements, and increase the allowable number of the repair-process.

Second Modification of the Fourth Embodiment

Figure 18:
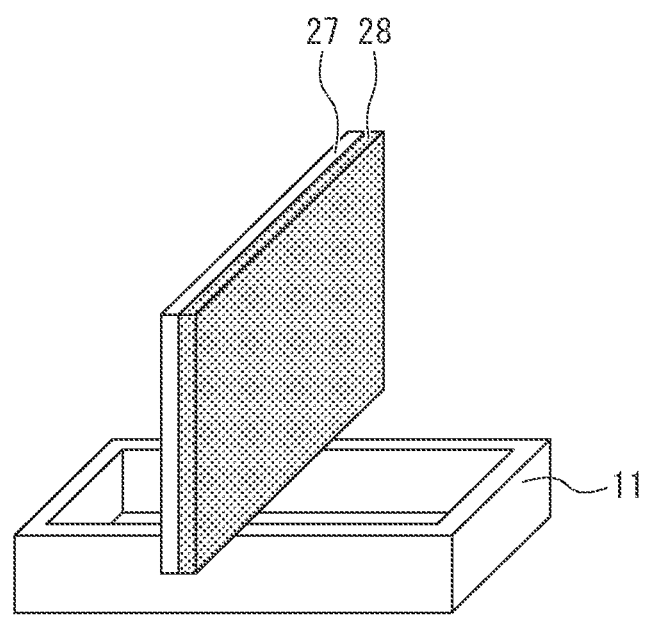
FIG. 18 is a schematic bird's-eye view for explaining the relation between the repair bumps and the parent bump of the stacked semiconductor device according to the second modification of the fourth embodiment of the present invention.

As illustrated in FIG. 18, a stacked semiconductor device according to a second modification of the fourth embodiment of the present invention has a stacked structure assembled by the substantially same body and the substantially same onboard-components as the structure of the stacked semiconductor device pertaining to the first embodiment, which has been illustrated in FIGS. 3A and 3B. As can be understood from FIGS. 3A and 3B, the structure of the body of the stacked semiconductor device according to the fourth embodiment encompasses a mother-plate (not illustrated), a field-insulating film (not illustrated) provided on the mother-plate, and a rectangular box-shaped parent bump 11 on the field-insulating film. On the other hand, each of the onboard-components encompasses an onboard-element (not illustrated), a multi-level interconnection insulation-layer (not illustrated) provided on the bottom surface of the onboard-element, and a repair bump (27, 28) with the parallel plate structure on the bottom surface of the multi-level interconnection insulation-layer. However, the onboard-element may have a structure of discrete elements such as LED chips.

The parent bump 11 is a rectangular box-shaped dish having a contour of a mother-site wall perpendicular to the mounting-main surface of the mother plate. The parent bump 11 is electrically connected to the mother-circuit integrated in the mother-plate, by contacting the bottom of the box-shaped dish to the surface interconnection buried in the field-insulating film. When a plurality of onboard-components is deployed on the body, each of the repair bumps (27, 28) has a repair-site wall perpendicular to the connection face of the corresponding onboard-element, and is electrically connected to the corresponding onboard-circuit merged in the corresponding onboard-element, respectively, through the corresponding surface interconnection buried in the corresponding multi-level interconnection insulation-layer. In each of the onboard-components, the bottom edge of the repair bump (27, 28) and the top edge of the parent bump 11 intersect at two points as illustrated in FIG. 18.

In each of the onboard-components, each of the repair bumps (27, 28) have a double-layered composite-structure embracing a parallel plate-shaped lower-hardness layer 27 and a higher-hardness layer 28 in the same manner as the topology illustrated in FIG. 16. The higher-hardness layer 28 has a hardness higher than the lower-hardness layer 27 and the parent bump 11. For the conductor of the parent bump 11 and the repair bump (27, 28), any combination of metals and alloys as described in the first embodiment can be used. The parent bump 11 and the repair bump (27, 28) implement the jointing-element as one of the elements of the stacked semiconductor device according to the second modification of the fourth embodiment.

In the jointing-element of the stacked semiconductor device according to the second modification of the fourth embodiment, because material having a hardness higher than the metallic material used for the parent bump 11 is put into the higher-hardness layer 28 of the structure of the parallel-plate-shaped repair bump (27, 28) of the double-layered composite-structure, and an edge of the higher-hardness layer 28 cuts and penetrates into the counterpart parent bump 11 by the pressure applied during crimping for bonding to establish solid-phase diffusion-bonded interfaces. Therefore, since the relatively hard higher-hardness layer 28 cuts a deep trench with a configuration of a knife edge, to establish solid-phase diffusion-bonded interfaces, the portion to be deformed is small, but the clean surfaces to be contacted mutually can be increased. Though the deformed amount of the whole bump becomes smaller than the conventional uniform-hardness jointing scheme, by providing knife-edge trenches, the area of clean metals required for solid-phase diffusion junction increases. The solid-phase diffusion bonding between the repair bump (27, 28) and the parent bump 11 becomes possible even at low temperatures, because larger areas of new clean surfaces can be used.

In the jointing-element of the stacked semiconductor device according to the second modification of the fourth embodiment, since the weak crimping process of the repair bump (27, 28) and the parent bump 11 at a relatively small pressure can suppress the deformation of most portions of bumps other than the solid-phase diffusion bonding, if a defect is found by the provisional connection and the electrical evaluation, the defective onboard-components can be replaced to a new onboard-component so as to execute the next provisional connection again with less deformed configuration of bumps. It is possible to proceed to the nonprovisional-jointing process, if the electrical evaluation becomes successful by the next, or a further next provisional-connection test. Furthermore, in the stacked semiconductor device according to the second modification of the fourth embodiment, additional specific material may be mixed to the higher-hardness layer 28 which is a part of the repair bump (27, 28), so that the hardness of the processed-compound with the additional specific material changes to higher value than the bump metal at other portions, by the chemical reaction due to the crimping process. After crimping the metal of the repair bump (27, 28) to the parent bump 11, the generated higher-hardness compound will deform selectively the metal of the counterpart parent bump 11 by a large amount in a localized portion, or generate cracks selectively in limited areas in the metal of the counterpart parent bump 11.

Then, after the normal and proper operation of the onboard-element is confirmed, in a state where the parent bump 11 and the repair bump (27, 28) is provisionally assembled, by increasing the force for pressing the onboard-element with respect to the body, the distance between the onboard-element and the mother-plate becomes shortened. When the force for pressing the onboard-component against the body is further increased, the onboard-component and the body are finally and completely jointed. During the nonprovisional-jointing process of the parent bump 11 and the repair bump (27, 28), the vertical side wall portion of the parent bump 11 is further deformed by the pressing force, and the edge at lower side of the repair bump (27, 28) is metallurgically jointed to the lower end portion side of the parent bump 11.

Since the distance between the mother-plate and the onboard-element is compressed by the final pressing, the height of the jointing-element after the stage of the nonprovisional-jointing process becomes lower than the height of the original jointing-element at the stage of the provisional-connection, and the parent bump 11 and the repair bump (27, 28) collapse in disorder and in fragments. When the structure is collapsed in disorder and in fragments, the fragmental residues of the fragments of higher-hardness conductors implementing the higher-hardness layer 28 in a disorderly collapsed state are unevenly distributed in the jointing-element along an indeterminate shape in a distorted plate-like trace. As a result, various fragments of conductors having different hardness are non-uniformly distributed in the vicinity of the intersections of the mother-site wall and the repair-site wall bite each other. Therefore, electrically connecting the mother-circuit merged in the mother-plate and the onboard-circuit merged in the onboard-element by the jointing-elements can build up the stacked semiconductor device according to the second modification of the fourth embodiment.

The stacked semiconductor device according to the second modification of the fourth embodiment of the present invention as described above can provide a stacked semiconductor device and a set of onboard-elements prepared for the stacked semiconductor device or the like, which achieve an effectiveness with highly-efficient repair processing for screening defective onboard-elements. As a result, the stacked semiconductor device according to the second modification of the fourth embodiment can minimize the manufacturing period of the various stacked semiconductor devices, eliminate the wasteful loss of the normal body and the normal onboard-elements, and increase the allowable number of the repair-process.

Other Embodiments

As described above, the first to fourth embodiments of the present invention have been described, but because Specifications and Drawings implement a mere part of the disclosure of the present invention, and it should not be understood that Specifications and Drawings are intended to limit the scope of the present invention. Various alternative embodiments, examples and operational techniques will become apparent to those skilled in the art from the above disclosure.

Figure 19A:
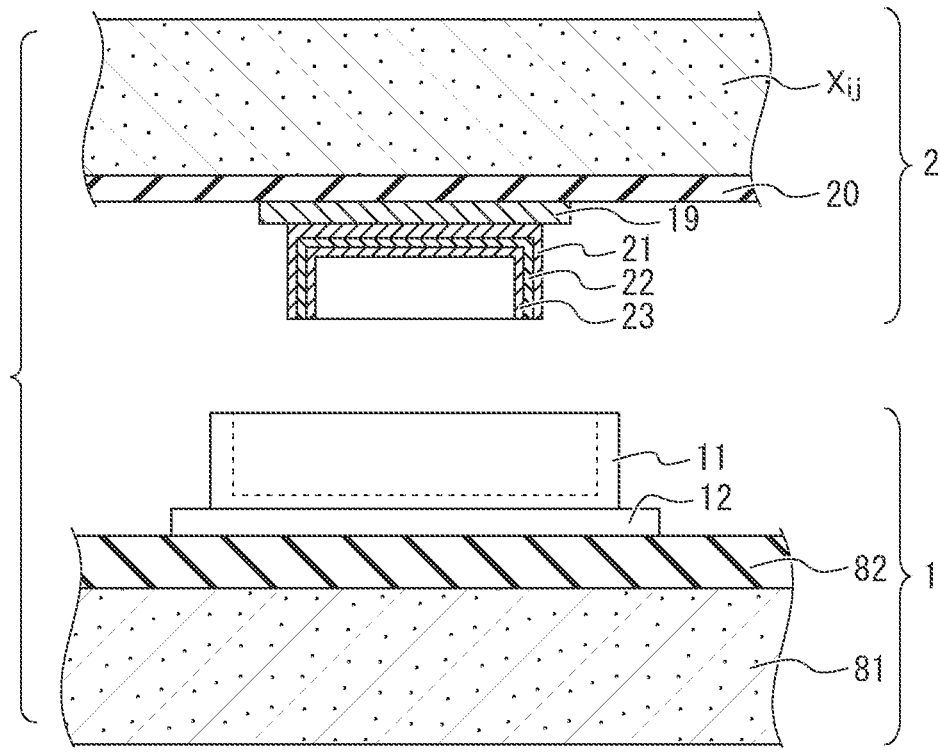
FIG. 19A is a schematic partial cross-sectional view taken in a specific direction for explaining a state before provisional-connection of the jointing-element of the stacked semiconductor device according to another embodiment.

For example, FIG. 19A illustrates a body 1 and an onboard-component 2, which are prepared for assembling a stacked semiconductor device according to another embodiment of the present invention. In FIG. 19A, the body 1 encompasses a mother-plate 81, a field-insulating film 82 provided on the top surface of the mother-plate 81, a first surface electrode (parent-side land) 12 selectively provided on the top surface of the field-insulating film 82, and a parent bump 11 provided on the top surface of the parent-side land 12. The first surface electrode (parent-side land) 12 is exposed on the top surface of the field-insulating film 82. And, the onboard-component 2 encompasses an onboard-element $X_{ij}$, a multi-level interconnection insulation-layer 20 provided on the connection face of the onboard-element $X_{ij}$, a second surface electrode (repair-side land) 19 selectively provided on the bottom surface of the multi-level interconnection insulation-layer 20, and a repair bump (21, 22, 23) provided on the bottom surface of the repair-side land 19. The second surface electrode (repair-side land) 19 is exposed on the bottom surface of the multi-level interconnection insulation-layer 20.

The mother-plate 81 illustrated in FIG. 19A merges a mother-circuit in the mother-plate 81, and the mother-plate 81 has a parallel plate shape defined by a mounting-main surface and a bottom-main surface facing the mounting-main surface. On the other hand, the onboard-element $X_{ij}$ has a structure of the parallel plate shape defined by a connection face, and an opposite face facing the connection face. While the structure of the parallel plate is exemplified for the onboard-element $X_{ij}$, but the onboard-element $X_{ij}$ is not limited to the parallel plate shape. For example, if the onboard-element is a discrete element such as an LED chip, the onboard-element $X_{ij}$ may have a bullet-like round structure. The connection face of the onboard-element $X_{ij}$, which merges the onboard-circuit, faces to the mounting-main surface of the mother-plate 81. The parent bump 11 is rectangular box-shape, and has a contour of a mother-site wall perpendicular to the mounting-main surface of the mother-plate 81. The bottom of the parent bump 11 is in contact with the parent-side land 12 exposed on the top surface of the field-insulating film 82. The parent-side land 12 is electrically connected to the mother-circuit merged in the mother-plate 81 by a contact via (not illustrated). The repair bump (21, 22, 23) has a rectangular box-shape, and has a contour of a repair-site wall perpendicular to the connection face. The bottom of the repair bump (21, 22, 23) is in contact with the repair-side land 19 exposed on the bottom-main surface—the bottom-main surface is assigned to the ceiling side in FIGS. 19A and 19B—of the multi-level interconnection insulation-layer 20. The repair-side land 19 is connected by a contact via (not illustrated) cut in the multi-level interconnection insulation-layer 20. Since the interconnection in the multi-level interconnection insulation-layer 20 is electrically connected to the onboard-circuit merged in the onboard-element $X_{ij}$, the repair bump (21, 22, 23) is connected to the onboard-circuit through the repair-side land 19. With the similar topology of the plane pattern illustrated in FIG. 4, the mother-site wall and the repair-site wall intersect at quadruple points.

Figure 19B:
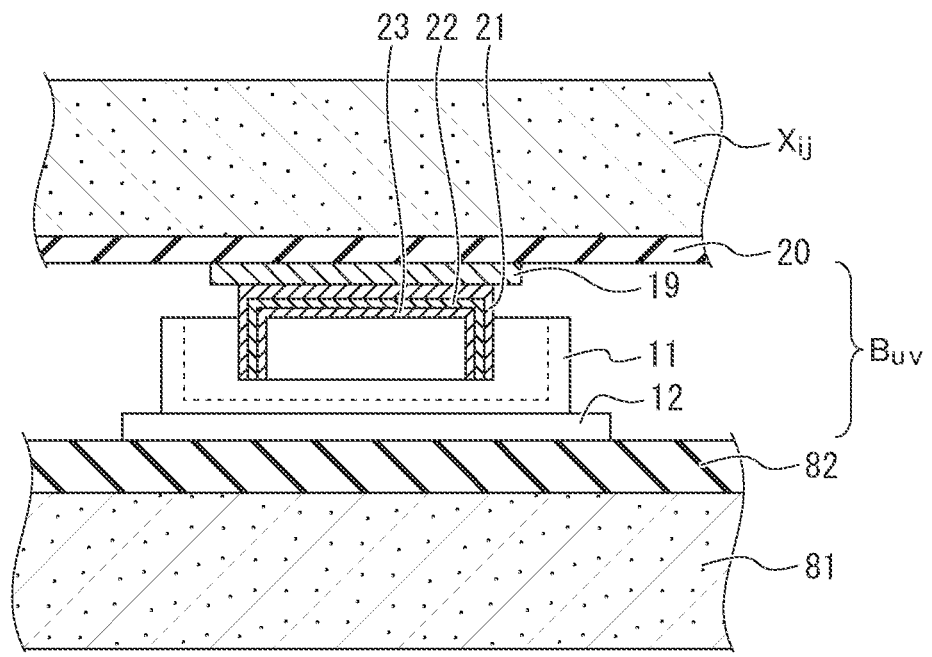
FIG. 19B is a schematic partial cross-sectional view for explaining the state of the provisional-connection of the jointing-element of the stacked semiconductor device according to the other embodiment illustrated in FIG. 19A.

Although not illustrated, the planar pattern of the parent-side land 12 and repair-side land 19, for example, may be a square shape, but the planar pattern is not limited to a square shape. The repair bump (21, 22, 23) illustrated in FIG. 19A have the feature of a triple-layered composite-structure embracing a rectangular box-shaped outermost layer 21, a rectangular box-shaped intermediate layer 22, and a rectangular box-shaped innermost layer 23, which is the same as the first embodiment. The hardness of the intermediate layer 22 is higher than that of the outermost layer 21, the innermost layer 23, and the parent bump 11. Any combination of metals and alloys as described in the first embodiment can be used as the conductor of the parent bump 11 and the repair bump (21, 22, 23). Preferably, the parent-side land 12 selects a conductor which can reduce the contact resistance with the metallic material or alloy selected as the parent bump 11, and the repair-side land 19 selects a conductor which can reduce the contact resistance with the metallic material or alloy selected as the repair bump (21, 22, 23). The parent-side land 12 and repair-side land 19, for example, can be formed of Au, or an alloy such as Au—Si, Au—Ge, Au—Sb, Au—Sn, Au—Pb, Au—Zn, and Au—Cu containing Au 80% or more, and may have a laminated structure with an underlying metallic-layer such as Ni, Cr and etc. As illustrated in FIG. 19B, the parent bump 11 and the repair bump (21, 22, 23) implement the jointing-element $B_{uv}$ as an element of the stacked semiconductor device according to another embodiment.

In the jointing-element $B_{uv}$ of the stacked semiconductor device according to another embodiment illustrated in FIG. 19B, material having a hardness higher than the metallic material used for the parent bump 11 is put into the intermediate layer 22. And, since the intermediate layer 22 implements the structure of the box-shape repair bump (21, 22, 23) with the triple-layered composite-structure, an edge of the intermediate layer 22 cuts and penetrates into the counterpart parent bump 11 by the pressure applied during crimping for bonding, to establish solid-phase diffusion-bonded interfaces. Therefore, since the relatively hard intermediate layer 22 establishes solid-phase diffusion-bonded interfaces by generating a deep trench with knife-edge configuration, the portion to be deformed is small, but the clean surfaces to be contacted mutually can be increased. Though the deformed amount of the whole bump becomes smaller than the conventional uniform-hardness jointing scheme, by providing knife-edge trenches, the area of clean metals required for solid-phase diffusion junction increases. With aide of the deep trenches generated, solid-phase diffusion bonding between the repair bump (21, 22, 23) and the parent bump 11 becomes possible even at low temperatures, because larger areas of new clean surfaces can be used. Duplicate descriptions will be omitted because the other technical features are substantially the same as the stacked semiconductor device pertaining to the first embodiment that has already been described.

Figure 20A:
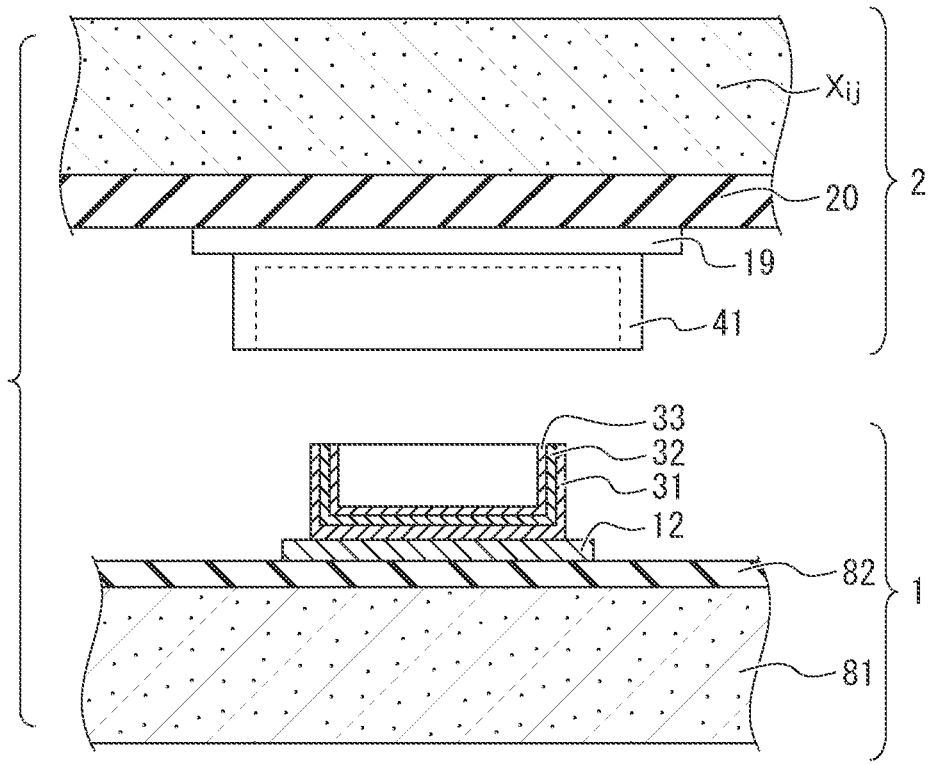
FIG. 20A is a schematic partial cross-sectional view taken in the specific direction for explaining a state before the provisional-connection of the jointing-element of the stacked semiconductor device according to still another embodiment.

Further, as illustrated in FIG. 20A, the divided structure, which is scheduled to be assembled to a stacked semiconductor device encompassing a body 1 and an onboard-component 2, has an architecture opposite to the topology illustrated in FIG. 19A, in that the higher-hardness conductor is used on the side of the body 1. That is, the body 1 illustrated in FIG. 20A includes a mother-plate 81, a field-insulating film 82 provided on the top surface of the mother-plate 81, a parent-side land 12 selectively provided on the top surface of the field-insulating film 82, and a parent bump (31, 32, 33) disposed on the top surface of the parent-side land 12. On the other hand, the onboard-component 2 encompasses an onboard-element $X_{ij}$, a multi-level interconnection insulation-layer 20 provided on the connection face of the onboard-element $X_{ij}$, a repair-side land 19 selectively provided on the bottom surface of the multi-level interconnection insulation-layer 20, and a repair bump 41 provided on the bottom surface of the repair-side land 19.

The mother-plate 81 merges a mother-circuit in the mother-plate 81, and the mother-plate 81 has a parallel plate shape defined by a mounting-main surface and a bottom-main surface facing the mounting-main surface. Wherein, the onboard-element $X_{ij}$ has a parallel plate-shaped structure defined by a connection face and an opposite face facing the connection face. Although the structure of the onboard-element $X_{ij}$ is exemplified as the parallel plate-shaped structure, the onboard-element $X_{ij}$ is not limited to a parallel plate shape. For example, if the onboard-element is a discrete element such as an LED chip, the onboard-element $X_{ij}$ may have a bullet-like round shape.

When a plurality of onboard-components is deployed on the body, each of the onboard-elements $X_{ij}$ merges an onboard-circuit, and the connection face of the onboard-elements $X_{ij}$ faces to the mounting-main surface of the mother-plate 81, respectively. The parent bumps (31, 32, 33) are rectangular box-shaped, respectively, and each of the parent bumps (31, 32, 33) has a contour of a mother-site wall perpendicular to the mounting-main surface of the mother-plate 81. The bottoms of the parent bumps (31, 32, 33) are in contact with the corresponding parent-side lands 12 exposed on the top surface of the field-insulating film 82, respectively, each of the parent-side lands 12 is provided on the top surface of the field-insulating film 82. Each of the parent-side land 12 is electrically connected to the mother-circuit merged in the mother-plate 81 by a contact via (not illustrated). When a plurality of the onboard-components is deployed on the large-sized body, each of the repair bump 41 is rectangular box-shaped, having a contour of a repair-site wall perpendicular to the connection face, and the bottom of the box is in contact with the repair-side land 19 exposed on the bottom surface—the bottom surface is assigned at the ceiling side in FIGS. 20A and 20B—of the multi-level interconnection insulation-layer 20. Each of the repair-side lands 19 is connected by a contact via (not illustrated) in the corresponding multi-level interconnection insulation-layer 20, since the interconnections in the corresponding multi-level interconnection insulation-layer 20 are electrically connected to the onboard-circuits merged in each of the onboard-elements the repair bumps 41 are connected to the onboard-circuits by the repair-side lands 19, respectively. With the similar topology of the plane pattern illustrated in FIG. 4, the mother-site wall and the repair-site wall intersect at quadruple points.

Figure 20B:
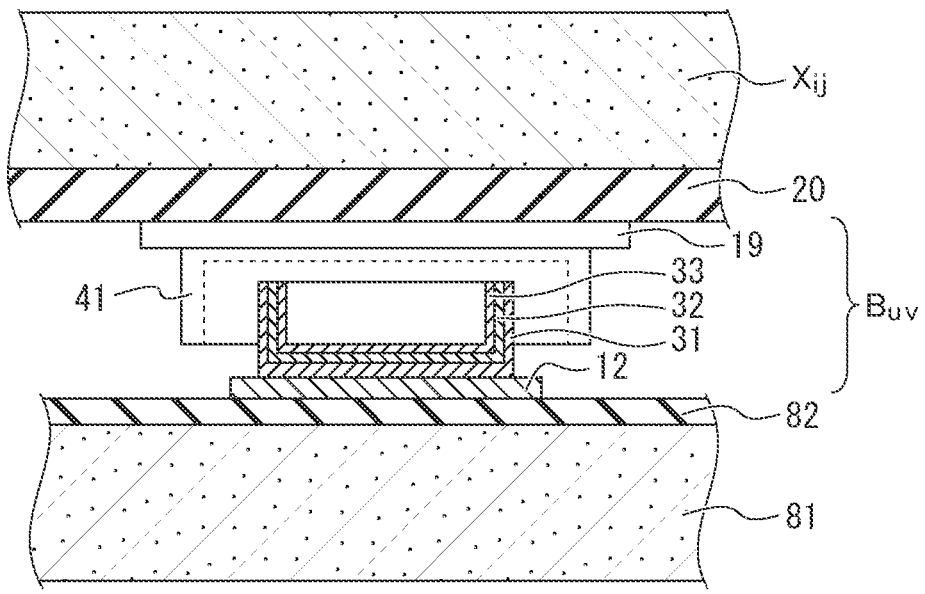
FIG. 20B is a schematic partial cross-sectional view for explaining the state of the provisional-connection of the jointing-element of the stacked semiconductor device according to still another embodiment illustrated in FIG. 20A.

The parent bump (31, 32, 33) have a triple-layered composite-structure embracing a rectangular box-shaped outermost layer 31, a rectangular box-shaped intermediate layer 32, and a rectangular box-shaped innermost layer 33. The intermediate layer 32 has a hardness higher than the outermost layer 31, the innermost layer 33, and the repair bump 41. For the conductor of the parent bump (31, 32, 33) and the repair bump 41, any combination of a higher-hardness conductor and a lower-hardness conductor of metallic material or alloy as described in the first embodiment can be used. Preferably, the parent-side land 12 selects a conductor which can reduce the contact resistance with the metallic material or alloy selected as the parent bump (31, 32, 33), and the repair-side land 19 selects a conductor which can reduce the contact resistance with the metallic material or alloy selected as the repair bump 41. The parent-side land 12 and the repair-side land 19, for example, can be formed of Au or an alloy such as Au—Si containing Au 80% or more, may have a laminated structure with an underlying metallic-layer such as Ni, Cr and etc. As illustrated in FIG. 20B, the parent bump (31, 32, 33) and the repair bump 41 build up the jointing-element $B_{uv}$ to be an element of the stacked semiconductor device according to yet another embodiment.

In the jointing-element $B_{uv}$ of the stacked semiconductor device according to still another embodiment illustrated in FIG. 20B, material having a hardness higher than that of the metal used for the repair bump 41 is put in the intermediate layer 32 of the box-shaped parent bump (31, 32, 33) having a triple-layered composite-structure, and by applying pressure at the time of bonding, an edge of the intermediate layer 32 cuts and penetrates into the repair bump 41 and implements a solid phase diffusion bonding. Therefore, since the relatively hard intermediate layer 32 implements solid-phase diffusion-bonded interfaces by generating a deep trench with knife edge configuration in the repair bump 41, the portion to be deformed is small, but the clean surfaces to be contacted mutually can be increased. Though the deformed amount of the whole bump becomes smaller than the conventional uniform-hardness jointing scheme, by providing knife-edge trenches, the area of clean metals required for solid-phase diffusion junction increases. The solid-phase diffusion bonding between the repair bump 41 and the parent bump (31, 32, 33) becomes possible even at low temperatures, because larger areas of new clean surfaces can be used. Duplicate descriptions will be omitted because the other technical features are substantially the same as the stacked semiconductor device pertaining to the first embodiment that has already been described. Regarding the stacked semiconductor devices according to the second to fourth embodiments, the reverse relation between the parent bump and the repair bump as illustrated in FIGS. 20A and 20B, such that the parent bump on the body 1 has a laminated structure including a layer of a higher hardness conductor, and the layer of the higher-hardness conductor of the parent bump bites the repair bump on the onboard-component, can be applied.

Figure 21:
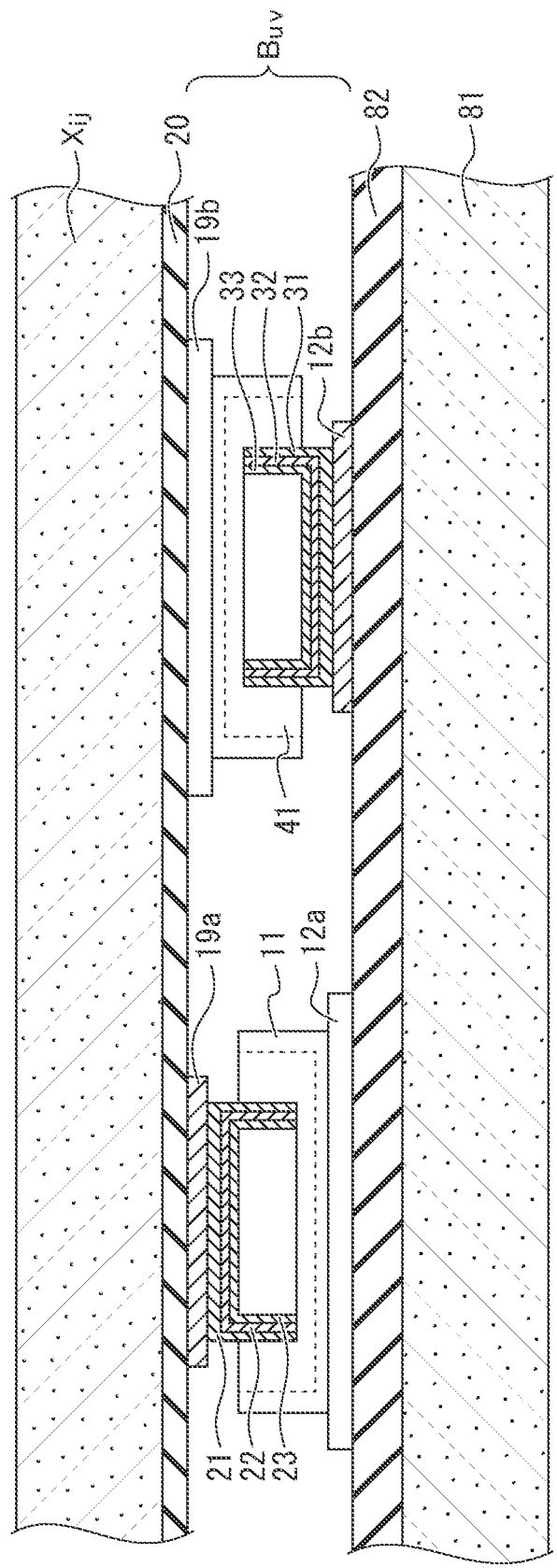
FIG. 21 is a schematic partial cross-sectional view taken from a specific direction for explaining the state of the provisional-connection of the jointing-element of the stacked semiconductor device according to still another embodiment.

Further, as the mixed structure illustrated in FIG. 21, in which the structure illustrated in FIG. 19B and the structure illustrated in FIG. 20B are mixed on a same mother-plate 81. The body illustrated in FIG. 21 encompasses the mother-plate 81, a field-insulating film 82 provided on the mounting-main surface of the mother-plate 81, the left parent-side land 12$a$ and the right parent-side land 12$b$ selectively provided on the top surface of the field-insulating film 82, the parent bump 11 provided on the top surface of the left parent-side land 12$a$, and the parent bump (31, 32, 33) provided on the top surface of the right parent-side land 12$b$. On the other hand, the onboard-component 2 illustratively shows a structure assembled by an onboard-element $X_{ij}$, a multi-level interconnection insulation-layer 20 provided on the connection face of the onboard-element $X_{ij}$, a left repair-side land 19$a$ and a right repair-side land 19$b$ selectively provided on the bottom surface of the multi-level interconnection insulation-layer 20, a repair bump (21, 22, 23) provided on the bottom surface of the left repair-side land 19$a$, and a repair bump 41 provided on the bottom-main surface of the right repair-side land 19$b$. However, the onboard-element $X_{ij}$ may have a structure of discrete elements such as LED chips. For example, if the onboard-element is a discrete element such as an LED chip, the onboard-element may have a bullet-like round shape.

The mother-plate 81 has a parallel plate shape defined by a mounting-main surface, at which a mother-circuit is merged, and a bottom-main surface facing the mounting-main surface. The onboard-element $X_{ij}$ has a parallel plate shape defined by a connection face, at which an onboard-circuit is merged, and an opposite face facing the connection face, and the connection face faces the mounting-main surface of the mother-plate 81. Each of the parent bump 11 and the parent bump (31, 32, 33) has a rectangular box shape having a contour of a mother-site wall perpendicular to the mounting-main surface of the mother-plate 81. The bottoms of the parent bump 11 and parent bump (31, 32, 33) are in contact with each of the left parent-side land 12a and the right parent-side land 12b exposed on the top surface of the field-insulating film 82, the left parent-side land 12a and the right parent-side land 12b are provided on the top surface of the field-insulating film 82. The left parent-side land 12a and the right parent-side land 12b are electrically and independently connected to the mother-circuit integrated merged in the mother-plate 81 by contact vias (not illustrated).

Each of the repair bump (21, 22, 23) and the repair bump 41 has a shape of a rectangular box, which has a contour of a repair-site wall perpendicular to the connection face. The bottom—defined at the ceiling side in FIG. 21—of the left box is in contact with the left repair-side land 19a exposed on the connection-face of the multi-level interconnection insulation-layer 20, and the bottom of the right box is in contact with the right repair-side land 19b exposed on the connection-face of the multi-level interconnection insulation-layer 20. Each of the left repair-side land 19a and the right repair-side land 19b is independently connected to the interconnections in the multi-level interconnection insulation-layer 20 through contact vias (not illustrated), and the interconnections in the multi-level interconnection insulation-layer 20 are individually and electrically connected to the onboard-circuits provided in the onboard-element $X_{ij}$, so that the repair bump (21, 22, 23) is independently connected to a specific onboard-circuit through the left repair-side land 19a, and the repair bump 41 is independently connected to another onboard-circuit through the right repair-side land 19b. The mother-site wall of the parent bump 11 and the repair-site wall of the repair bump (21, 22, 23) intersect at quadruple points, and the mother-site wall of the parent bump (31, 32, 33) and the repair-site walls of the repair bump 41 intersect at quadruple points.

The repair bump (21, 22, 23) illustrated in FIG. 21 has a triple-layered composite-structure embracing a rectangular box-shaped outermost layer 21, a rectangular box-shaped intermediate layer 22, and a rectangular box-shaped innermost layer 23. The intermediate layer 22 has a hardness higher than the outermost layer 21, the innermost layer 23, and the parent bump 11. The parent bump (31, 32, 33) have a triple-layered composite-structure embracing a rectangular box-shaped outermost layer 31, a rectangular box-shaped intermediate layer 32 and a rectangular box-shaped innermost layer 33. The hardness of the intermediate layer 32 is higher than the hardness of the outermost layer 31 and the innermost layer 33 and the hardness of the repair bump 41. For the conductor of the parent bump 11, the parent bump (31, 32, 33), the repair bump 4 land the repair bump (21, 22, 23), any combination of a higher-hardness conductor and a lower-hardness conductor of metallic material or alloy as described in the first embodiment can be used. As illustrated in FIG. 21, the jointing-element $B_{uv}$ on the left side encompasses the parent bump 11 and the repair bump (21, 22, 23), and the jointing-element $B_{uv}$ on the right side encompasses the parent bump (31, 32, 33) and the repair bump 41.

In the jointing-element $B_{uv}$ of the left side illustrated in FIG. 21, material having a hardness higher than the metallic material used for the parent bump 11 is put into the intermediate layer 22 of the repair bump (21, 22, 23), and an edge of the intermediate layer 22 cuts and penetrates into the counterpart parent bump 11 by the pressure applied during crimping for bonding to establish solid-phase diffusion-bonded interfaces. In the jointing-element $B_{uv}$ on the right, material having a hardness higher than that of the metal used for the repair bump 41 is put in the intermediate layer 32 of the parent bump (31, 32, 33), and by applying pressure at the time of bonding, an edge of the intermediate layer 32 cuts and penetrates into the repair bump 41 and implements a solid phase diffusion bonding. Therefore, since the relatively hard intermediate layer 22 and intermediate layer 32 establish solid-phase diffusion-bonded interfaces between the repair bump (21, 22, 23) and the counterpart parent bump 11, or the between the parent bump (31, 32, 33) and the repair bump 41, by making deep trenches, like a knife. With the knife-edge shaped trenches cut in the parent bump 11 and the repair bump 41, although the portions to be deformed are small, but the clean surfaces to be contacted mutually can be increased. Though the deformed amount of the whole bump becomes smaller than the conventional uniform-hardness jointing scheme, by providing knife-edge trenches, the area of clean metals required for solid-phase diffusion junction increases. The solid-phase diffusion bonding between the repair bump (21, 22, 23) and the parent bump 11 and the solid-phase diffusion bonding between the repair bump 41 and the parent bump (31, 32, 33) becomes possible even at low temperatures, because larger areas of new clean surfaces can be used. Duplicate descriptions will be omitted because the other technical features are substantially the same as the stacked semiconductor device pertaining to the first embodiment that has already been described. Regarding the stacked semiconductor devices according to the second to fourth embodiments, the composite architecture encompassing the lower mixed configuration of the right side higher-hardness conductor regime and the left side lower-hardness conductor regime, and the upper mixed configuration of the right side lower-hardness conductor regime and the left side higher-hardness conductor regime, as illustrated in FIG. 21, can be adapted.

Figure 22:
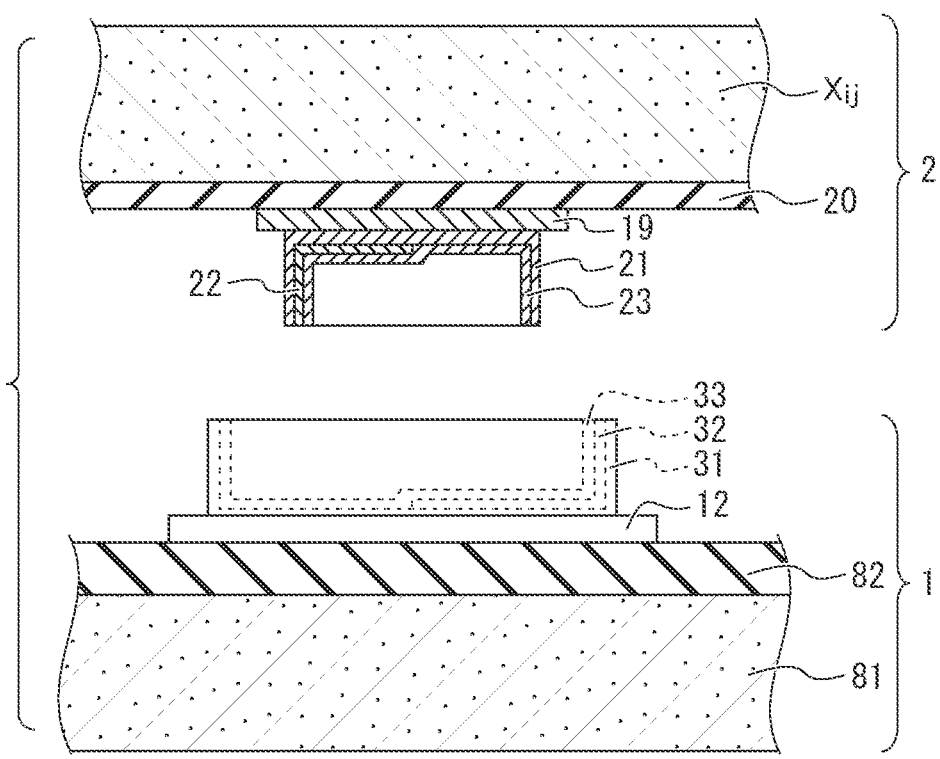
FIG. 22 is a schematic partial cross-sectional view taken from a specific direction for explaining the state before the provisional-connection of the jointing-element of the stacked semiconductor device according to still another embodiment.

Further, as illustrating a part of the structure in FIG. 22, the structure illustrated in FIG. 19B and the structure illustrated in FIG. 20B may be mixed in a same single bump. The body 1 illustrated in FIG. 22 encompasses a mother-plate 81, a field-insulating film 82 provided on the mounting-main surface of the mother-plate 81, the parent-side land 12 selectively provided on the top surface of the field-insulating film 82, and a hybrid-parent bump (31, 32, 33) provided on the top surface of the parent-side land 12. On the other hand, the onboard-component 2 encompasses an onboard-element $X_{ij}$, a multi-level interconnection insulation-layer 20 provided on the connection face of the onboard-element $X_{ij}$, a repair-side land 19 selectively provided on the connection-face of the multi-level interconnection insulation-layer 20, and a hybrid-repair bump (21, 22, 23) provided on the bottom surface of the repair-side land 19.

The mother-plate 81 has a parallel plate shape defined by a mounting-main surface, at which a mother-circuit is merged, and a bottom-main surface facing the mounting-main surface. As one of the examples, the onboard-element $X_{ij}$ has a parallel plate structure defined by a connection face, at which an onboard-circuit is merged, and an opposite face facing the connection face, the connection face facing the mounting-main surface of the mother-plate 81. However, the structure of the onboard-element $X_{ij}$ is not limited to the parallel plate-shape. For example, if the onboard-element $X_{ij}$ is a discrete element such as an LED chip, the onboard-element $X_{ij}$ may have a bullet-like round shape. The hybrid-parent bump (31, 32, 33) is rectangular box-shaped, having a contour of a mother-site wall perpendicular to the mounting-main surface of the mother-plate 81. The bottom of the box of the hybrid-parent bump (31, 32, 33) is in contact with the parent-side land 12 exposed on the top surface of the field-insulating film 82, and the parent-side land 12 is provided on the top surface of the field-insulating film 82. The parent-side land 12 is electrically connected to the mother-circuit merged in the mother-plate 81 by a contact via (not illustrated).

The hybrid-repair bump (21, 22, 23) is rectangular box-shaped, having a contour of a repair-site wall perpendicular to the connection face, and the bottom—the bottom is assigned at the ceiling side in FIG. 22—of the box is in contact with a repair-side land 19 exposed on the bottom-main surface of the multi-level interconnection insulation-layer 20. Since the repair-side land 19 is connected by a contact via (not illustrated) to an interconnection in the multi-level interconnection insulation-layer 20, and the interconnection in the multi-level interconnection insulation-layer 20 is electrically connected to the onboard-circuit merged in the onboard-element $X_{ij}$, the hybrid-repair bump (21, 22, 23) is connected to the onboard-circuit by the repair-side land 19. The repair-site wall of the hybrid-repair bump (21, 22, 23) and the mother-site wall of the hybrid-parent bump (31, 32, 33) intersect at quadruple intersections.

The left side of the hybrid-repair bump (21, 22, 23) illustrated in FIG. 22 has a triple-layered composite-structure embracing an outermost layer 21, an intermediate layer 22, and an innermost layer 23, while the right side has a double-layered composite-structure, which lacks the intermediate layer 22. The right side of the hybrid-parent bump (31, 32, 33) have a triple-layered composite-structure embracing an outermost layer 31, an intermediate layer 32, and an innermost layer 33, while the left side has a double-layered composite-structure, which lacks the intermediate layer 32. The hardness of the intermediate layer 22 of the hybrid-repair bumps (21, 22, 23) is higher than that of the outermost layer 21, the innermost layer 23, and the outermost layer 31 and the innermost layer 33 of the hybrid-parent bump (31, 32, 33). The intermediate layer 32 of the hybrid-parent bump (31, 32, 33) has a hardness higher than the outermost layer 31, the innermost layer 33, and the outermost layer 21 and the innermost layer 23 of the hybrid-repair bump (21, 22, 23). Any combination of the higher-hardness conductor and the lower-hardness conductor of metallic material or alloy as described in the first embodiment can be used for the conductor of the hybrid-parent bump (31, 32, 33) and the hybrid-repair bump (21, 22, 23).

In the left side region illustrated in FIG. 22, material having a hardness higher than that of the metal used for the left side of the hybrid-parent bump (31, 33) is put in the intermediate layer 22 of the hybrid-repair bump (21, 22, 23), and by applying pressure at the time of bonding, an edge of the intermediate layer 22 cuts and penetrates into the left side of the hybrid-parent bump (31, 33) and implements a solid phase diffusion bonding. In the right side region illustrated in FIG. 22, material having a hardness higher than that of the metal used for the right side of the hybrid-repair bump (21, 23) is put in the intermediate layer 32 of the hybrid-parent bump (31, 32, 33), and by applying the pressure at the time of bonding, an edge of the intermediate layer 32 cuts and penetrates into the counterpart hybrid-repair bump (21, 23) and implements a solid phase diffusion bonding. Therefore, since the intermediate layer 22 and the intermediate layer 32, which are relatively hard, establish deep trenches in a configuration of a knife edge in the conductors of relatively low hardness in the hybrid parent bump (31, 33) or the hybrid repair bump (21, 23) by the application of the pressure. Then, the application of the pressure achieves a large area of the clean surfaces required for the solid-phase diffusion bonding, although the deformed portions are small.

Though the deformed amount of the whole bump becomes smaller than the conventional uniform-hardness jointing scheme, by making the structure of solid-phase diffusion junction with knife-edge trenches, the area of the solid-phase diffusion bonding with clean surfaces of metals increases. The solid-phase diffusion bonding between the hybrid-repair bump (21, 22, 23) and the hybrid-parent bump (31, 32, 33) becomes possible even at low temperatures, because larger areas of new clean surfaces can be used. Duplicate descriptions will be omitted because the other technical features is substantially the same as the stacked semiconductor device pertaining to the first embodiment that has already been described.

As to the stacked semiconductor devices according to the second to fourth embodiments, omitting the structures illustrated in FIGS. 13 and 16, in other words, if the repair bumps and the parent bumps intersect at more than two points, it is possible to adopt the composite architecture illustrated in FIG. 22. Namely the composite architecture in which two different structures are mixed in the same bump, such that a regime using a higher-hardness conductor region for the right side parent bump in the body 1 and another regime using a higher-hardness conductor region for the left side repair bump in the onboard-component 2 are mixed in the same bump can be applied to the stacked semiconductor devices according to the second to fourth embodiments.

The descriptions have been made, as examples, mainly for the cases in the stacked semiconductor devices according to the first to fourth embodiments of the present invention, each of the mother-plates 81 serves as a detector body on which a plurality of detector-elements such as photodiodes are arranged as pixels in a matrix, and each of the onboard-elements $X_{ij}$ is a semiconductor integrated-circuit chip, in which a read-out circuit for reading out signals from each of the pixels merged in the mother-plate 81 is integrated. However, the stacked semiconductor device of the present invention is not limited to a solid-state imaging device or a micro LED display. For example, the mother-plate 81 may be a main memory such as DRAM or SRAM, and the stacked semiconductor device may be organized by a plurality of onboard-elements each of which integrates arithmetic logic unit (ALU) adapted for the main memory. If the onboard-elements $X_{ij}$, in each of which an ALU or the like is integrated, are mounted in the divided areas of the main memory, a parallel computer can be realized in which the onboard-elements $X_{ij}$ execute parallel processing or pipeline processing of signals transferred from each of the divided blocks of the main memory.

Furthermore, the mother-plate 81 may be an interposer, and the stacked semiconductor device may be organized by a plurality of semiconductor integrated circuit (IC) chips serving as the onboard-elements $X_{ij}$. The interposer may include a silicon substrate, a top-insulating film that is formed on a top-main surface of the silicon substrate and made of silicon oxide film and the like, and a bottom-insulating film that is formed on a bottom-main surface of the silicon substrate and made of silicon oxide film and the like. Then, on the upper plane of the top-insulating film, a plurality of wiring lands is arrayed on each of the wiring lands, respectively, by considering the size of the IC chips. Each of the IC chips includes a plurality of repair bumps assigned to corresponding positions of the parent bumps. On the lower plane of the bottom-insulating film, bottom surface wirings are delineated, and each of the bottom surface wirings is electrically connected to the corresponding wiring land on the top-main surface of the interposer through a through-silicon via a through-silicon-via (TSV) that penetrates the top-insulating film, the silicon substrate and the bottom-insulating film. The stacked semiconductor device, which is implemented by the Si interposer having a plurality of micro-TSVs, can achieve 2.5D or 3D architecture which facilitates a high bandwidth communication, homogeneous and heterogeneous chip integration.

As described above, the technical ideas described in the first to fourth embodiments are merely examples, and can be applied to any modified stacked semiconductor device in which the configuration described in one of the first to fourth embodiments is arbitrarily applied. Therefore, it is a matter of course that the present invention includes various modified examples of the first to fourth embodiments, which are not described in the stacked semiconductor device according to the first to fourth embodiments. Therefore, the technical scope of the present invention is determined only by the "technical features specifying the invention" construed from the scope of claims, if it the determined technical feature that can be interpreted from the claims is appropriate from the above description.

What is claimed is:

1. A stacked semiconductor device comprising:
   a mother-plate merging a mother-circuit, having a mounting-main surface and a bottom-main surface in an opposite direction of the mounting-main surface;
   an onboard-element including a semiconductor chip, which merges a circuit element at least in a part of the semiconductor chip as an onboard-circuit, having a connection face facing to the mounting-main surface;
   a parent bump provided on the mounting-main surface, having a mother-site wall made of a layer of conductor, the mother-site wall is perpendicular to the mounting-main surface, the parent bump is electrically connected to the mother-circuit; and
   a repair bump provided on the connection face, having a repair-site wall made of a layer of conductor having different hardness from the mother-site wall, the repair-site wall is perpendicular to the connection face, configured to penetrate into the parent bump for generating a knife-edge shaped trench at an intersection between the mother-site wall and the repair-site wall conductor, the intersection is defined in a planar pattern viewed from a normal direction of the connection face,
   wherein conductors with different hardness are non-uniformly included at and in the vicinity of the intersection.

2. The stacked semiconductor device of claim 1, wherein at least one of the mother-site and repair-site walls includes a laminated structure of two or more layers of conductive layers, adjacent conductive layers in the laminated structure have different hardness from each other.

3. The stacked semiconductor device of claim 1, wherein a set of the onboard-element and the repair bump implement an onboard-component, and further comprising another onboard-component having a same structure, a same size and a same function as the onboard component so as to implement an array of the onboard-components on the mother-plate.

4. The stacked semiconductor device of claim 1, further comprising a field-insulating film provided between the parent bump and the mother-plate.

5. The stacked semiconductor device of claim 4, further comprising a parent-side land disposed on or in the field-insulating film so as to electrically connect the parent bump to the mother-circuit.

6. The stacked semiconductor device of claim 1, further comprising a multi-level interconnection insulation-layer provided between the repair bump and the onboard-element.

7. The stacked semiconductor device of claim 6, further comprising a repair-side land disposed on or in the multi-level interconnection insulation-layer so as to electrically connect the repair bump to the onboard-circuit.

8. A set of onboard-components as intermediate products, including a normal onboard-component and other onboard-components being prepared to be replaced by the normal onboard-component, the normal onboard-component is used in a final product of assembled configuration including a mother-plate and the normal onboard-component mounted on the mother-plate, the mother-plate merges a mother-circuit and has a mounting-main surface and a bottom-main surface in an opposite direction of the mounting-main surface, each of the onboard-components comprising:
   an onboard-element including a semiconductor chip, which merges a circuit element at least in a part of the semiconductor chip as an onboard-circuit, having a connection face facing to the mounting-main surface; and
   a repair bump provided on the onboard-element at a side of the connection face, having a repair-site wall made of a layer of conductor, the repair-site wall is perpendicular to the connection face, configured to join with a parent bump provided on a side of the mounting-main surface, the parent bump is electrically connected to the mother-circuit and has a mother-site wall made of a layer of conductor having different hardness from the repair-site wall, the mother-site wall is perpendicular to the mounting-main surface,
   wherein the repair-site wall penetrates into the mother-site wall for generating a knife-edge shaped trench at an intersection defined in a planar pattern viewed from a normal direction of the connection face.

9. The set of onboard-components of claim 8, wherein the repair-site wall is a double-layered composite-structure comprising a first hardness layer and a second hardness layer having a hardness higher than the first hardness layer.

10. The set of onboard-components of claim 9, wherein the hardness of the second hardness layer is more than twice as hard as the first hardness layer.

11. The set of onboard-components of claim 10, wherein gold (Au) is used as a conductor of the first hardness layer and a conductor of the parent bump, and a conductor selected from cobalt (Co), nickel (Ni), iridium (Ir), chromium (Cr), tungsten (W), titanium (Ti), titanium tungsten (TiW), alumina ($Al_2O_3$), or Si is used as a conductor of the second hardness layer.

12. The set of onboard-components of claim 8, wherein the repair-site wall is a triple-layered composite-structure comprising a first hardness layer, a second hardness layer and a third hardness layer, and the second hardness layer sandwiched in between the first and third hardness layers has a hardness higher than the first and the third hardness layers.

13. The set of onboard-components of claim 12, wherein the hardness of the second hardness layer is more than twice as hard as the first and the third hardness layers.

14. The set of onboard-components of claim 13, wherein gold (Au) is used as conductors of the first and third hardness layers and a conductor of the parent bump, and a conductor selected from cobalt (Co), nickel (Ni), iridium (Ir), chromium (Cr), tungsten (W), titanium (Ti), titanium tungsten (TiW), alumina (Al$_2$O$_3$), and Si is used as a conductor of the second hardness layer.

15. The set of onboard-components of claim 8, further comprising a multi-level interconnection insulation-layer provided between the repair bump and the onboard-element.

16. The set of onboard-components of claim 15, further comprising a repair-side land disposed on or in the multi-level interconnection insulation-layer so as to electrically connect the repair bump to the onboard-circuit.

17. The set of onboard-components of claim 8, wherein the repair-site wall implements a contour of a box-shape, providing a hollow space in the box-shape.

18. The set of onboard-components of claim 8, wherein the repair-site wall implements a parallel plate shape.

19. A jointing-element configured to join a mother-plate and an onboard-element mounted on the mother-plate, the mother-plate merging a mother-circuit, having a mounting-main surface and a bottom-main surface facing the mounting-main surface, the onboard-element including a semiconductor chip, which merges a circuit element at least in a part of the semiconductor chip as an onboard-circuit, having a connection face facing to the mounting-main surface, the jointing-element comprising:

a parent bump provided on the mother-plate at a side of the mounting-main surface, having a mother-site wall made of a layer of conductor, the mother-site wall is perpendicular to the mounting-main surface, electrically connected to the mother-circuit; and a repair bump provided on the onboard-element at a side of the connection face, having a repair-site wall made of a layer of conductor having different hardness from the mother-site wall, the repair-site wall is perpendicular to the connection face, configured to penetrate into the parent bump for generating a knife-edge shaped trench at an intersection between the mother-site wall and the repair-site wall, the intersection is defined in a planar pattern viewed from a normal direction of the connection face, wherein the repair-site wall penetrates into the mother-site wall at an intersection defined in a planar pattern viewed from a normal direction of the connection face, and conductors having different hardness are uniformly included at and in the vicinity of the intersection.

20. The jointing-element of claim 19, wherein at least one of the mother-site and repair-site walls includes a laminated structure of two or more layers of conductive layers, adjacent conductive layers in the laminated structure has different hardness from each other.

* * * * *